United States Patent [19]
Sasada et al.

[11] Patent Number: 5,639,301
[45] Date of Patent: Jun. 17, 1997

[54] PROCESSING APPARATUS HAVING PARTS FOR THERMAL AND NON-THERMAL TREATMENT OF SUBSTRATES

[75] Inventors: Shigeru Sasada; Kaoru Aoki; Mitsumasa Kodama; Kenji Sugimoto; Yoshiteru Fukutomi; Hidekazu Inoue, all of Kyoto, Japan

[73] Assignee: Dainippon Screen Mfg. Co., Ltd., Japan

[21] Appl. No.: 461,066

[22] Filed: Jun. 5, 1995

[30] Foreign Application Priority Data

Jun. 17, 1994 [JP] Japan ................................. 6-135796

[51] Int. Cl.$^6$ ........................................................ B05C 5/00
[52] U.S. Cl. .................... 118/52; 118/56; 118/58; 118/66; 414/935; 414/937
[58] Field of Search ................................ 118/52, 56, 58, 118/66; 414/935, 937, 939, 217, 222

[56] References Cited

U.S. PATENT DOCUMENTS

| | | | |
|---|---|---|---|
| 5,061,144 | 10/1991 | Akimoto et al. | 414/937 |
| 5,177,514 | 1/1993 | Ushijima et al. | 414/937 |
| 5,217,501 | 6/1993 | Fuse et al. | |
| 5,250,114 | 10/1993 | Konishi et al. | |
| 5,252,137 | 10/1993 | Tateyama et al. | |
| 5,403,397 | 4/1995 | Beckers et al. | 118/52 |
| 5,430,271 | 7/1995 | Organi et al. | 414/935 |
| 5,445,491 | 8/1995 | Nakagawa et al. | 414/937 |
| 5,462,397 | 10/1995 | Iwabuchi | 414/939 |
| 5,474,410 | 12/1995 | Ozawa et al. | 414/937 |

FOREIGN PATENT DOCUMENTS

| | | |
|---|---|---|
| 0187249 | 7/1986 | European Pat. Off. |
| 1209737 | 8/1989 | Japan. |
| 2-132840 | 5/1990 | Japan. |

Primary Examiner—Laura Edwards
Attorney, Agent, or Firm—Ostrolenk, Faber, Gerb & Soffen, LLP

[57] ABSTRACT

An apparatus including a structure which separates a first transport robot (high temperature robot), which accesses a first processing part group including the thermal processing parts, from a second transport robot (low temperature robot) which accesses the only non-thermal processing parts. During circulating transportation of substrates to be processed, heat created at thermal processing parts is prevented from flowing into non-thermal processing parts. Semiconductor wafers are circulated one by one between the first processing part group which includes a hot plate and a second processing part group which does not include a hot plate and processed one at a time at each processing part. The high temperature robot accesses the first processing part group while the low temperature robot accesses the second processing part group. Transfer of a semiconductor wafer between the two robots is performed at a transfer part which is formed using a cool plate. Since the low temperature robot is never subjected to heat, temperatures at the non-thermal processing parts which are included in the second processing part group remain stable even when the low temperature robot accesses the non-thermal processing parts.

21 Claims, 52 Drawing Sheets

FIG. 13

MODEL EXAMPLE:  ■=TH    □=TC

| No. | ID | IFB | EEW |
|-----|----|-----|-----|
| 1 | ■ | ■ | ■ |
| 2 | ■ | ■ | □ |
| 3 | ■ | □ | ■ |
| 4 | ■ | □ | □ |
| 5 | □ | ■ | ■ |
| 6 | □ | ■ | □ |
| 7 | □ | □ | ■ |
| 8 | □ | □ | □ |

| EMBODIMENT | FIRST | SECOND | THIRD | FOURTH | FIFTH | SIXTH | SEVENTH | EIGHTH | NINTH |
|---|---|---|---|---|---|---|---|---|---|
| THE NUMBER OF HIGH TEMPERATURE ROBOTS | 1 | 2 | 1 | 2 | 1 | 1 | 2 | 1 | 2 |
| ROTATION OF HIGH TEMPERATURE ROBOTS | NO | NO | NO | NO | NO | YES | YES | YES | YES |
| LOW TEMPERATURE ROBOT | TRANSLATE | TRANSLATE | FIXED | FIXED | TRANSLATE | TRANSLATE | TRANSLATE | TRANSLATE | TRANSLATE |
| LOW TEMPERATURE ROBOT HANDS | DOUBLE | DOUBLE | DOUBLE | DOUBLE | SINGLE | SINGLE | DOUBLE | CONCURRENTLY EXCHANGABLE HANDS | CONCURRENTLY EXCHANGABLE HANDS |

MODEL EXAMPLE : ——— =TH1   ==== =TH2   ----- =TC
→ = WAFER TRANSPORTATION PATH

FIG. 49

| | | | | | | | | | |
|---|---|---|---|---|---|---|---|---|---|
| — | HP1 | HP2 | — | — | | — | HP3 | HP4 | EEW2 |
| — | HP1 | HP2 | — | — | | HP3 | HP4 | EEW1 | — |
| — | HP1 | HP2 | — | — | | HP3 | HP4 | — | — |
| CP1/IF1 | CP2 | CP1/IF1 | CP2 | | CP3/IF3 | CP4 | CP3/IF3 | CP4 | CP3/IF3 |

SPX ⎯ 901 ⎯ SPY

PROCESSING APPARATUS HAVING PARTS FOR THERMAL AND NON-THERMAL TREATMENT OF SUBSTRATES

BACKGROUND OF THE INVENTION

1. Field of the Invention

The present invention relates to a substrate processing apparatus for performing a series of treatments on various types of substrates such as a semiconductor wafer and a glass substrate for a liquid crystal display device. In particular, the present invention relates to an improved substrate processing apparatus which comprises both a thermal processing part and a non-thermal processing part.

2. Description of the Background Art

As well known in the art, a semiconductor wafer undergoes various surface treatments such as coating of a resist liquid and relevant treatments. To automatically perform a series of surface treatments, an automatic semiconductor processing apparatus is used. A number of techniques have been developed to efficiently perform those surface treatments. For instance, a technique disclosed by Japanese Patent Laid-Open Gazette No. 2-132840 arranges a plurality of processing parts in two rows and transports a semiconductor wafer among the processing parts by means of a single transport robot.

In many cases, those treatments include a thermal treatment such as baking. Meanwhile, treatments such as resist coating and resist developing of a semiconductor wafer are usually performed at a normal temperature (room temperature). These non-thermal treatments are performed at a very strictly controlled temperature so that the temperature of the semiconductor wafer and the temperatures at the processing parts are maintained at predetermined temperatures close to a normal temperature.

Despite this requirement, the conventional technique referred to above uses only one transport robot to access both thermal processing parts and non-thermal processing parts. After heated at the thermal processing parts, the transport robot inserts its hand into the non-thermal processing parts. Even though a semiconductor wafer needs be still maintained at a normal temperature, the transport robot holds the semiconductor wafer with its warmed hand. Heat radiated from a warmed semiconductor wafer locally increases temperatures of other semiconductor wafers and the non-thermal processing parts. These all result instable thermal treatments.

Further, since only one transport robot accesses all processing parts, the overall through put of the apparatus is low.

Still further, every time the transport robot inserts its hand in and out of the thermal processing parts, heated air and particles scatter from the thermal processing parts and flow into the non-thermal processing parts, thereby the deteriorating thermal stability at the non-thermal processing parts and polluting the non-thermal processing parts.

SUMMARY OF THE INVENTION

The present invention is directed to a substrate processing apparatus, comprising: a plurality of processing parts including thermal processing parts and non-thermal processing parts; a transport mechanism for serially transporting a substrate to be processed among the plurality of processing parts, the transport mechanism including a first transport mechanism and a second transport mechanism, the first transport mechanism accessing a first processing part group which includes all of the thermal processing parts of the plurality of processing parts, the second transport mechanism accessing a second processing part group which does not include the thermal processing parts of the plurality of processing parts; and a transfer part which is insulated against heat for transferring the substrate to be processed between the first transport mechanism and the second transport mechanism.

In preferred embodiment, the plurality of processing parts include a common non-thermal processing part which is accessed by both the first and the second transport mechanisms and which allow a temperature change, and the transfer part is formed to include the common non-thermal processing part.

The transfer part may include: the common non-thermal processing part; and a transfer only part which is insulated against heat. And the common non-thermal processing part and the transfer only part are stacked one atop the other.

The transfer part may be formed by a plate which forms a common non-thermal processing part which is accessed by both said first and said second transport mechanisms and which allow a temperature change, a pin for supporting the substrate to be processed and separating the substrate to be processed from the plate, and means for moving the pin in a vertical direction.

According to another aspect of the invention, the transfer part is stacked with some or all of the processing parts of the first processing part group.

According to further another aspect of the invention, the thermal processing parts have substrate insertion slots which are open in a direction different from a direction of the second processing part group and a direction of the common non-thermal processing part.

According to still another aspect of the invention, the second processing part group includes a chemical liquid involved processing part which processes the substrate to be processed using a chemical liquid, and the first transport mechanism, a portion including the first processing part group and the transfer part, the second transport mechanism and the second processing part group are arranged in this order in a plane within the substrate processing apparatus.

Preferred embodiments of this aspect of the invention have the following feature. A wafer transfer height at the transfer part is substantially flush with a substrate holding height at the second processing part group.

Preferably, the second processing part group includes a chemical liquid involved processing part which processes the substrate to be processed using a chemical liquid. The apparatus further comprise a chemical liquid part, disposed below the second processing part group, for supplying the chemical liquid to the chemical liquid involved processing part and draining the chemical liquid from the chemical liquid involved processing part.

Preferred embodiments of this aspect of the invention also have the following feature, the first transport mechanism travels along an arrangement of the processing parts of the first processing part group while the second transport mechanism travels along an arrangement of the processing parts of the second processing part group.

Preferably, the first transport mechanism includes a plurality of transport means which move independently from each other.

According to another aspect of the invention, the second transport mechanism includes a plurality of transport means which are fixed to face the second processing part group.

According to further another aspect of the invention, the non-thermal processing parts include a non-thermal processing part which allows a temperature change, and whether to access the non-thermal processing part which allows a temperature change with the first transport mechanism or with the second transport mechanism is determined so that the substrate to be processed is transported within a minimum transportation cycle to receive a series of treatments.

Preferably, the apparatus further comprises a substrate placing counter for temporarily seating the substrate to be processed, the substrate placing counter disposed outside the first and the processing part groups, and both of the first and the transport mechanisms have a freedom of accessing the substrate placing counter.

Preferred embodiments of this aspect of the invention have the following feature. The apparatus further comprises a substrate exchange part for transferring the substrate to be processed among the plurality of transport means.

According to another aspect of the invention, the second transport mechanism includes transport means which includes a first and a second hands which are driven independently of each other.

According to further another aspect of the invention, the second transport mechanism includes transport means which includes a first and a second hands which exchange two substrates to be processed which face each other in a plane when driven by a single drive source.

Preferred embodiments of this aspect of the invention have the following feature. The transfer part is formed by a plate which forms a common non-thermal processing part which is accessed by both the first and the second transport mechanisms and which allow a temperature change, a pin for supporting the substrate to be processed and separating the substrate to be processed from the plate and means for moving the pin in a vertical direction.

Preferred embodiments of this aspect of the invention also have the following feature. The means for moving the pin in the vertical direction stops the pin at the following three positions: a first position at which the substrate to be processed is brought into contact with the plate; a second position at which the substrate to be processed is away from the plate; and a third position at which the substrate to be processed is even further away from the plate than at the second position.

Preferred embodiments of the apparatus of this aspect of the invention includes the following feature. The second transport mechanism moves in a vertical direction to the following two heights: a first height at which the second transport mechanism can receive the substrate to be processed from the second processing part group with a first hand of the second transport mechanism and receive the substrate to be processed which is held by the pin at the second position in the transfer part with a second hand of the second transport mechanism; and a second height at which the second transport mechanism can place the substrate to be processed which is held in the first hand onto the pin which is at the third position in the transfer part and insert the substrate to be processed which is held in the second hand into the second processing part group.

According to another aspect of the invention, a substrate processing apparatus comprises a coating part, a developing part and a transfer part. The coating part includes a coating side first processing part including a thermal processing part, a coater, a coating side transfer part, a coating side first transport mechanism for accessing the coating side first processing part, a coating side second transport mechanism for accessing the coater, and a heat-insulated transfer part for transferring a substrate to be processed between the coating side first transport mechanism and the coating side second transport mechanism. The developing part includes a developing side first processing part including a thermal processing part, a developer, a developing side transfer part, a developing side first transport mechanism for accessing the developing side first processing part, a developing side second transport mechanism for accessing the developer, and a heat-insulated transfer part for transferring the substrate to be processed between the coating side first transport mechanism and the coating side second transport mechanism. The transfer part is disposed between the coating part and the developing part and includes substrate holding means which is accessed by both the developing side first transport mechanism and the coating side first transport mechanism.

Principle of the Invention

1. Definition of Terms

Before describing the present invention, various terms used herein will be defined.

Thermal treatment:

Thermal treatments include a treatment for heating a substrate as well as a treatment which is performed at a high temperature.

Non-thermal treatment:

A non-thermal treatment is a treatment which does not heat a substrate (i.e., at a low temperature). Non-thermal treatments include cooling of a heated substrate (natural cooling, forced cooling) as well as a treatment which is performed at a low temperature. As herein used, "a low temperature" and "a high temperature" typically refer to a temperature which is close to a room (normal) temperature and a temperature exceeding such a temperature, respectively. In general, "a high temperature" and "a low temperature" are defined relative to each other.

Non-thermal treatment allowing a temperature change:

Some non-thermal treatments such as cooling and alignment of a substrate to be processed (e.g., centering and alignment of orientation flats in the case of semiconductor wafers) are insensitive to a little change in temperatures at processing parts performing those non-thermal treatments. In general, "non-thermal treatments" are classified into those for which a temperature change should be avoided as much as possible and those which are immune to a temperature change. As herein termed, "non-thermal treatments" refer to the former.

Non-thermal state:

A state where there is no heating by a heating mechanism.

2. Structure and Effect of the Invention

The present invention hereinafter described using such terms listed earlier is related to a substrate processing apparatus which comprises a plurality of thermal treatment and non-thermal processing parts for performing a series of treatments on substrates while serially transporting the substrates one by one among the plurality of processing parts. To process the substrates in such a manner, the substrate processing apparatus has a structure described below and creates an effect described below.

First Aspect of the Invention:

In the apparatus of the first aspect of the present invention, the transport mechanism for transporting substrates to be processed among the processing parts is classified into (a) the first transport mechanism which accesses the first processing part group which includes all of the thermal processing parts and (b) the second transport mechanism which accesses the second processing part group which does not include the thermal processing parts.

Since the first transport mechanism which accesses the thermal processing parts and the second transport mechanism which does not access the thermal processing parts are separated from each other, there is no chance that the first transport mechanism heated after accessing the thermal processing parts will access the second processing part group. Hence, thermal stability is maintained in the non-thermal processing parts of the second processing part group, which makes it possible to stably process the substrates to be processed.

Since a plurality of transport mechanisms are used, the substrates to be processed are transported efficiently, thereby improving the overall through put of the apparatus as a whole.

In the substrate processing apparatus of the first aspect of the present invention, transfer of the substrates to be processed between the first and the second transport mechanisms is performed through the transfer part which is insulated against heat.

Hence, the first and the second transport mechanisms do not directly contact each other during transfer of the substrates to be processed, and therefore, heat transfer from the first transport mechanism to the second transport mechanism is particularly effectively prevented.

Second Aspect of the Invention:

According to the second aspect of the present invention, in the substrate processing apparatus of the first aspect of the present invention, the processing parts include the common non-thermal processing part which is accessed by both the first and the second transport mechanisms and which allows a temperature change. The transfer part includes this common non-thermal processing part.

Since the transfer part is formed using the common non-thermal processing part, it is not necessary to ensure a space for disposing the common non-thermal processing part in addition to a space for disposing the transfer part.

Third Aspect of the Invention:

According to the third aspect of the present invention, in the substrate processing apparatus of the second aspect of the present invention, the transfer part includes (a) the common non-thermal processing part and (b) the transfer only part which is protected against heat. The common non-thermal processing part and the transfer only part are stacked one atop the other.

This apparatus requires a smaller floor space since the common non-thermal processing part and the transfer only part are stacked one atop the other. Since a substrate to be processed is transferred utilizing the common non-thermal processing part and the transfer only part, the transport mechanisms do not have to translate to transfer a substrate to be processed. Thus, the transport mechanisms needs not to move a long distance.

Fourth Aspect of the Invention

According to the fourth aspect of the present invention, in the substrate processing apparatus of the first aspect of the present invention, the transfer part is formed by (a) a plate which forms the common non-thermal processing part, (b) a pin for supporting the substrate to be processed and separating the substrate to be processed from the plate, and (c) means for moving the pin in a vertical direction. Hence, with moving the pin upward, the substrate to be processed is supported by the pin and picked up from the plate.

Fifth Aspect of the Invention:

According to the fifth aspect of the present invention, in the substrate processing apparatus of the first aspect of the present invention, the transfer part is stacked with some or all of the processing parts of the first processing part group.

Hence, in an increased number of cases, the first transport mechanism can move between the first processing part group and the transfer part by moving only in a vertical direction.

Sixth Aspect of the Invention:

According to the sixth aspect of the present invention, in the substrate processing apparatus of the first aspect of the present invention, the substrate insertion slots of the thermal processing parts are open in a direction different from a direction the second processing part group nor the common non-thermal processing part.

Hence, heated air and particles from the thermal processing parts are prevented from flowing into the non-thermal processing parts which belong to the second processing part group, directly nor through the transfer part.

Seventh Aspect of the Invention:

According to the seventh aspect of the present invention, in the substrate processing apparatus of the first aspect of the present invention, the second processing part group includes the chemical liquid involved processing part which processes a substrate to be processed using a chemical liquid. The first transport mechanism, the portion including the first processing part group and the transfer part, the second transport mechanism and the second processing part group are arranged in this order in a plane within the substrate processing apparatus.

The chemical liquid involved processing part which is often accessed by an operator for adjustment is disposed outside the apparatus. Hence, access to the chemical liquid involved processing part is easy and maintenance of the apparatus is efficient.

Eighth Aspect of the Invention:

According to the eighth aspect of the present invention, in the substrate processing apparatus of the first aspect of the present invention, the substrate transfer height at the transfer part is substantially flush with the substrate holding height at the second processing part group.

Hence, the second transport mechanism needs to move only a short distance in a vertical direction to move between the transfer part and the second processing part group.

Ninth Aspect of the Invention:

According to the ninth aspect of the present invention, in the substrate processing apparatus of the first aspect of the present invention, the chemical liquid part is disposed below the second processing part group to supply the chemical liquid to the chemical liquid involved processing part and to drain the chemical liquid from the chemical liquid involved processing part.

Since the second transport mechanism moves only a short distance in a vertical direction and therefore does not need a long guide disposed below, a space beneath the second transport mechanism can be used to dispose the chemical liquid part.

Tenth Aspect of the Invention:

According to the tenth aspect of the present invention, in the substrate processing apparatus of the first aspect of the present invention, the first transport mechanism travels along the arrangement of the processing parts of the first processing part group while the second transport mechanism travels along the arrangement of the processing parts of the second processing part group.

Since the second processing part group does not need many transport mechanisms, the operation efficiency of the second processing part group is improved. Further, the second processing part group is extensible to include an additional processing part if necessary.

Eleventh Aspect of the Invention:

According to the eleventh aspect of the present invention, in the substrate processing apparatus of the tenth aspect of the present invention, the first transport mechanism includes a plurality of transport means which move independently from each other.

Since the independently movable transport means forming the first transport mechanism operate in a concerted manner, the through put is improved.

Twelfth Aspect of the Invention:

According to the twelfth aspect of the present invention, in the substrate processing apparatus of the first aspect of the present invention, the second transport mechanism includes a plurality of transport means which are fixed to face said second processing part group.

The through put is improved since these transport means operate in a concerted manner. Further, since the second transport mechanism does not move in a horizontal direction, less particles are created. The apparatus is easy to manufacture, and the alignment accuracy of aligning a substrate to be processed is improved.

Thirteenth Aspect of the Invention:

According to the thirteenth aspect of the present invention, in the substrate processing apparatus of the first aspect of the present invention, the non-thermal processing parts include the non-thermal processing parts which allow a temperature change. Whether to access the non-thermal processing parts which allow a temperature change with the first transport mechanism or the second transport mechanism is determined so that a substrate to be processed is transported within a minimum transportation cycle to receive a series of treatments. Hence, the through put is particularly greatly improved.

Fourteenth Aspect of the Invention:

According to the fourteenth aspect of the present invention, in the substrate processing apparatus of the thirteenth aspect of the present invention, the substrate placing counter for temporarily seating a substrate to be processed is disposed outside the first and the processing part groups, and both processing part groups have a freedom of accessing the substrate placing counter.

Thus, there is no restriction on selection of the transport mechanisms to access the substrate placing counter. Even when the optimal assignment of the processing parts is different for different lots of substrates to be processed within the apparatus, it is possible to select an appropriate transport mechanism to access the substrate placing counter. Hence, the apparatus is highly flexible.

Fifteenth Aspect of the Invention:

According to the fifteenth aspect of the present invention, the substrate processing apparatus of the eleventh aspect of the present invention comprises the substrate exchange part for transferring substrates to be processed among the plurality of transport means. Hence, the transport means can operate efficiently and safely.

Sixteenth Aspect of the Invention:

According to the sixteenth aspect of the present invention, in the substrate processing apparatus of the first aspect of the present invention, the second transport mechanism includes the transport means which includes the first and the second hands which are driven independently of each other. Hence, the transportation freedom is high, and substrates to be processed are exchanged at a high speed.

Seventeenth Aspect of the Invention:

According to the sixteenth aspect of the present invention, in the substrate processing apparatus of the first aspect of the present invention, the second transport mechanism includes the transport means which includes the first and the second hands which exchange two substrates to be processed which face each other in a plane when driven by a single drive source. Hence, the second transport mechanism is realized with a simple structure at a low manufacturing cost.

Eighteenth Aspect of the Invention

According to the eighteenth aspect of the present invention, in the substrate processing apparatus of the seventeenth aspect of the present invention, the transfer part is formed by (a) a plate which forms the common non-thermal processing part, (b) a pin for supporting the substrate to be processed and separating the substrate to be processed from the plate, and (c) means for moving the pin in a vertical direction. Hence, with moving the pin upward, the substrate to be processed is supported by the pin and picked up from the plate.

Nineteenth Aspect of the Invention

According to the nineteenth aspect of the present invention, in the substrate processing apparatus of the eighteenth aspect of the present invention, the means for moving the pin in the vertical direction stops the pin at the following three positions: a first position at which the substrate to be processed is brought into contact with the plate; a second position at which the substrate to be processed is away from the plate; and a third position at which the substrate to be processed is even further away from the plate than at the second position. Thus, by adjusting the pin at the third position, the substrate can be transferred between the first and second transport mechanism.

Twentieth Aspect of the Invention

According to the twentieth aspect of the present invention, in the substrate processing apparatus of the nineteenth aspect of the present invention, the second transport mechanism moves in a vertical direction to the following two heights: a first height at which the second transport mechanism can receive the substrate to be processed from the second processing part group with a first hand of the second transport mechanism and receive the substrate to be processed which is held by the pin at the second position in the transfer part with a second hand of the second transport mechanism; and a second height at which the second transport mechanism can place the substrate to be processed which is held in the first hand onto the pin which is at the third position in the transfer part and insert the substrate to be processed which is held in the second hand into the second processing part group. Hence, it is possible to reduce the apparatus in size.

Twenty-first Aspect of the Invention

In the apparatus of the twenty-first aspect of the present invention, a coating part includes a coating side first transport mechanism and a coating side second transport mechanism. The coating side first transport mechanism accesses a coating side first processing part which includes a thermal processing part while the coating side second transport mechanism accesses a coater. Hence, there is no chance that the coating side first transport mechanism heated after accessing the thermal processing part of the coating side first processing part. Not only in the coating part, this is also true with the a developing part as well.

Since a plurality of transport mechanisms are used, the substrates to be processed are transported efficiently, thereby improving the overall through put of the apparatus as a whole.

In the coating part, transfer of a substrate to be processed between the coating side first transport mechanism and the coating side second transport mechanism is performed through a heat-insulated transfer part. Hence, the coating side first transport mechanism and the coating side second transport mechanism do not directly contact each other during transfer of the substrates to be processed, and therefore, heat transfer from the coating side first transport mechanism to the coating side second transport mechanism is particularly effectively prevented. Not only in the coating part, this is also true with the a developing part as well.

Since both of the coating side first transport mechanism and the developing side first transport mechanism access substrate holding means of a transfer part, transfer of the substrate to be processed therebetween is performed without contact each other.

Accordingly, it is a first object of the present invention to prevent deterioration of thermal stability at a non-thermal processing part due to heat from a thermal processing part, and to stably perform a series of treatments on a substrate to be processed.

A second object of the present invention is to improve an overall through put of the substrate processing apparatus.

A third object of the present invention is to protect the non-thermal processing part against heat and particles from the thermal processing part.

A fourth object of the present invention is to improve an utilization efficiency of the substrate processing apparatus in terms of space while attaining the objects above.

A fifth object of the present invention is to efficiently maintain the substrate processing apparatus and to enhance the flexibility of the substrate processing apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a view showing combinations of transport mechanisms which are in charge of non-thermal processing parts allowing a temperature change;

FIG. 18 is a view showing a relationship between the preferred embodiments;

FIG. 49 is a conceptual front view of a first processing part group of the apparatus of the ninth preferred embodiment;

DESCRIPTION OF THE PREFERRED EMBODIMENTS

1. Principle of Circulating Transportation

Before describing preferred embodiments of the present invention where a semiconductor wafer is processed as a substrate to be processed, a description will be given on the principle of "circulating transportation" of a semiconductor wafer citing a model example.

Apparatuses according to the preferred embodiments which will be described later perform a series of treatments such as baking, spin coating and developing of a resist on semiconductor wafers, while transporting the semiconductor wafers one by one to the respective processing parts by means of a transport mechanism which periodically moves around the respective processing parts. The principle described here applies to simple circulating transportation for better and easier understanding of the preferred embodiments of the present invention and do not readily apply to multi circulating transportation defined by a plurality of "circulating transportation" loops performed by a plurality of transport robots which cooperate together.

Figure 1:
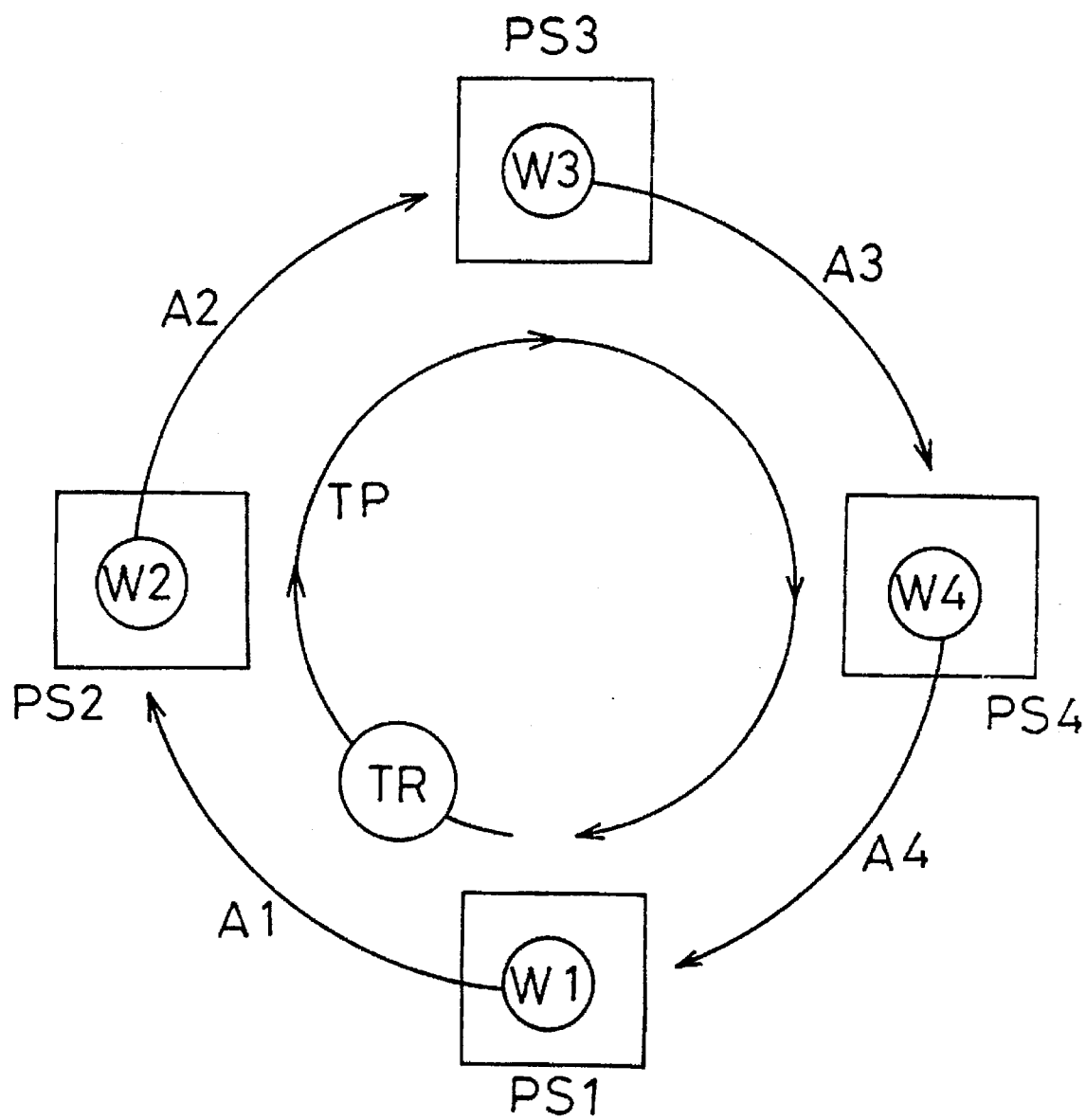
FIG. 1 is a view showing a concept of circulating transportation performed in preferred embodiments of the present invention.

FIG. 1 is a view showing the principle of circulating transportation. FIG. 1 assumes that semiconductor wafers are serially transported from a starting position PS1 to three positions PS2 to PS4, each wafer is processed by desired treatments and is returned to the starting position PS1 at last.

A transport robot TR receives a semiconductor wafer W1 at the starting position PS1 and moves to the position PS2. At the position PS2, the transport robot TR inserts the semiconductor wafer W1 into a processing part located at the position PS2 and in turn receives a semiconductor wafer W2 already processed at the position PS2. The transport robot TR then transports the semiconductor wafer W2 to the next position PS3. At the position PS3, the transport robot TR inserts the semiconductor wafer W2 into a processing part located at the position PS3 and in turn receives a semiconductor wafer W3 already processed at the position PS3. After repeating this, the transport robot TR returns to the starting position PS1 and places a semiconductor wafer W4 at the starting position PS1. This completes one cycle of circulating transportation.

Next, the transport robot TR receives a new semiconductor wafer (not shown) at the starting position PS1 and repeats circulating transportation along a circulation path TP. Through repeated circulating transportation, the respective semiconductor wafers are processed at the processing parts located at the positions PS2 to PS4 and returned to the starting position PS1. In short, the respective semiconductor wafers are processed by a series of treatments while transported among the positions PS2 to PS4. This is the principle of "circulating transportation" performed by the transport robot.

Preferred embodiments of the present invention use a transport robot which accesses both thermal processing parts and non-thermal processing parts and a transport robot which accesses only the non-thermal processing parts. For clear distinction, the former will be referred to as "high temperature robot" and the latter as "low temperature robot." In the drawings, the high temperature robot is indicated generally at "H (HOT)" and the low temperature robot is indicated generally at "C (COOL)." In accordance with this, transport robots TH, TH1 and TH2 are all high temperature robots while transport robots TC, TC1, TC2 and TC3 all low temperature robots.

2. First Preferred Embodiment

2-1. Overall Structure

Figure 2:
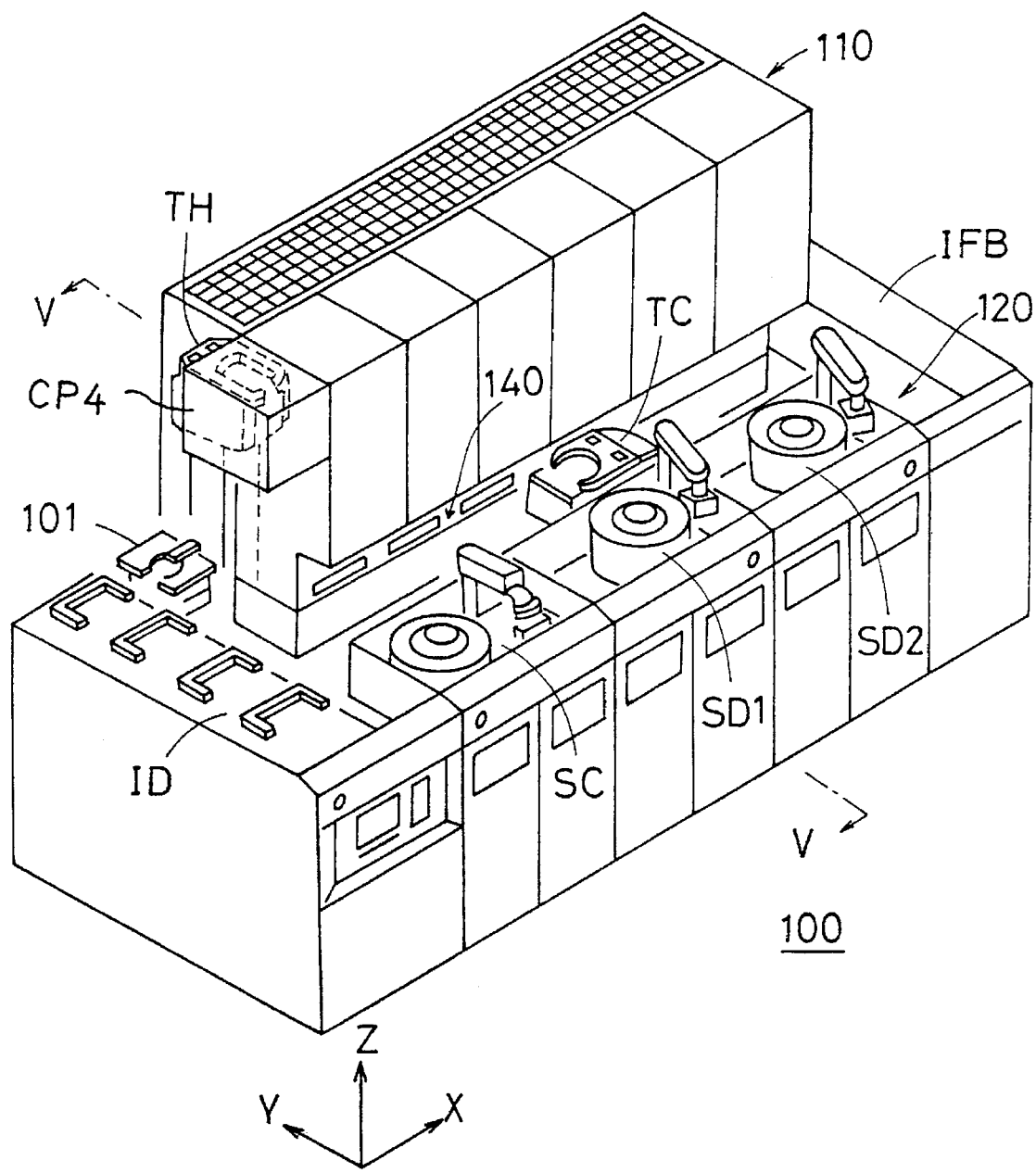
FIG. 2 is a perspective view showing an appearance of a semiconductor wafer processing apparatus according to a first preferred embodiment of the present invention.
Figure 3:
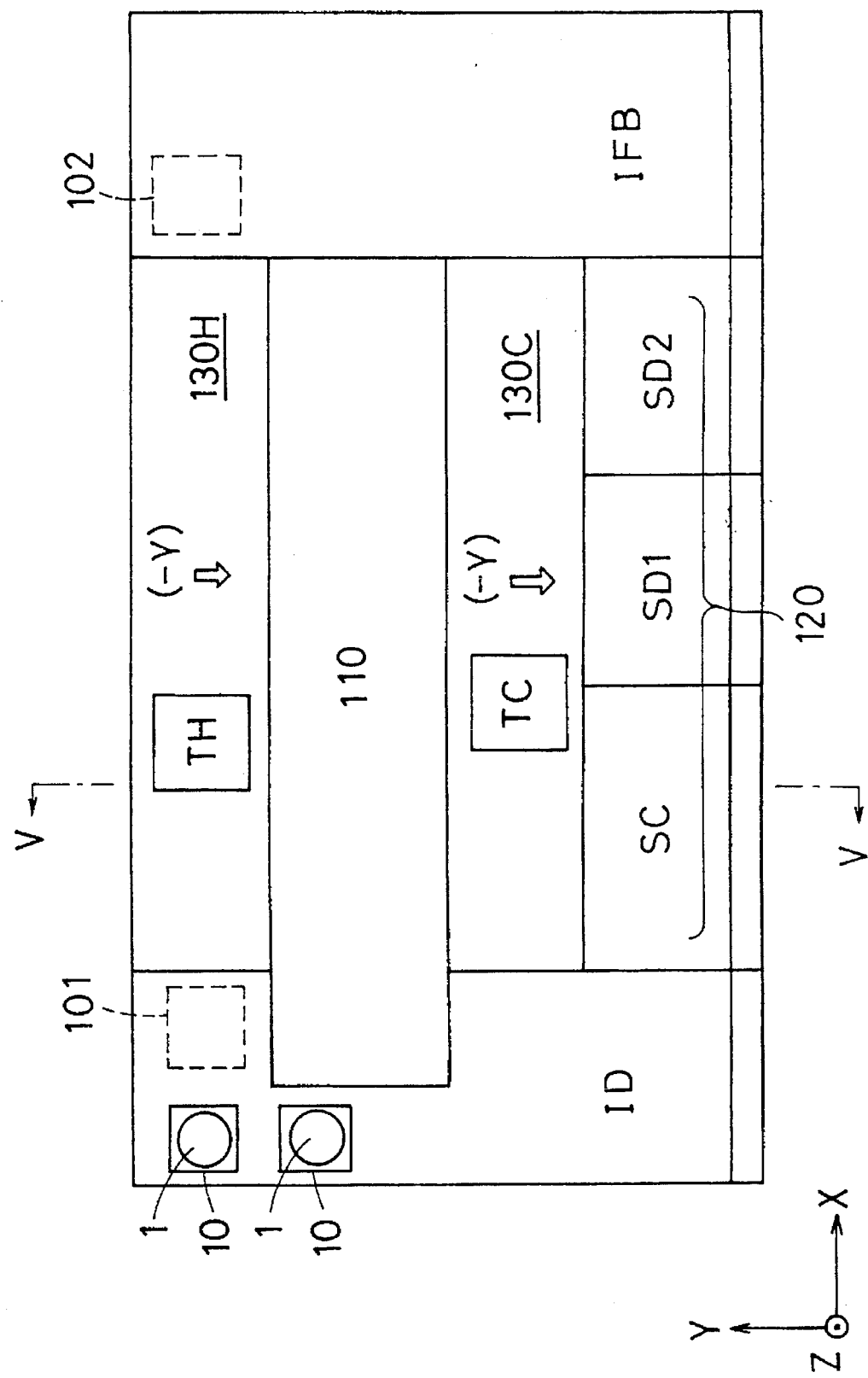
FIG. 3 is a conceptual plan view of the apparatus of the first preferred embodiment.

FIG. 2 is a perspective view showing an appearance of a semiconductor wafer processing apparatus 100 according to a first preferred embodiment of the present invention. For clear understanding of directional relationships with other drawings, FIG. 2 includes a three dimensional rectangular XYZ-coordinate system. FIG. 3 is a conceptual plan view of the apparatus 100. To perform a series of treatments on semiconductor wafers, the apparatus 100 has a novel structure which separates a first transport robot TH (FIG. 2) which accesses a processing part group including the thermal processing parts from a second transport robot TC which accesses only non-thermal processing parts. Now, the structure and features of the apparatus 100 will be described.

In the apparatus 100, a cassette 10 containing the semiconductor wafers 1 (FIG. 3) is transported onto an indexer ID. The semiconductor wafers 1 are retrieved from the cassette 10 one by one and each circulated among the respective processing parts which are included in a first and a second processing part groups (processing part arrays) 110 and 120. At the processing parts, a series of treatments are automatically performed on the semiconductor wafers 1. FIG. 2 omits the cassette 10 and the semiconductor wafers 1.

The first and the second processing part groups 110 and 120 are disposed as two approximately parallel rows. Disposed on the opposite side of the indexer ID is an interface IFB, or a substrate seating counter for temporarily placing semiconductor wafers before transporting the semiconductor wafers to an external apparatus such as a stepper. The first processing part group 110 includes both the thermal processing parts and the non-thermal processing parts while the second processing part group 120 includes only the non-thermal processing parts. As described later, to transfer the semiconductor wafers 1 between the first and the second processing part groups 110 and 120, a transfer part row 140 which is insulated against heat is disposed under the first processing part group 110. The two transport robots TH and TC cooperate with each other to circulate, load and unload the semiconductor wafers 1.

2-2. Outline of Transport Mechanism

To perform the intended function of loading the semiconductor wafers 1 to the first processing part group 110, the transport robot TH, "a high temperature robot," includes two hands one above the other (i.e., double-handed). The high temperature robot TH is capable of translating from near the indexer ID to the interface IFB on a transportation path 130H disposed along the first processing part group 110 in a direction X and in an opposite direction. The high temperature robot TH is also capable of moving along an axis Z, i.e., in a vertical direction while extending and retracting its hands.

The transport robot TC is "a low temperature robot" for loading the semiconductor wafers 1 to the second processing part group 120. Like the high temperature robot TH, the low temperature robot TC includes two hands. The low temperature robot TC is capable of translating from near the indexer ID to the interface IFB on a transportation path 130C disposed along the second processing part group 120 in a direction X and in an opposite direction. The low temperature robot TC is also capable of moving along the axis Z, i.e., in a vertical direction and rotating about the vertical axis while extending and retracting its hands.

The indexer ID includes a robot 101 which is disposed for intermediate transfer of the semiconductor wafers 1 between the cassette 10 and the transport robot TH. A robot 102 is disposed on the interface IFB for a similar reason. Since these robots 101 and 102 do not access the processing parts, the robots 101 and 102 are not "high temperature robots" nor "low temperature robots."

2-3. First Processing Part Group

Figure 4:
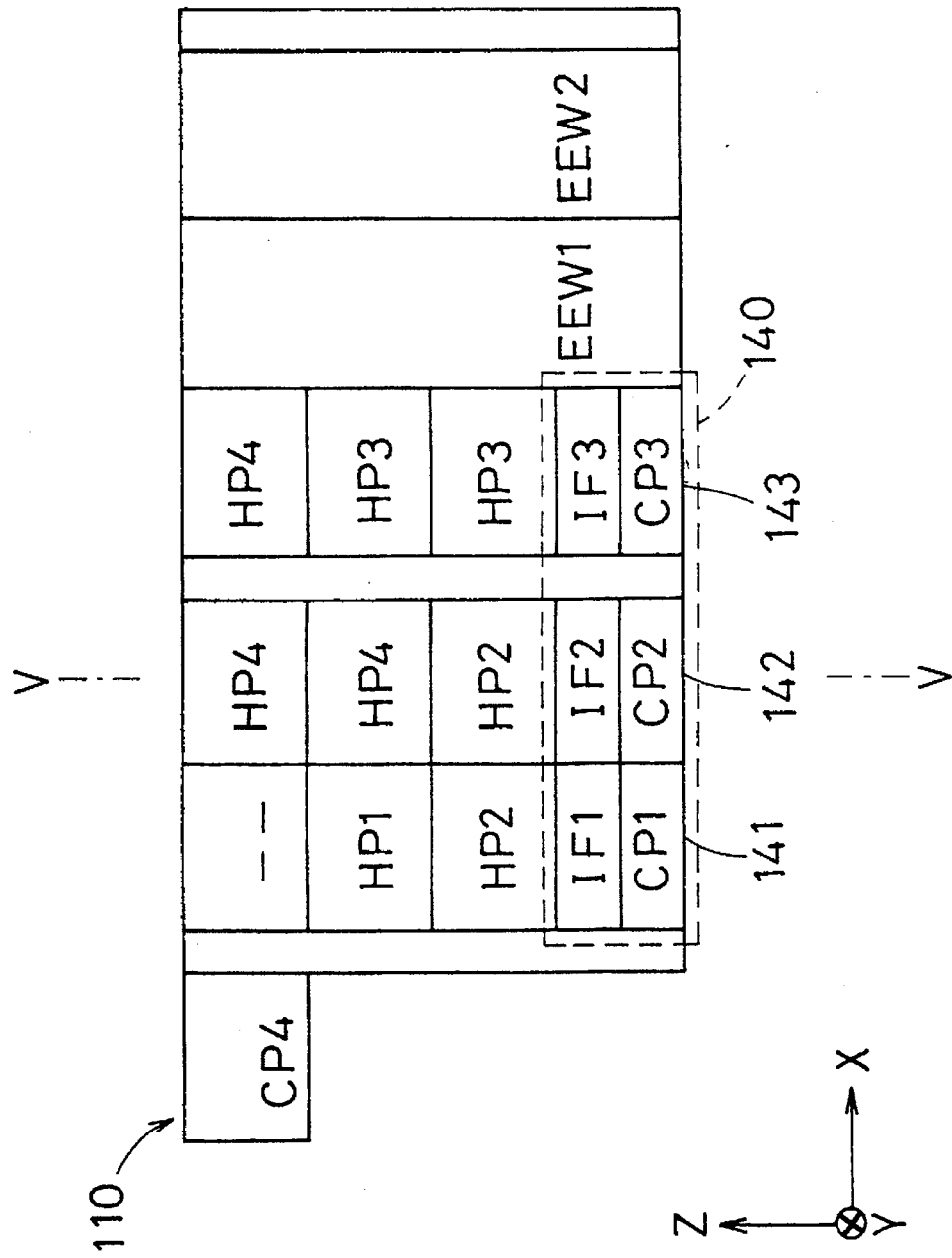
FIG. 4 is a conceptual front view of a first processing part group of the apparatus of the first preferred embodiment.

FIG. 4 is a conceptual front view of the first processing part group 110. The first processing part group 110 has a multistory structure in which a plurality of processing parts are juxtaposed and stacked, and includes stacked hot plates (baking parts) HP1 to HP4, edge exposure parts EEW1, EEW2 and etc. The hot plates HP1 to HP4 are thermal processing parts for baking the semiconductor wafers 1 at a high temperature. The edge exposure parts EEW1 and EEW2 expose edges of the semiconductor wafers 1 already coated with a resist liquid. The edge exposure parts EEW1 and EEW2 are classified as non-thermal processing parts.

2-4. Transfer Part

A transfer part row 140 is disposed at a position which corresponds to the lower-most story of the first processing part group 110. The transfer part row 140 consists of three transfer parts 141, 142 and 143. The transfer part 141 is formed by stacking an interface part IF1 which is protected against heat on a cool plate (cooling part) CP1. In a similar manner, the transfer part 142 (143) is formed by stacking an interface pan IF2 (IF3) which is protected against heat on a cool plate CP2 (CP3).

In the units forming the transfer parts 141, 142 and 143, constant temperature water of a predetermined temperature close to a room temperature is supplied to the cool plates CP1 to CP3. With constant temperature water supplied, the cool plates CP1 to CP3 forcibly cool the semiconductor wafers 1 which were heated by the hot plates HP1 to HP3 and placed on the cool plates CP1 to CP3. In this sense, the cool plates CP1 to CP3 are classified as non-thermal processing parts. In addition to this, the cool plates CP1 to CP3 serve as a temporarily mounting place used for transferring the semiconductor wafers 1 between the first processing part group 110 and the second processing part group 120. During such transfer of the semiconductor wafers 1, the cool plates CP1 to CP3 are accessed by both the high temperature robot TH and the low temperature robot TC. Since the cool plates CP1 to CP3 do not perform a treatment such as coating with a chemical liquid and development which is extremely susceptible to even a slight temperature change, even if temperatures at the cool plates CP1 to CP3 somewhat change at the start of the treatment, the temperature changes of the cool plates do not exert substantial influence over the treatment. In this sense, the cool plates CP1 to CP3 are "common non-thermal processing parts allowing temperature change".

The interface pans IF1 to IF3 function only as a wafer mounting place for transferring the semiconductor wafers 1. In short, the interface parts IF1 to IF3 are "transfer only parts." As such, the interface pans IF1 to IF3 each include three fixed pins for mounting the wafers. Since not intended to perform a surface treatment on the semiconductor wafers 1, the interface parts IF1 to IF3 are protected against heat.

The cool plate CP4, which forcibly cools the semiconductor wafers 1 which were heated by the hot plate HP4, is disposed above an end of the first processing part group 110. The cool plate CP4 is not used to transfer the semiconductor wafers 1. In FIG. 4, denoted at "—" is where no processing part is installed.

In an arrangement as above, the processing parts HP1 to HP4 are stacked on the transfer parts 141 to 143 forming the transfer part row 140. Therefore, the high temperature robot TH can move between the processing parts HP1 to HP4 and the transfer parts 141 to 143 without translating in the direction X, or at least, by moving a relatively short distance in the direction X.

2-5. Second Processing Part Group

On the other hand, the second processing part group 120 includes a spin coater (rotation type resist coating apparatus) SC and spin developers (rotation type developing apparatus) SD1 and SD2 as shown in FIG. 3. These units SC, SD1 and SD2 are all classified as "non-thermal processing parts" and also as "chemical liquid involved processing parts." These processing parts SC, SD1 and SD2 must avoid a temperature change as much as possible. Other environmental factors except for a temperature must be also stable.

2-6. Plan Arrangement

Referring to FIG. 3 again, in the apparatus 100, a semiconductor wafer 1 is accessed in the direction (−Y) as shown by a thick white arrow when the semiconductor wafer 1 is loaded into and unloaded from the processing part groups 110 and 120. In the first preferred embodiment, the processing part groups 110 and 120 are arranged as two rows with their "load/unload faces" directed to the same side in the direction Y. Transport mechanisms (transport robots TH and TC) are each disposed to face the load/unload faces of the processing part groups 110 and 120.

Thus, the semiconductor wafer processing apparatus 100 of the first preferred embodiment is constructed to have a plan arrangement in which (a) the first transport mechanism (high temperature robot TH), (b) the portion including the first processing part group 110 and the transfer part row 140, (c) the second transport mechanism (low temperature robot TC) and (d) the second processing part group 120 are arranged next to each other in this order.

In general, for the purpose of maintenance, an operator often externally accesses the chemical liquid involved processing parts such as the spin coater SC and the spin developers SD1 and SD2. Since the second processing part group 120 including these chemical liquid involved processing parts is disposed externally to the apparatus, maintenance of the apparatus is easier. Further, since the chemical liquid involved processing parts are all disposed in the second processing part group 120, an operator does not have to move around much for maintenance of chemical liquids. Thus, the semiconductor wafer processing apparatus 100 of the first preferred embodiment has an excellent operability.

Since an operator does not access the hot plates HP1 to HP4 and the cool plates CP1 to CP4 often for maintenance, almost no problem will be caused even though these processing parts are disposed in a middle area of the semiconductor wafer processing apparatus 100. Further, since the hot plates HP1 to HP4 and the cool plates CP1 to CP4 are all disposed in the first processing part group 110, an operator does not have to move around much for maintenance of chemical liquids. Thus, the semiconductor wafer processing apparatus 100 of the first preferred embodiment has an excellent operability in this regard as well. In addition, since the chemical liquid involved processing parts are disposed on the other side of the hot plates HP1 to HP4 and the cool plates CP1 to CP4, separation of the processing environments is sufficient.

2-7. Wafer Insertion Slot

Figure 5:
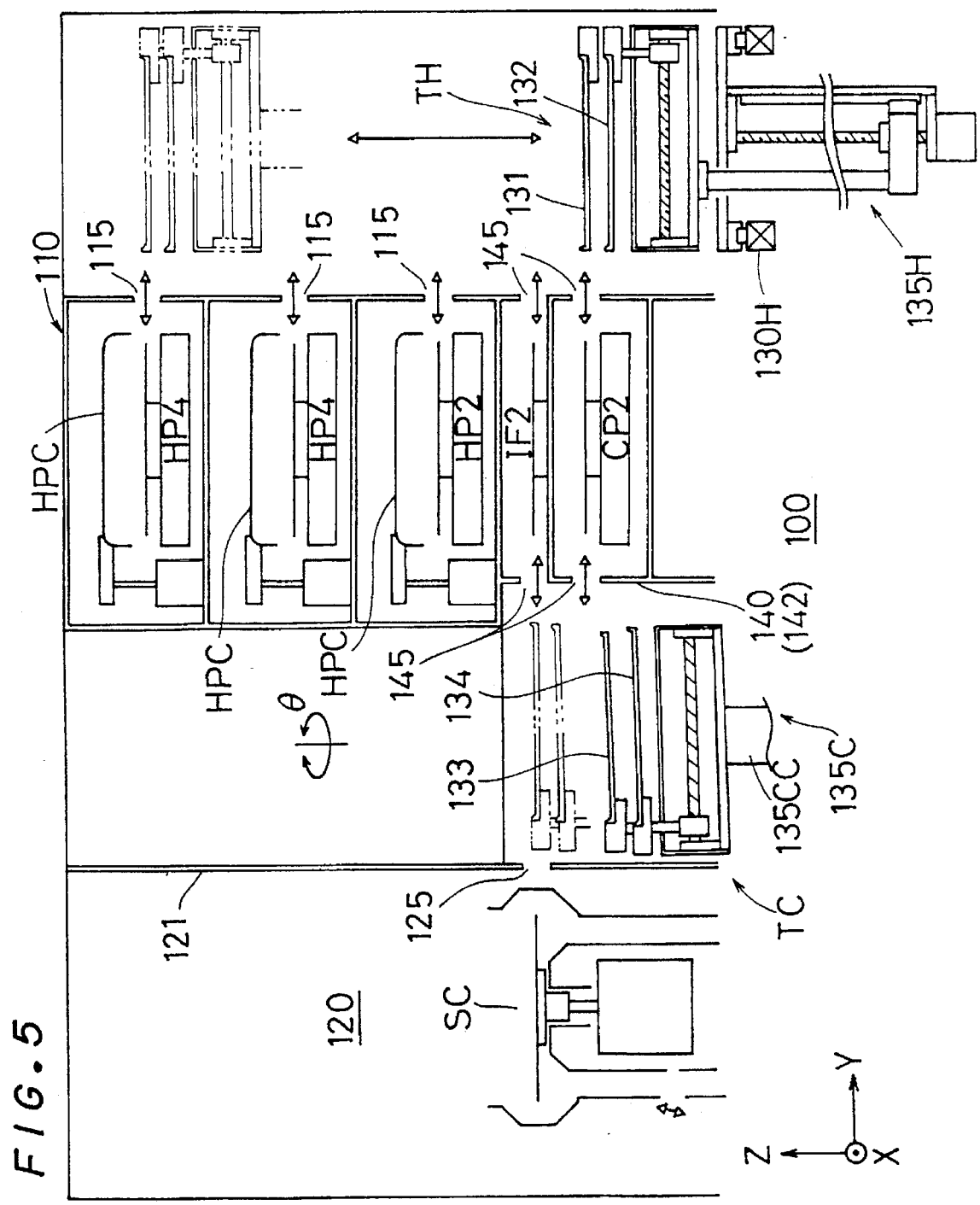
FIG. 5 is a cross sectional view of an upper part of the apparatus of the first preferred embodiment taken along V—V in FIGS. 2 to 4.

FIG. 5 is a cross sectional view of the semiconductor wafer processing apparatus 100 taken along V—V in FIGS. 2 to 4. FIG. 5 shows the transport robots TH and TC as they are at their translated positions, that is, at different positions than in FIGS. 2 to 4, so that both the transport robots TH and TC appear in FIG. 5.

In FIG. 5, the first processing part group 110 has a multistory structure which is formed by stacking the hot plates HP2 and HP4. Disposed beneath the first processing part group 110 is a transfer part 142 of a multistory structure which is formed by stacking the interface IF2 and the cool plate CP2. Wafer insertion slots 115 of the hot plates HP2 and HP4 are open only in the direction Y, i.e., toward the transportation path 130H of the high temperature robot TH. This is the same with the other processing parts which are included in the first processing part group 110 of FIG. 4.

The interface IF2 and the cool plate CP2 of the transfer part 142 have wafer insertion slots 145 open toward both the transportation paths 130H and 130C of the respective high temperature robot TH and the low temperature robot TC as shown in FIG. 5. This is to ensure access to the transfer part 142 by both the high temperature robot TH and the low temperature robot TC. In FIG. 5, lateral two-point arrows indicate the wafer insertion directions at the slots 115 and 145. Although not shown in FIG. 5, this is the same with the other transfer parts 141 and 143.

Thus, the wafer insertion slots 115 of the processing parts which are included in the first processing part group 110 face only the high temperature robot TH, but not the second processing part group 120, the cool pate CP2 and the low temperature robot TC. Hence, even though access to the hot plates HP2 and HP4 by the high temperature robot TH accompanies a flow of heated air and hot particles from the hot plates HP2 and HP4, it is possible to particularly effectively prevent the heated air and the hot particles from reaching the second processing part group 120, i.e., the spin coater SC and the spin developers SD1 and SD2, which is to be protected against heat, directly or indirectly via the transfer part 140. Therefore, it is possible to control the temperatures and humidity at the spin coater SC and the spin developers SD1 and SD2 with high accuracy, and hence to improve the process ability such as uniformness of a film thickness. In more general terms, such a directional relationship as above is expressed as "the wafer insertion slots 115 of the thermal processing parts are open in a direction which is different from the directions toward the second processing part group 120 and the transfer part 140."

A partition wall 121 is disposed between the second processing part group 120 and the low temperature robot TC (See FIG. 5. FIG. 1 omits the partition wall.). The low temperature robot TC accesses the processing parts SC and SD which belong to the second processing part group 120 through a wafer insertion slot 125 which is formed in the partition wall 121. The wafer insertion slot 125 is approximately flush with the wafer insertion slots 145 of the transfer part 140.

2-8. Degree of Freedom of Transport Robot

Driven by a robot drive mechanism 135H which is formed by a ball screw, a motor, a guide, and etc., the high temperature robot TH translates on the transportation path 130H and moves in a vertical direction (vertical two-point arrow in FIG. 5). The high temperature robot TH has hands 131 and 132 which extend and retrieve independently of each other. These hands 131 and 132 access the processing parts and the transfer part 142 through the wafer insertion slots 115 (145) to retrieve and insert semiconductor wafers. The low temperature robot TC has a similar structure. However, the low temperature robot TC is different from the high temperature robot TH in that a robot drive mechanism 135C of the low temperature robot TC further has a rotation freedom in a direction θ. This is because the low temperature robot TC must access both the transfer part row 140 and the second processing part group 120.

2-9. Height and Multistory of Transfer Part

As shown in FIG. 5, the thickness of the transfer part row 140 in the direction Z is approximately the same as the thickness of each one of the hot plates HP2 and HP4. It then follows that the size of a space to dispose each one of the transfer parts 141 to 143 is the same as that of a space used to dispose each one of the hot plates HP2 and HP4. The interface IF2 only needs to transfer semiconductor wafers. Hence, the interface IF2 does not have to include a plate for placing a wafer, a mechanism for cooling the plate, a mechanism for moving a wafer relative to the plate in a vertical direction nor other mechanism, and therefore, the components forming the interface IF2 may be formed thin. Further, while the plate, the heating or cooling mechanism, the vertical direction movement mechanism and the like as above are to be disposed below a wafer transfer height at the hot plates HP2 and HP4 and the cool plate CP2, such mechanisms are not needed in the interface IF2. Hence, the interface IF2 may be disposed above the cool plate CP2, thereby ensuring the wafer transfer height at the interface IF2 to be very close to the wafer transfer height at the cool plate CP2. With the wafer transfer height very close to each other, the transport robots TH and TC can move between the interface IF2 and the cool plate CP2 in the transfer part 142 only by traveling a short distance in the direction Z. This prevents a deterioration in the transport efficiency due to the existence of the transport part 140 (142) in the circulation transportation route.

Further, as shown in FIG. 4, since the hot plates HP1 to HP4 are stacked on the transfer part 140, the transport robots can transfer semiconductor wafers between the transfer part 140 and the hot plates HP1 to HP4 by moving a relatively a short distance in the direction Z with no or a little translation movement. The other transfer parts 141 and 143 also have such a structure and advantage.

The wafer transfer height at the transfer part 142, i.e., any one of the wafer holding height at the interface IF2 and the wafer holding height at the cool plate CP2 is preferably almost the same as the wafer holding height at the spin coater SC. Unlike in FIG. 5 which shows that the wafer holding height at the interface IF2 is almost the same as the wafer holding height at the spin coater SC, the wafer holding height at the cool plate CP2 may be almost the same as the wafer holding height at the spin coater SC. Since the heights are set as such, the low temperature robot TC may move a reduced distance in a vertical direction to transport wafers between the transfer part 142 and the spin coater SC.

With respect to the other processing parts included in the second processing part group 120, i.e., the spin developers SD1 and SD2 (FIG. 1), the wafer holding heights at these processing parts are almost the same as the wafer holding height at the spin coater SC. Thus, the spin developers SD1 and SD2 also have the relationship as above with the transfer part 140 in terms of height. Not only with the transfer part 142, this is also true with the other transfer parts 141 and 143 as well.

As in this preferred embodiment, where two unit transfer parts (cool pate and interface) form each one of the transfer parts 141 to 143, since the two unit transfer parts are stacked one atop the other, the transport robots TH and TC each move a short distance in a vertical direction to transport a wafer between the two unit transfer parts. This makes a particularly great contribute to an improvement in the transport efficiency.

2-10. Storing Chemical Liquid and etc.

As described earlier, the low temperature robot TC moves only a short distance in a vertical direction as compared with the high temperature robot TH, that is, the vertical movement range of the low temperature robot TC may be very narrow. More precisely, since the vertical movement range of the low temperature robot TC may be as narrow as the difference in height between the interface IF2 and the cool plate CP2, the robot drive mechanism 135C may have a short vertical movement column 135CC (See FIG. 5) for moving the low temperature robot TC in a vertical direction. This produces a substantially large empty space below the low temperature robot TC. Chemical liquids necessary for wafer treatments may be stored here.

Figure 6:
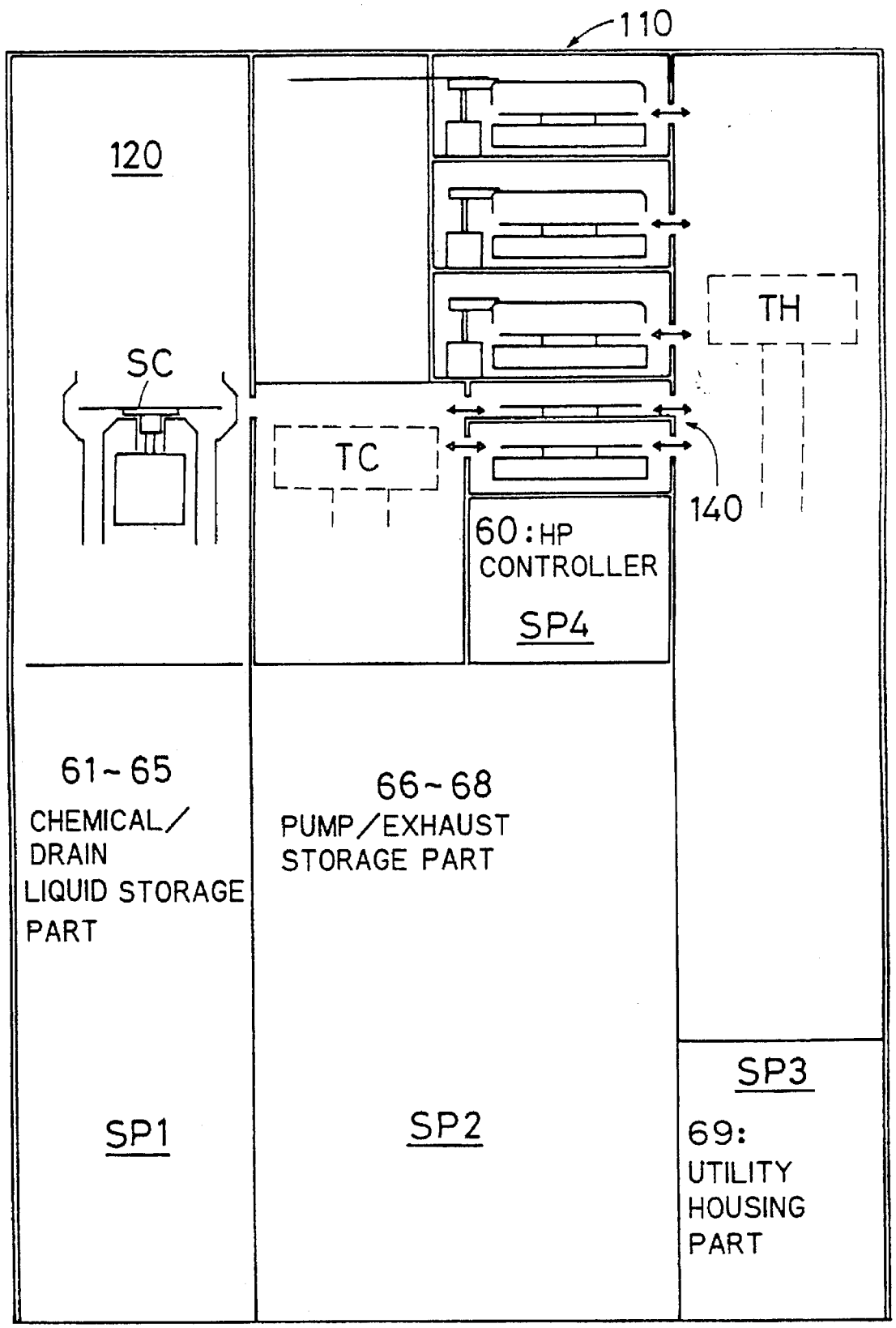
FIG. 6 is a conceptual cross sectional view of the apparatus of the first preferred embodiment.
Figure 7:
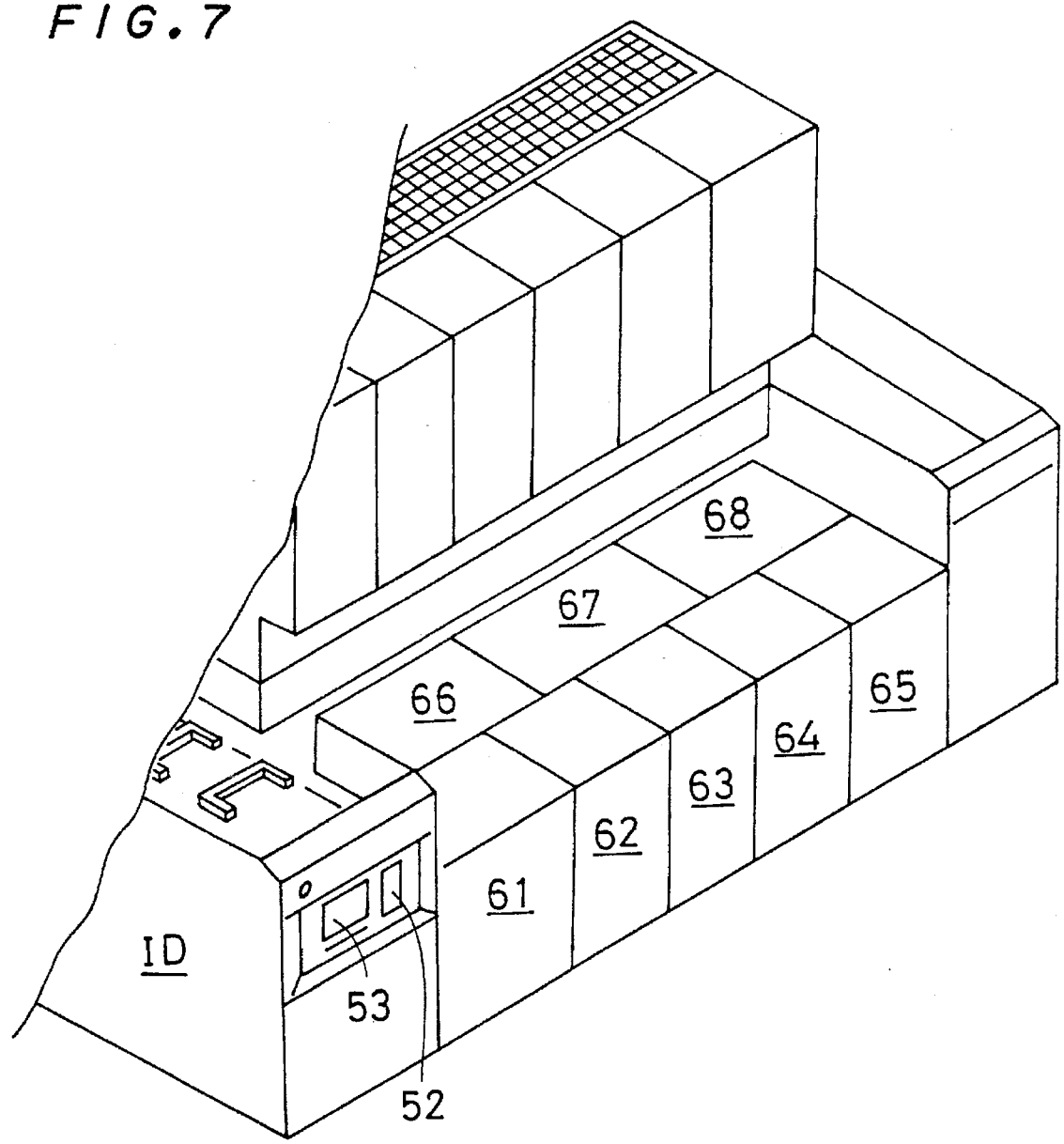
FIG. 7 is a view showing storage in a lower portion of the apparatus of the first preferred embodiment.

FIG. 6 is a conceptual cross sectional view showing an example of storage of chemical liquids, and FIG. 7 is a perspective view of FIG. 6. FIG. 7 omits the low temperature robot TC and the second processing part group 120, i.e., the spin coater SC and the spin developers SD1 and SD2. As shown in FIG. 6, in spaces SP1 and SP2 below the low temperature robot TC and the spin coater SC, the following components are disposed in two rows, one forward and the other behind, which are located in a positional relationship as that shown in FIG. 7.

(a) Bin storage part 61 for storing a resist liquid (b) Buffer tank storage part 62 for temporarily buffering and storing a cleaning liquid and etc.

(c) Drain liquid tank storage part 63

(d) Solution storage part 64 for storing a solution which is used to clean the spin coater SC and the spin developers SD1 and SD2

(e) Developing chemical liquid storage part 65

(f) Resist pump storage part 66

(g) Exhaust box 67 for the spin coater SC (h) Exhaust box 68 for the spin developers SD1 and SD2

Of these components, the buffer tank storage part 62, the drain liquid tank storage part 63, the solution storage part 64, the developing chemical liquid storage part 65 and the resist pump storage part 66 are classified as "chemical liquid parts" which supply and drain chemical liquids. The resist pump storage part 66, one of the chemical liquid parts, is located in the space below the low temperature robot TC.

On the other hand, in space SP3 below the high temperature robot TH, a utility housing part 69 is disposed which houses vacuum pipes, power pipes and etc. Disposed immediately below the transfer part 140 is a hot plate controller 60 for controlling the hot plates HP1 to HP4.

Thus, the space below the low temperature robot TC is utilized to dispose the components which are necessary in relation to the processing apparatus 100, in particular, the chemical liquid parts which supply and drain chemical liquids. There is no need to dispose these components outside the apparatus, which improves the utilization efficiency of space.

2-11. Electrical Structure

Figure 8:
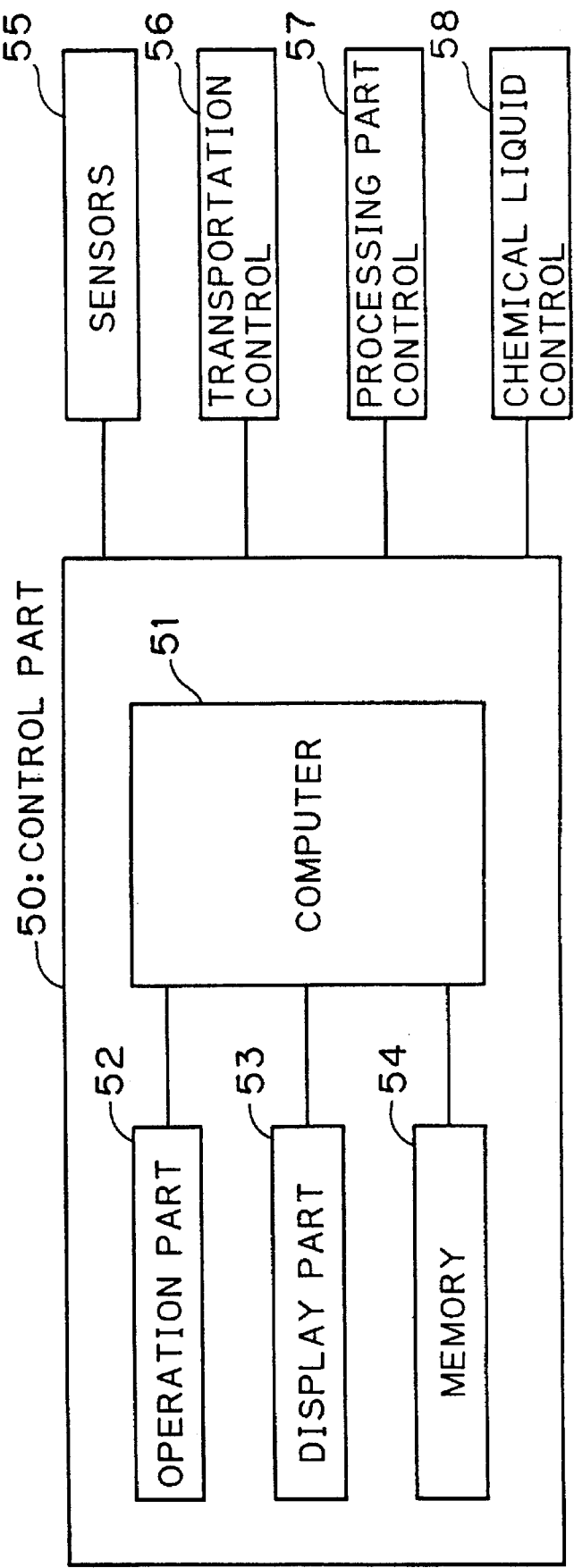
FIG. 8 is a block diagram showing control in the apparatus of the first preferred embodiment.

FIG. 8 is a block diagram showing an electrical structure of the apparatus 100 of FIG. 1. A control part 50 of the apparatus 100 includes a computer 51, an operation part 52 through which an operator supplies an instruction to the computer 51, and a display part 53 for informing the operator of progress of the process, malfunction and other information. A memory 54 stores not only a control program but also data needed for controlling the process. The operation part 52 and the display part 53 are disposed in front of the indexer ID as shown in FIG. 7.

Sensors 55 for detecting situations at the respective parts of the apparatus and supplying detected information to the computer 51 are connected to the control part 50. The apparatus also includes a drive control circuit 56 for driving and controlling the respective transport robots in accordance with an instruction from the control part 50. A processing part control circuit 57 controls driving of the respective processing parts in accordance with an instruction from the control part 50, e.g., controls heating at the hot plates HP1 to HP4 and spinning at the spin coater SC and the spin developers SD1 and SD2. The hot plate controller 60 of FIG. 6 is a part of the processing part control circuit 57. A chemical liquid control circuit 58 controls supply of a chemical liquid from a chemical liquid supply part to the spin coater.

The contents of a control signal supplied to the respective parts of the apparatus are changed depending on the arrangement of the processing parts, the order of processes and other conditions. However, the basic structure of the control part stays unchanged throughout in other preferred embodiments which will be described later.

2-12. Outline of Transport Process

Now, a description will be given on transportation of the semiconductor wafer 1 by the transport robots TH and TC to the respective processing parts and transfer of the semiconductor wafer 1 between the transport robots TH and TC and the respective processing parts. A flow of overall transportation and transfer will be described later.

<Retrieval, Placing and Exchanging of Wafer>

In the first preferred embodiment, since the transport robots TH and TC are each double-handed, the transport robots TH and TC perform retrieval and placing of the semiconductor wafer 1 in the same manner at all of the indexer ID, the respective processing parts, transfer parts 141 to 143 and the external interface IFB. For this reason, behaviors of the high temperature robot TH alone will be described here.

Referring to FIG. 5, it is assumed that the high temperature robot TH holds a first semiconductor wafer with its first hand 131, places the first semiconductor wafer on the hot plate HP2 and retrieves a second semiconductor wafer already processed by the hot plate HP2 from the hot plate HP2 ("exchanging" of semiconductor wafers). In this case, the high temperature robot TH moves to the wafer insertion slot 115 of the hot plate HP2, inserts its empty second hand 132 into the hot plate HP2, and holds and retrieves the second semiconductor wafer. The high temperature robot TH then inserts its first hand 131 into the hot plate HP2 and places the first semiconductor wafer on the hot plate HP2. This achieves "exchanging" of the first and the second semiconductor wafers. When "retrieval" or "placing" of a semiconductor wafer is to be performed rather than "exchanging" of the semiconductor wafers, the high temperature robot TH either retrieves or places a semiconductor wafer.

<Transfer of Wafer>

On the other hand, when the low temperature robot TC is to receive a semiconductor wafer from the high temperature robot TH, the transfer part row 140 (the transfer part 142 in the portion shown in FIG. 5) is used. In the apparatus 100, since a number of semiconductor wafers are moved one by one at a time in an order along each transportation path, a series of semiconductor wafers 1 will be serially numbered to distinguish the semiconductor wafers. The semiconductor wafers will be hereinafter referred to as "N-th semiconductor wafer."

An example is assumed where the low temperature robot TC receives an N-th semiconductor wafer from the high temperature robot TH utilizing the cool plate CP2 which is disposed within the transfer part 142. The cool plate CP2 already mounts an (N−1)-th semiconductor wafer which is being cooled by the cool plate CP2. The low temperature robot TC moves to the front side of the cool plate CP2 and retrieves the (N−1)-th semiconductor wafer with one of its hands. This makes the cool plate CP2 "empty." The high temperature robot TH moves to the back side of the cool plate CP2 and places the N-th semiconductor wafer onto the cool plate CP2.

At a later point after this, the transport robots TH and TC each complete circulating transportation. At that point, the high temperature robot TH still holds the (N−1)-th semiconductor wafer while the low temperature robot TC returns to the cool plate CP2 with at least one of its hands "empty." The low temperature robot TC retrieves the N-th semiconductor wafer from the cool plate CP2. Immediately after this, the high temperature robot TH places the (N+1)-th semiconductor wafer onto the cool plate CP2. Through these operations, the N-th semiconductor wafer is transferred from the high temperature robot TH to the low temperature robot TC. When the high temperature robot TH is to receive a semiconductor wafer from the low temperature robot TC, the low temperature robot TC places the semiconductor wafer on the interface IF2 and the high temperature robot TH receives this semiconductor wafer.

The transfer part 142 (141, 143) is also utilized to temporarily place a semiconductor wafer held by the high temperature robot TH and receive the semiconductor wafer by the high temperature robot TH. For instance, the high temperature robot TH places an N-th semiconductor wafer on the interface IF2 and returns to the interface IF2 to receive the N-th semiconductor wafer later. The N-th semiconductor wafer is temporarily placed in this manner.

As shown in FIG. 4, the transfer parts 141, 142 and 143 respectively utilize the interfaces IF1, IF2 and IF3, or "transfer only parts" which do not perform an actual treatment on a semiconductor wafer, and also respectively utilize the cool plates CP1, CP2 and CP3, or the non-thermal processing parts which allows a temperature change, whereby the processing time is shortened and the space is efficiently utilized. That is, since the transfer parts utilize the interfaces and the cool plates, no other space is necessary in addition to the transfer parts 141, 142 and 143 to ensure the function of the cool plates. Further, it is possible to reduce a time for the transport robots TH and TC to move between the hot plates HP1 to HP4 and the cool plates CP1 to CP3 as described above. The advantage created by stacking the cool plate CP2 (CP1, CP3) and the interface IF2 (IF1, IF3) is as described earlier.

Still further, since wafers are cooled while placed on the cool plates CP1, CP2 and CP3 waiting to be subsequently transferred, it is not necessary to consider the cooling time and the waiting time separately. This further reduces the wafer processing time.

Since the transfer parts 141, 142 and 143 are originally formed for transfer of a wafer between the transport robots TH and TC, the transfer parts 141, 142 and 143 may be formed utilizing either one of the non-thermal processing parts such as the cool plates which allow a temperature change and the transfer only parts such as the interfaces. Other examples of the non-thermal processing parts which allow a temperature change include the edge exposure parts EEW1 and EEW2, the interface IFB (See FIG. 2) which is disposed outside the processing part groups, and the indexer. Although not used in the first preferred embodiment, an alignment processing part for aligning orientation flats of semiconductor wafers corresponds to the transfer parts of such nature.

2-13. Detailed Description of Transport Process

<Treatment Sequence>

Next, a detailed description will be given on a treatment sequence and a transport process for a semiconductor wafer. The apparatus 100 of the first preferred embodiment processes a semiconductor wafer in the following sequence. This sequence remains the same in the other preferred embodiments which will be described later.

(1) Baking by the hot plate HP1;

(2) Cooling by the cool plate CP1;

(3) Spin coating of a resist liquid by the spin coater SC;

(4) Baking by the hot plate HP2;

(5) Cooling by the cool plate CP2;

(6) Edge exposure by the edge exposure part EEW1 (EEW2);

(7) Baking by the hot plate HP3;

(8) Cooling by the cool plate CP3;

(9) Developing of the resist liquid by the spin developer SD;

(10) Post baking by the hot plate HP4; and

(11) Cooling by the cool plate CP4.

This sequence will be hereinafter referred to as "sequence example SCE."

<Transport Flow>

Figure 9:
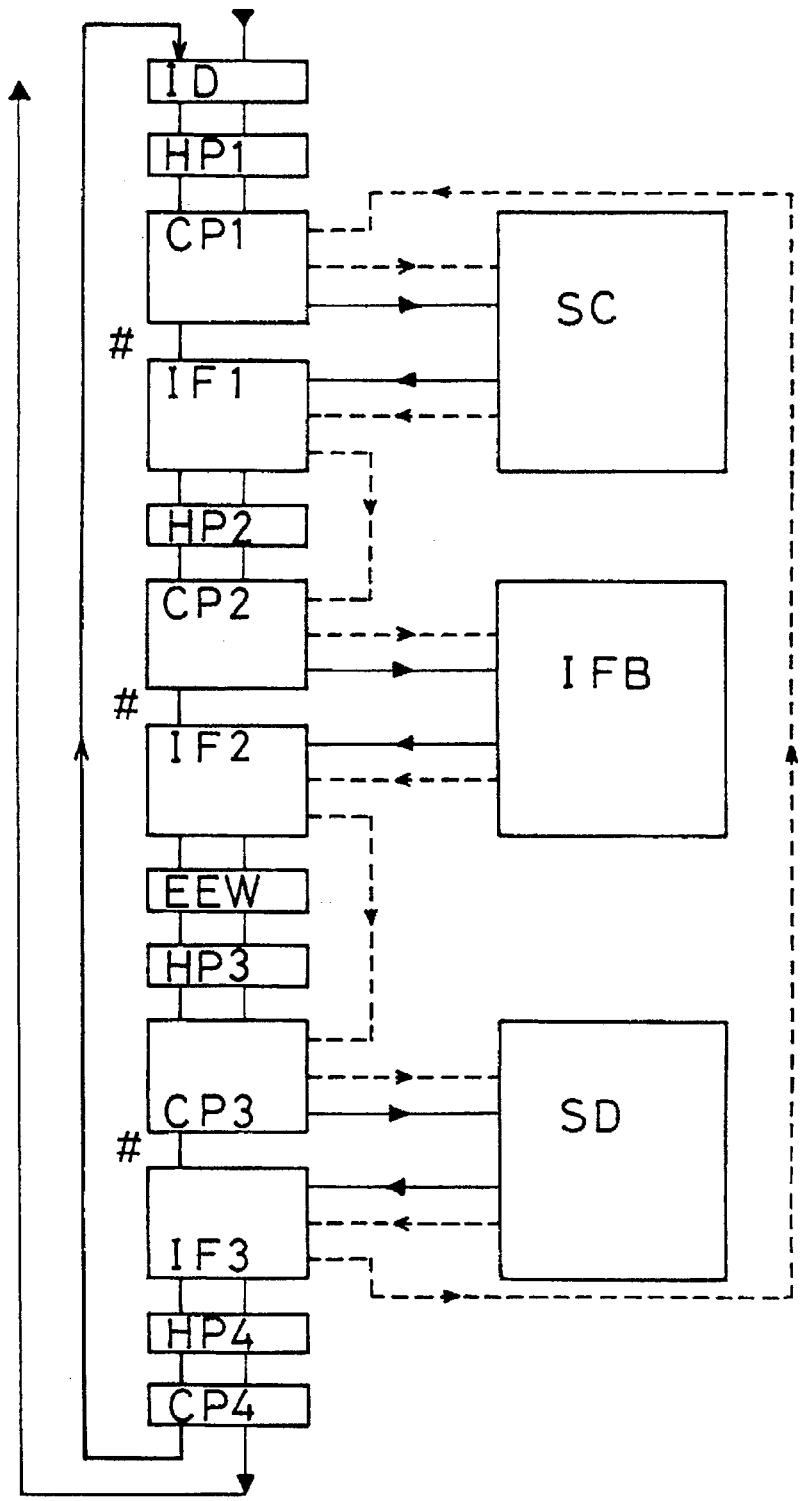
FIG. 9 shows a process flow in the apparatus of the first preferred embodiment.

FIG. 9 shows a flow of circulating transportation and transfer of a semiconductor wafer for realizing such a treatment sequence in the apparatus 100. In FIG. 9, transportation denoted by the symbol # is transfer between the cool plates and the interfaces which are stacked within the transfer part 140, i.e., transfer achieved merely by vertical movement of the robots.

Figure 10:
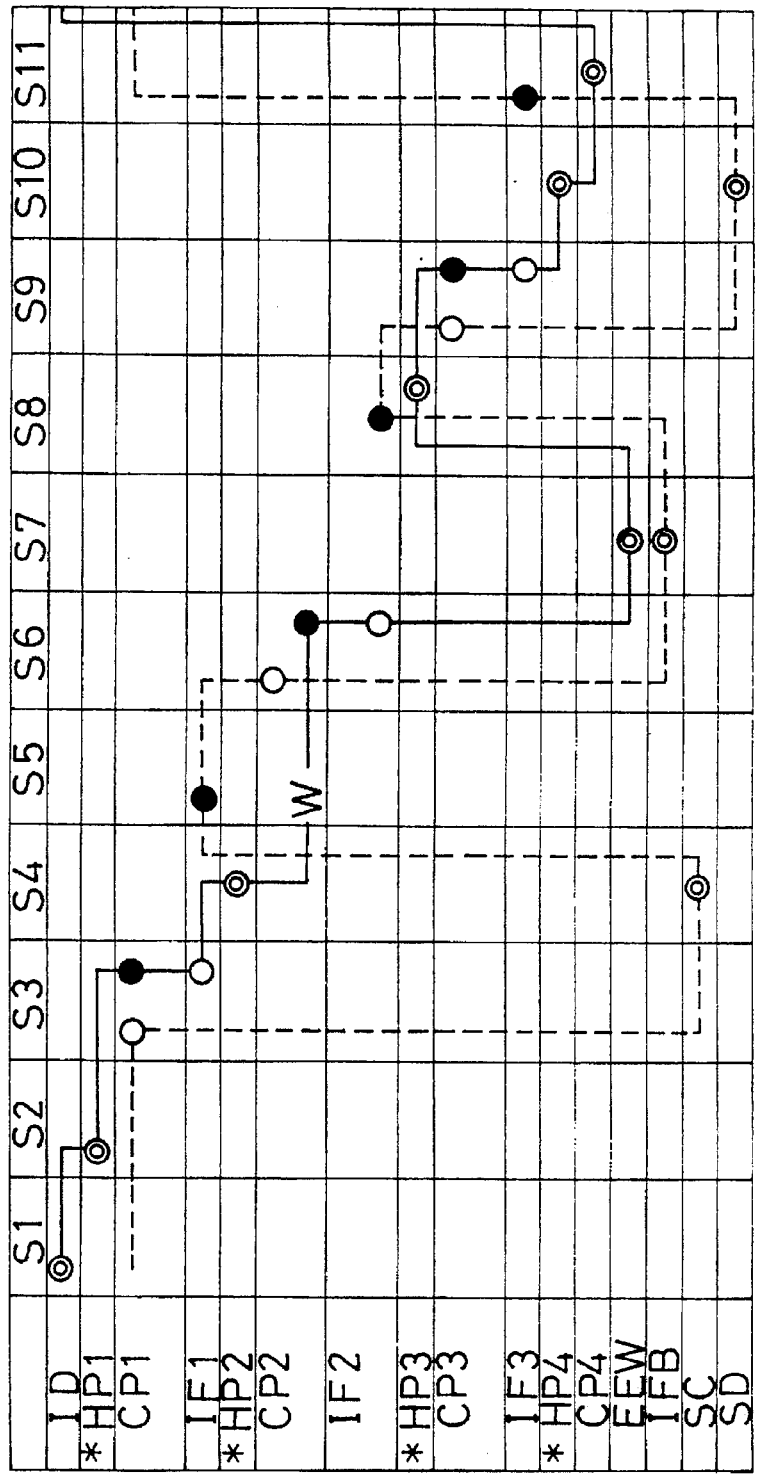
FIG. 10 is a timing view of the apparatus of the first preferred embodiment.

FIG. 10 is a timing view which corresponds to the flow view in FIG. 9. In FIG. 10, "S1 to S11" each express each stage (step) of circulating transportation. These eleven steps complete one cycle of circulating transportation. The symbols listed in the left-most column such as "ID" and "HP1"

express the components shown in FIGS. 3 and 4. The meaning of the lines and the symbols used in FIGS. 9 and 10 is as described as "General Explanations." FIGS. 9 and 10 each express the state after circulating transportation normally completes.

The symbols "EEW" and "SD" used in FIGS. 9 and 10 generally refer to "EEW1, EEW2" and "SD1, SD2," respectively. As shown in FIG. 4, there are two hot plates referred to as "HP2" and two hot plates referred to as "HP3," and there are three hot plates referred to as "HP4." The number of the edge exposure parts is two (EEW1, EEW2). The number of the spin developers is also two (SD1, SD2) as shown in FIG. 3. Semiconductor wafers are serially transported and distributed among these components. For example, odd-numbered semiconductor wafers are transferred to the spin developer SD1 and even-numbered semiconductor wafers are transferred to the spin developer SD2. The number of each type of components is determined considering a time required for each type of treatments. With respect to baking, for instance, a ratio of baking times at the hot plates HP1 to HP4 is 1:2:2:3. Since the components are selectively used, FIGS. 9 and 10 merely generally indicate the processing parts which are substantially equivalent to each other and which are used selectively.

FIG. 9 clearly shows that semiconductor wafers are transported one by one serially and each transferred along "the sequence example SCE." Since the interfaces IF1 to IF3 and IFB only transfer semiconductor wafers, the existence of these interfaces in "the sequence example SCE" does not affect the processes performed during "the sequence example SCE."

The high temperature robot TH circulates among the processing parts which correspond to the first processing part group while transferring one semiconductor wafer at a time. At each one of the cool plates CP1 to CP3, a semiconductor wafer is transferred to the low temperature robot TC. Receiving a semiconductor wafer at any one of the cool plates CP1 to CP3, the low temperature robot TC moves the semiconductor wafer to the spin coater SC, the interface IFB or the spin developer SD. In the next transportation cycle, the low temperature robot TC transfers this semiconductor wafer to one of the interfaces IF1 to IF3. Transfer of this semiconductor wafer to one of the interfaces IF1 to IF3 waits until the next transportation cycle because this semiconductor wafer cannot be retrieved from the spin coater SC or the spin developer SD until the spin coater SC or the spin developer SD finishes processing this semiconductor wafer.

The semiconductor wafer transferred to one of the interfaces IF1 to IF3 in this manner is transferred to the high temperature robot TH which will then transfer the semiconductor wafer to the next processing part which belongs to the first processing part group 110. In the manner as that shown in FIG. 9, the high temperature robot TH and the low temperature robot TC perform circulating transportation parallel to each other (multi circulating transportation), whereby each semiconductor wafer returns to the indexer ID after circulating among the processing pans.

When transporting a semiconductor wafer, the high temperature robot TH alone accesses the hot plates HP1 to HP4 which are classified "the thermal processing parts" while the low temperature robot TC accesses only the non-thermal processing parts. In addition to the hot plates HP1 to HP4, the high temperature robot TH also accesses the indexer ID, the edge exposure part EEW, the cool plates CP1 to CP4 and the interfaces IF1 to IF3. These components accessed by the high temperature robot TH all allow a temperature change, and therefore, there is no problem when the high temperature robot TH accesses these components.

The low temperature robot TC alone accesses the spin coater SC and the spin developer SD, or the non-thermal processing parts which should avoid any temperature change. The high temperature robot TH never extends its hands 131 and 132 which are heated after inserted into the hot plates HP1 to HP4 toward the spin coater SC nor the spin developer SD. This promises thermal stability of the spin coater SC and the spin developer SD. Further, since a wafer is transferred utilizing the transfer part 140 in the first preferred embodiment, there is no chance that the high temperature robot TH and the low temperature robot TC touch each hands to cause transfer of heat from the high temperature robot TH to the low temperature robot TC. Still further, since the transfer part 140 is formed using the cool plates CP1 to CP3 and the low temperature robot TC receives a wafer after the wafer was cooled at one of the cool plates CP1 to CP3, heat remaining in the wafer itself never deteriorates the thermal stability of the spin coater SC and the spin developer SD. In addition, there is no problem although the interfaces IF1 to IF3 do not have any positive cooling function, since the low temperature robot TC places a wafer (of a low temperature) onto the interfaces IF1 to IF3 and the high temperature robot TH receives the placed wafer. At the interfaces IF1 to IF3, transfer of a wafer from the high temperature robot TH to the low temperature robot TC is never performed. Hence, during transfer of a wafer through the interfaces IF1 to IF3 as well, heat transfer to the second processing part group 120 which should be maintained at a low temperature is prevented, and therefore, thermal stability is maintained.

Although in the above embodiment the wafer is moved through the interfaces IF1 to IF3 from the low temperature robot TC to the high temperature robot TH, the reverse transfer of a wafer may be performed under a condition which the wafer is cooled. To achieve the condition, the low temperature robot TC have to receive the wafer one or more transportation cycle later after the high temperature robot TH left the wafer on the interfaces in order to naturally cool the wafer, rather than immediately after the high temperature robot TH left the wafer on the interfaces.

In the first preferred embodiment, since the two robots, the high temperature robot TH and the low temperature robot TC, are used to transport semiconductor wafers, the through put is better than where only one robots transfers semiconductor wafers.

<Timing>

Now, FIG. 113 is referred to. In FIG. 10, the processing parts indicated with the symbol "*" are the thermal processing parts (hot plates HP1 to HP4). FIG. 10 also clearly shows that only the high temperature robot TH accesses these thermal processing parts. In FIG. 10, the high temperature robot TH starts moving at the indexer ID. At the indexer ID which serves as the start point, the high temperature robot TH receives an N-th wafer. The high temperature robot TH transports the N-th wafer to the hot plate HP1 by the next step S2. At the hot plate HP1, the high temperature robot TH retrieves an (N−1)-th wafer from the hot plate HP1 and places the N-th wafer on the hot plate HP1 (exchanging of wafers).

At the step S3, the high temperature robot TH places the (N−1)-th wafer on the cool plate CP1 and moves to the interface IF1 without receiving any wafer from the cool plate CP1. At the interface IF1, the high temperature robot TH retrieves an (N−3)-th wafer from the interface IF1. The (N−3)-th wafer was already baked by the hot plate HP1 (baking), cooled by the cool plate CP1 and coated with a resist by the spin coater SC. An (N−2)-th wafer is on the spin coater SC at this stage.

Since the high temperature robot TH may move merely a short distance in a vertical direction between the cool plate CP1 and the interface IF1 as described earlier, the high temperature robot TH places and retrieves wafers at the cool plate CP1 and the interface IF1 at the same step S3.

The (N–1)-th wafer placed on the cool plate CP1 is retrieved by the low temperature robot TC at the step S3 in the next circulating transportation cycle and transported to the spin coater SC at the step S4 in the cycle. This completes transfer of the (N–1)-th wafer from the high temperature robot TH to the low temperature robot TC.

On the other hand, since the hot plate HP1 and the cool plate CP1 are stacked one atop the other as shown in FIG. 4, when the high temperature robot TH moves from the step S3 to the step S4 in FIG. 10, the high temperature robot TH does not have to translate in the direction X but rather may move only in a vertical direction. This means a reduction in the travelling time of the high temperature robot TH. Such an advantageous positional relationship is also true with the other components shown in FIG. 4, e.g., a positional relationship between the cool plate CP3 and the hot plate HP3.

Since the other portions of the transportation timing are easily understood from the description above and FIG. 10, no description will be given here.

2-14. Minimized Transportation Cycle and Synchronization Control

As shown in FIGS. 9 and 10, the high temperature robot TH and the low temperature robot TC move different transportation paths. In the first preferred embodiment, the robots TH and TC face each other with the cool plates CP1 to CP3 forming the transfer part 140 between the robots TH and TC. On the other hand, although the interfaces IF1 to IF3, or the other unit transfer parts forming the transfer part 140, are also used to transfer semiconductor wafers, the robots TH and TC do not have to arrive at the interfaces at the same time. For instance, since a semiconductor wafer placed on the interface IF1 by the low temperature robot TC at a step S5 in FIG. 10 is received by the high temperature robot TH at the step S3 of the next transportation cycle, the robots TH and TC do not have to come to the interface IF1 at the same time to transfer the semiconductor wafer.

Thus, in the first preferred embodiment, circulating transportation by the transport robot TH needs only be synchronized with circulating transportation by the transport robot TC in such a manner that the transport robots TH and TC meet at each one of the cool plates CP1 to CP3. In the first preferred embodiment, the cycle of circulating transportation is minimized while satisfying such a synchronization condition to thereby improve the overall processing efficiency (through put) of the apparatus as a whole. The principle and specific structure for achieving this are as described below.

<Principle>

Figure 11:
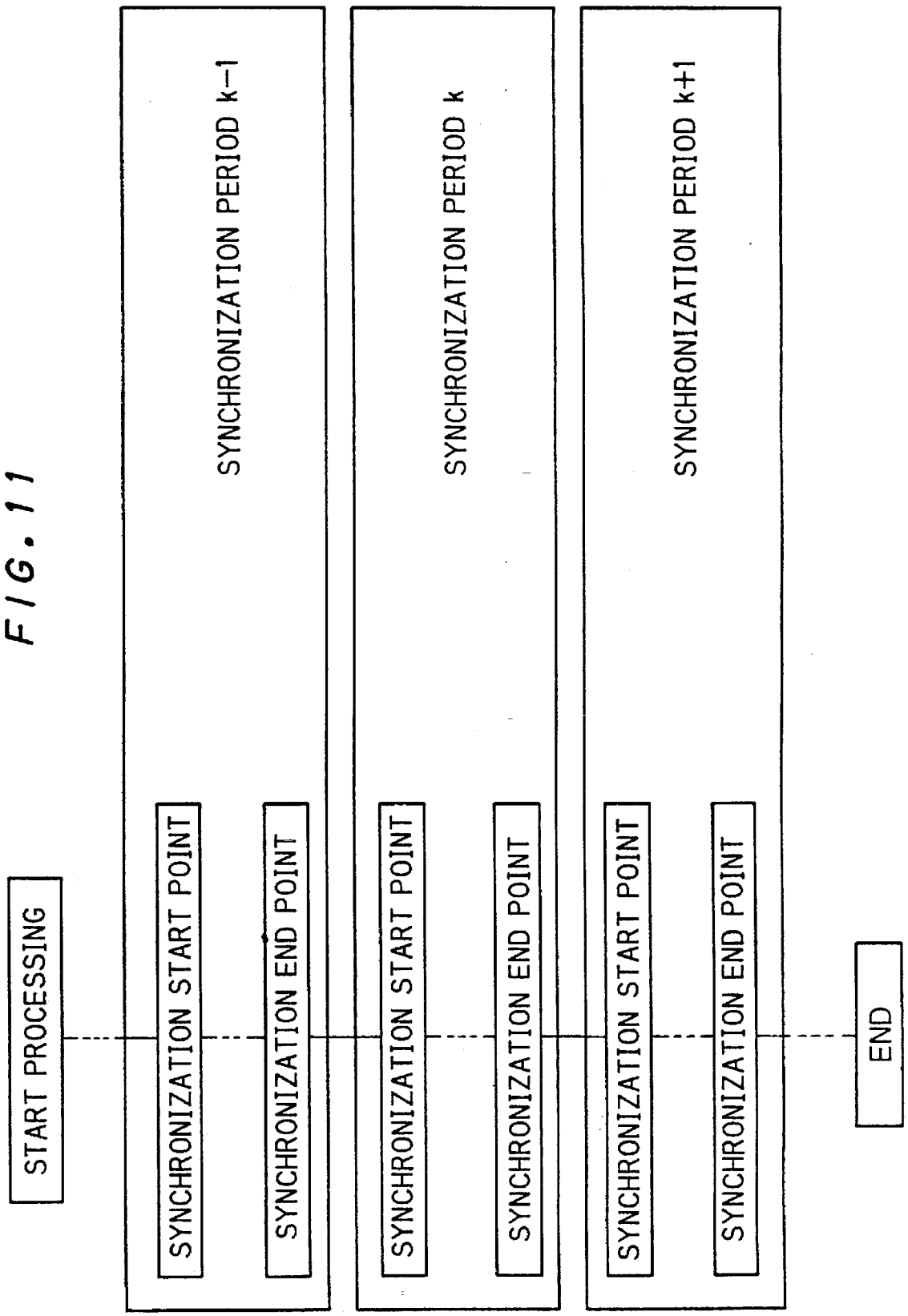
FIG. 11 shows a concept of flow of synchronization control of substrates to be processed.
Figure 12:
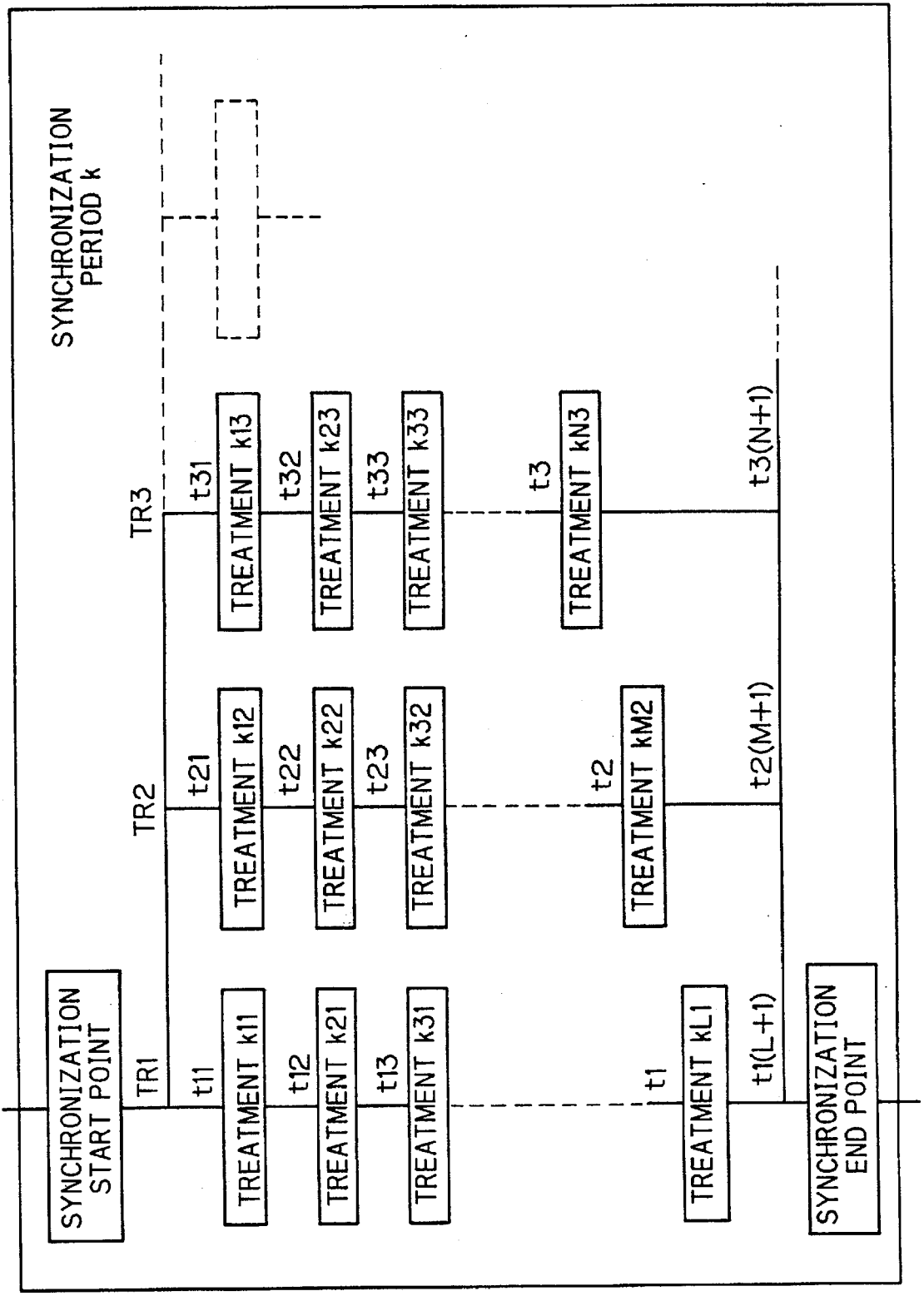
FIG. 12 is a flow chart showing a synchronization period k in FIG. 11.

FIG. 11 is a view describing the principle of minimizing the transportation cycle, i.e., maximizing the through put, and FIG. 12 is a view showing "synchronization period k" in detail. As a rule, the apparatus according to the present invention uses a plurality of transport mechanisms (high temperature robot and low temperature robot), and in most cases, it is necessary to transfer a substrate to be processed (semiconductor wafer) between the plurality of transport mechanisms. It is the transfer part where transportation operations must be synchronized with each other. In the first preferred embodiment, transportation operations are synchronized at the cool plates CP1 to CP3. Hence, transportation processes at each transportation mechanism are conceptually divided into a plurality of sub processes in accordance with the synchronization position (transfer part). The "synchronization periods" (k–1), k, (k+1) shown in FIG. 11 correspond to the sub processes. The sub processes as linked to each other successively constitute one transportation cycle. In the first preferred embodiment, for example, a transportation period from the cool plate CP1 to the cool plate CP2 in FIG. 9 is a first synchronization period, a transportation period from the cool plate CP2 to the cool plate CP3 is a second synchronization period, and a transportation period from the cool plate CP3 back to the cool plate CP1 is a third synchronization period. The synchronization periods are each defined as a period from a synchronization start point to a synchronization end point. In the first preferred embodiment, the cool plate CP2 is both the synchronization end point of the first synchronization period and synchronization start point of the second synchronization period.

In FIG. 12 particularly focusing the synchronization period k of FIG. 11, a plurality of transport mechanisms TR1, TR2, ... transport wafers parallel to each other during the synchronization period k. In the first preferred embodiment, the transport mechanism TR1 corresponds to the high temperature robot TH while the transport mechanism TR2 corresponds to the low temperature robot TC (There is no transport mechanism TR3.). During the synchronization period k, the transport mechanism TR1 circulates among processing parts k11, k21, ..., kL1 within unit transportation times t11, t12, ..., t1(L+1), respectively. The unit transportation times each include a travelling time of the transport mechanism TR1 and times needed for accessing other processing part, retrieving or placing a substrate to be processed or exchanging substrates. This is the same with the other transport mechanism TR2. In the apparatus of the first preferred embodiment, the unit transportation times are all set approximately 5 seconds. An exception is a unit transportation time needed for the transportation mechanism to move between the cool plate CP1 (CP2, CP3) and the interface IF1 (IF2, IF3) which are stacked within the transfer part 140. This is because the transportation mechanism needs move only a short distance in a vertical direction, and therefore, this unit transportation time is shorter than the other unit transportation times. In fact, this unit transportation time is ignorable. Further, each transport mechanism accesses a predetermined number of the processing parts accessed during the synchronization period k. In FIG. 12, the numbers "L," "M," "N," ... are the same in some cases and different from each other in other cases.

Under these conditions, during the synchronization period k, the travelling times Tk1, Tk2, Tk3, ... of the transport mechanisms from each synchronization start point to each synchronization end point are:

$$Tki = \Sigma tij (i=1,2,3, \ldots) \quad (1)$$

where $\Sigma$ is a sum of the values j:

(j=1 to j=L where i=1);
(j=1 to j=M where i=2);
(j=1 to j=N where i=3);

On the other hand, since the operations of the transport mechanisms must synchronized with each other at the start point and the end point of the synchronization period k, the largest one of the travelling times Tk1, Tk2, Tk3, ... serves as a rate-limiting period which restricts the speed of transportation from the start point to the end point during the synchronization period k. That is, the travelling time Tk during the synchronization period k is:

$$Tk = Max(Tk1, Tk2, Tk3, \ldots) \quad (2)$$

In this case, although the transport mechanism which takes the maximum time Tk transports a wafer at a maximum speed, the transport mechanism which can circulate necessary processing parts in a shorter time than the maximum time Tk must wait until the end of the time Tk at the synchronization end point (transfer part) after arriving at the synchronization end point.

Considering all synchronization periods, the total time needed for one cycle of complete circulating transportation (total transportation cycle) T is:

$$T = \Sigma Tk \quad (3)$$

where Σ is a sum of k=1 to k=p:

"p": the total number of the synchronization periods

Hence, it is desirable to assign the processing parts to the transport mechanisms and the orders of transportation, i.e., transportation processes, in such a manner that the total transportation cycle T of Eq. 3 becomes minimum.

The transportation processes are determined as follows. The preconditions are the following three conditions:

(1) The treatment sequence of processing substrates to be processed ("the sequence example SCE" in the first preferred embodiment) is determined in advance and must be followed;

(2) The first transport mechanism in charge of the thermal processing parts do not access "non-thermal processing parts allowing a temperature change" (the spin coater SC and the spin developer SD in the first preferred embodiment); and (3) The second transport mechanism in charge of "the non-thermal processing parts allowing a temperature change" do not access the thermal processing parts.

The third condition (3) has a secondary condition that the first transport mechanism in charge of the thermal processing parts must access "a non-thermal processing part allowing a temperature change" immediately follows a thermal processing part in the treatment sequence. When the second transport mechanism which is in charge of only the non-thermal processing parts is to access a non-thermal processing part located at such a position, the second transport mechanism must access the immediately precedent thermal processing part as well. Since this contradicts the condition (3), the secondary condition must be satisfied.

There are other two conditions which preferably, if not definitely, need be satisfied:

(4) In the treatment sequence of processing substrates to be processed, of "the processing parts allowing a temperature change," those located immediately before "the processing parts allowing no temperature change" must each also serve as a transfer part; and (5) If there are not enough transfer parts even after counting in "the processing parts allowing a temperature change" as defined by the condition (4), a necessary number of interfaces originally intended to function only as transfer parts must be used.

Hence, with these conditions satisfied, there remains a freedom to determine (a) which one of the first transport mechanism and the second transport mechanism (low temperature robot) to select as a transport mechanism which accesses those "non-thermal processing parts allowing a temperature change" except for the non-thermal processing parts which are determined to be accessed by the first transport mechanism in accordance with the secondary condition (Both the first and the second transport mechanisms may be selected.).

In reality, under the conditions (1) to (5), all possible combinations regarding the freedom (a) must be identified, and based on the combinations, the transport processes must be determined as transport process candidates. With respect to all transport process candidates, the total transportation cycles T are calculated. The transport process with the shortest cycle T is adopted, and an arrangement of the parts of the apparatus is determined and transportation is controlled.

<Actual Examples>

The principle above is applied to the first preferred embodiment as follows. First, what correspond to "the processing parts allowing a temperature change" of the first preferred embodiment are the cool plates CP1 to CP4, the indexer ID, the external interface IFB and the edge exposure part EEW. Of these processing parts, the cool plates CP1 to CP3 are used as transfer parts. The cool plate CP4, which needs to seat a semiconductor wafer immediately after the semiconductor wafer is retrieved from the hot plate HP4 by the high temperature robot TH, must be accessed by the high temperature robot TH to satisfy the secondary condition above.

Figure 13:
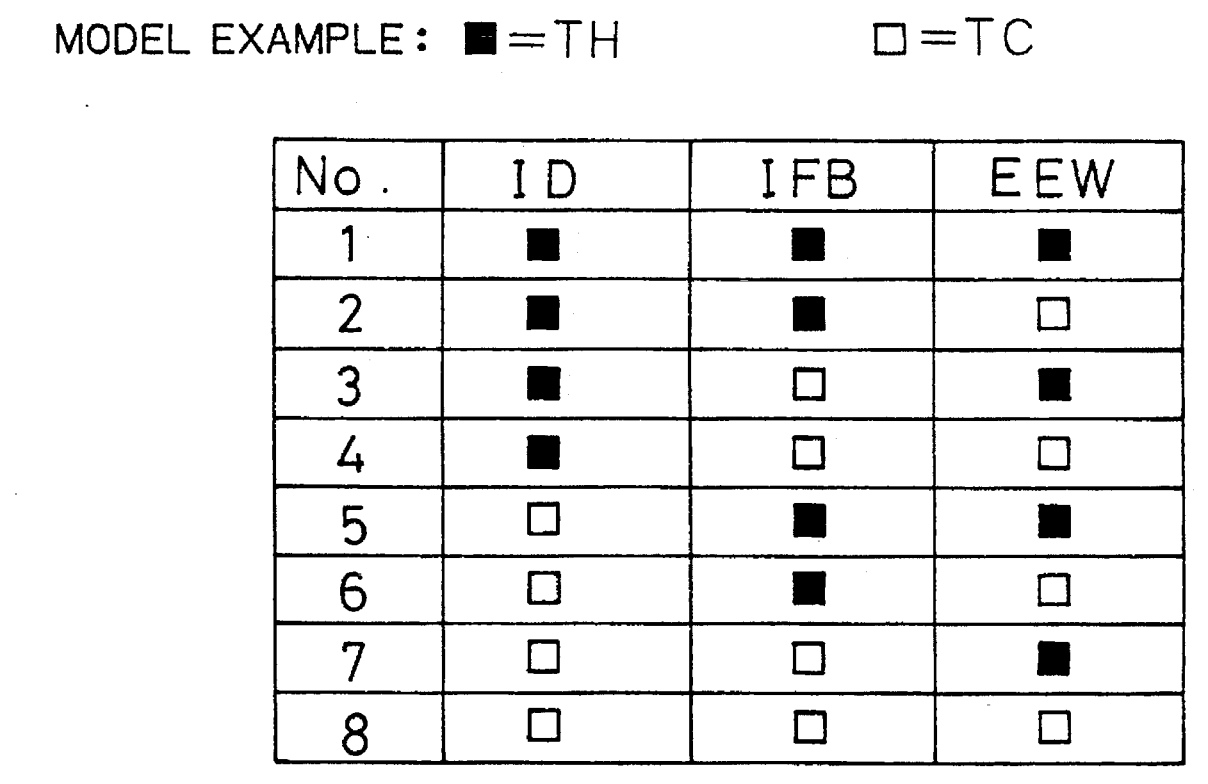
Figure 14:
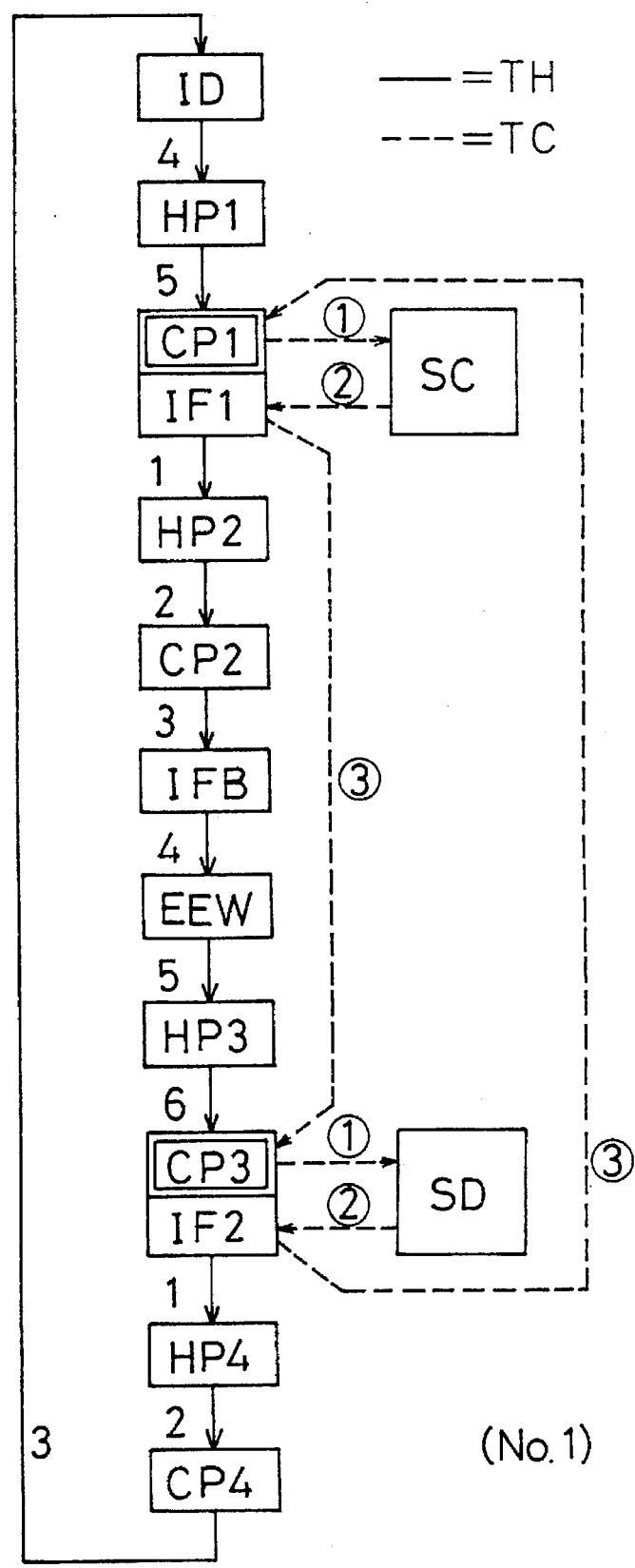
FIG. 14 shows a process flow in the case "No. 1" of FIG. 13.
Figure 15:
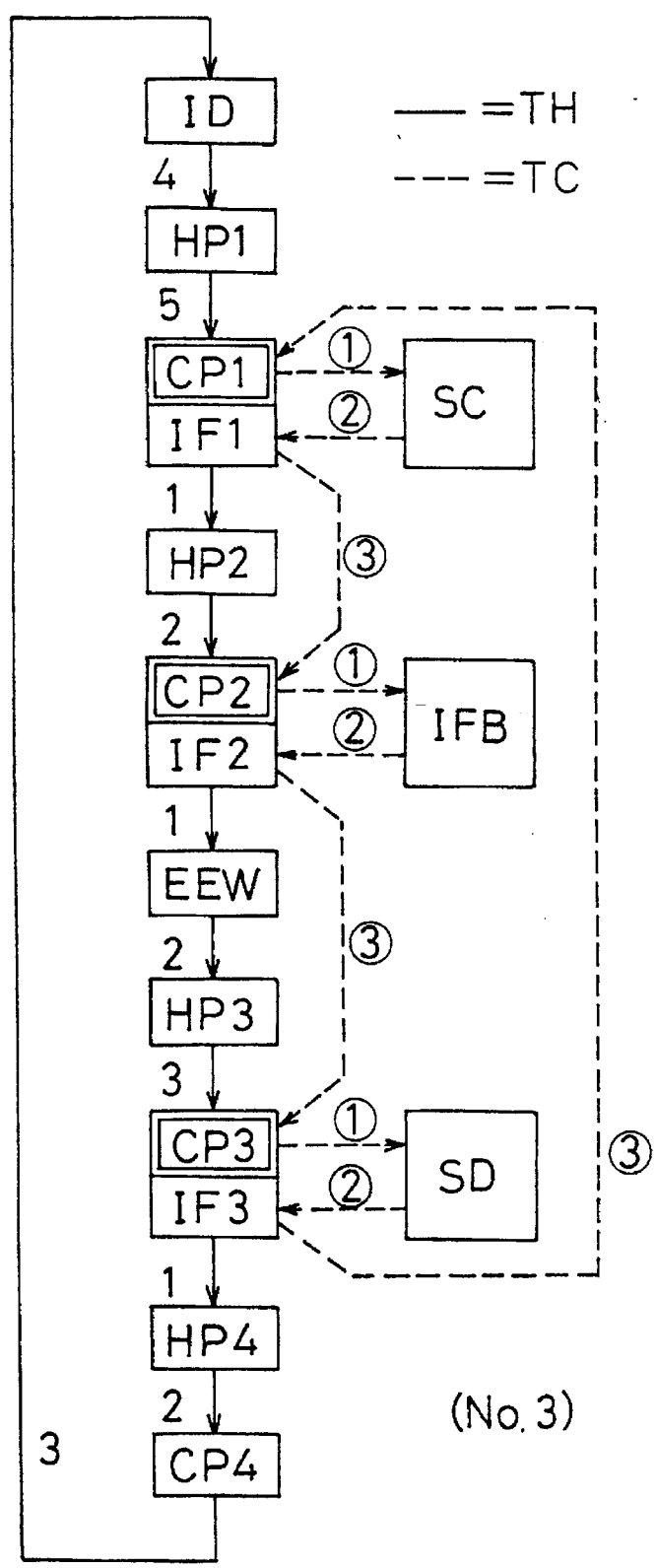
FIG. 15 shows a process flow in the case "No. 3" of FIG. 13.
Figure 16:
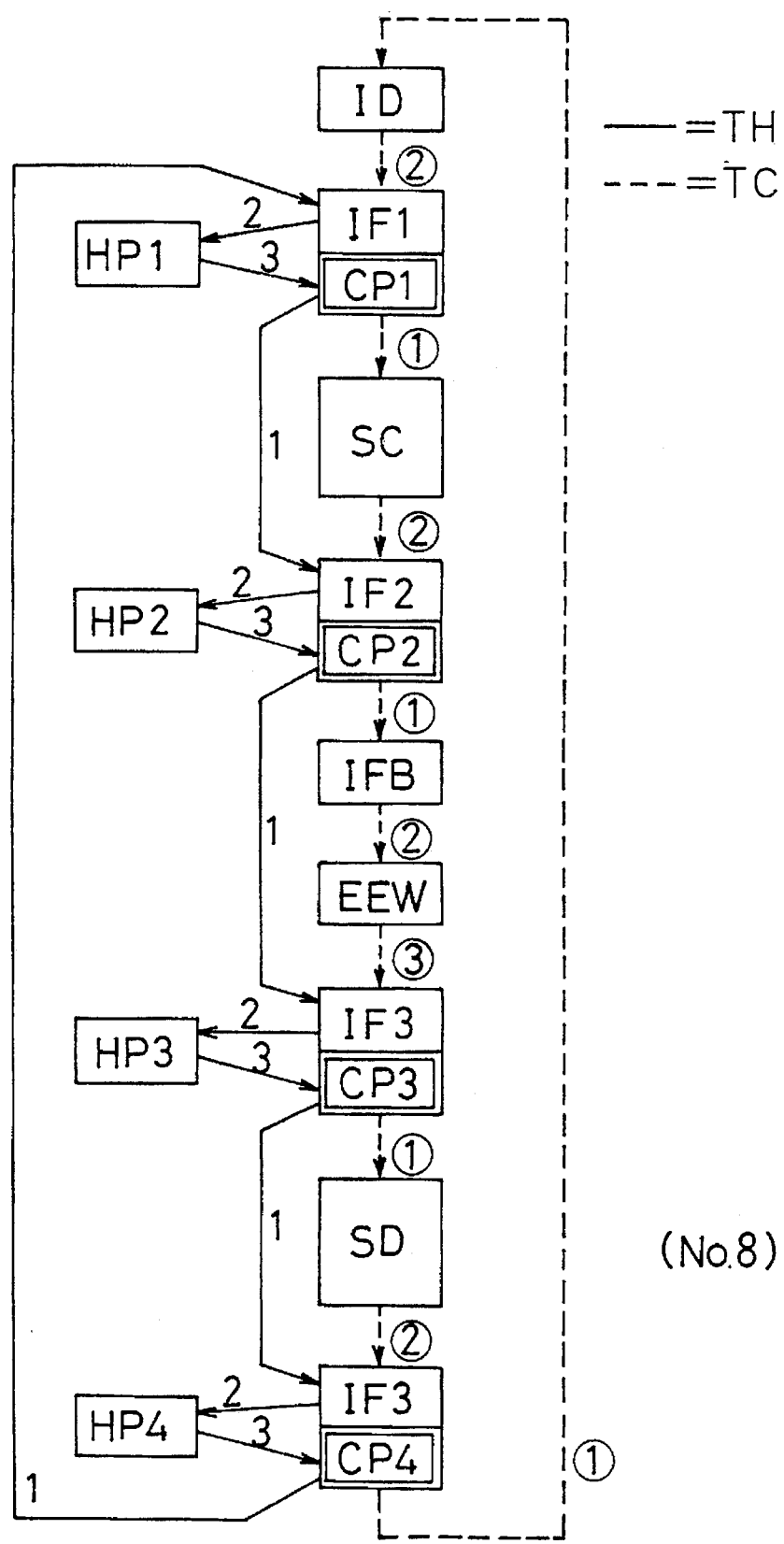
FIG. 16 shows a process flow in the case "No. 8" of FIG. 13.

This leaves the indexer ID, the external interface IFB and the edge exposure part EEW as a freedom of selecting whether to access by the high temperature robot TH or the low temperature robot TC. FIG. 13 shows eight possible combinations regarding assignment of the indexer ID, the external interface IFB and the edge exposure part EEW to the high temperature robot TH and the low temperature robot TC. This presents eight transportation processes. Of the eight transportation processes, three cases corresponding to the processes No. 1, No. 3 and No. 8 of FIG. 13 are shown in FIGS. 14, 15 and 16, respectively. In FIG. 14 (No. 1), for instance, the indexer ID, the external interface IFB and the edge exposure part EEW are all assigned to the high temperature robot TH. In FIG. 15 (No. 3), the indexer ID and the edge exposure part EEW are all assigned to the high temperature robot TH while the external interface IFB is assigned to the low temperature robot TC. In FIG. 16 (No. 8), the three processing parts are all assigned to the low temperature robot TC.

After specifying the transportation processes in this manner, for each synchronization period, the travelling times Tk1 and Tk2 of the transport robots TH and TC are calculated. The number of the transportation steps may be calculated instead since the unit transportation times are commonly five seconds. In FIGS. 14 to 16, the start point (end point) of each synchronization period is the cool plate which is enclosed by the double line.

In the case of FIG. 14, during the first synchronization period from the cool plate CP1 to the cool plate CP3, the high temperature robot TH requires six steps for transportation. In FIG. 14, the numbers "1" to "6" denote the count value of the steps. For the low temperature robot TC, the step numbers are denoted with numbers in circle as such as 1̂, 2̂ ... The number of the steps needed during first synchronization period is three. Hence, $$T1 = \text{Max}(T11 = 6 \times 5 \text{ sec}, T12 = 3 \times 5 \text{ sec}) \quad (4)$$
$$= 6 \times 5 \text{ sec}$$

Calculating the travelling time for the second synchronization period in FIG. 14, $$T2 = \text{Max}(T12 = 5 \times 5 \text{ sec}, T22 = 3 \times 5 \text{ sec}) \quad (5)$$
$$= 5 \times 5 \text{ sec}$$

As a result, the total transportation cycle T in FIG. 14 is:

$$T = T1 + T2 \quad (6)$$
$$= (6+5) \times 5 \text{ sec}$$
$$= 11 \times 5 \text{ sec}$$

Calculating in a similar manner with respect to FIGS. 15 and 16 as well, for FIG. 15, $$T = (3+3+5) \times 5 \text{ sec} \quad (7)$$
$$= 11 \times 5 \text{ sec}$$

For FIG. 16, $$T = (3+3+3+3) \times 5 \text{ sec} \quad (8)$$
$$= 12 \times 5 \text{ sec}$$

Calculation as to the other examples shown in FIG. 13 is omitted. The result of calculation is T=11×5 sec in FIGS. 14 and 15 (Nos. 1 and 3) and T=12×5 sec or more in the other cases. Hence, by assigning the processing parts to the transport robots TH and TC as in accordance with the process No. 1 or the process No. 3, it is possible to minimize the transportation cycle and obtain a maximum through put.

As easily seen, the transportation process of the first preferred embodiment (FIGS. 9 and 10) corresponds to the process No. 3. When there are more than one transportation processes which minimize the transportation cycle, either one of the transportation processes may be selected, or alternatively, the transportation processes may be selected in accordance with a further condition. For instance, if a stepper or the like is disposed outside the external interface IFB of FIG. 2 so that a wafer already exposed by the stepper should not pass beside the spin developer SD, the process No. 1 of FIG. 14 may be selected rather than the process No. 3 of FIG. 15.

When both the high temperature robot TH and the low temperature robot TC are designed to access the interface IFB as in the first preferred embodiment, if there are more than one transportation processes which satisfy the transportation cycle minimizing conditions, it is possible to determine which robot to used to access the interface IFB. As for the contents of treatments performed on wafers, the contents may vary between different lots and therefore optimal transportation processes are different between different lots. When the contents are varying, since the interface IFB can be accessed by either robot, it is possible to optimize the control of transportation for each lot. Thus, by ensuring that both robots can access the external interface IFB as in the apparatus of the first preferred embodiment, the flexibility of the apparatus is enhanced.

<Wait Control during Synchronized Transportation>

Figure 17:
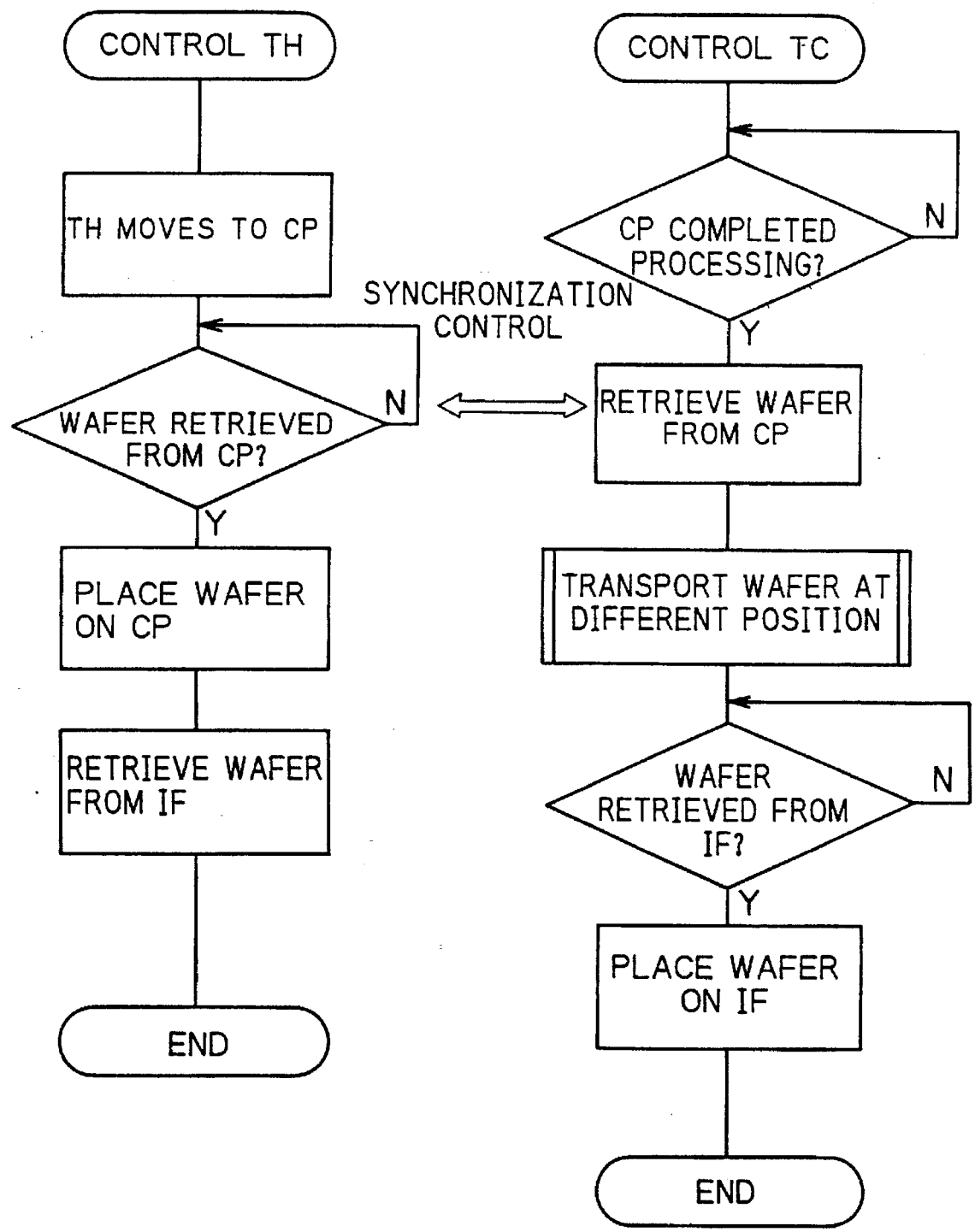
FIG. 17 is a flow chart showing synchronization control of substrates to be processed and wait control during transfer.

The transportation cycle is minimized as described above. In reality, however, all transport mechanisms may not arrive at the respective synchronization end points completely at the same time. In some cases, one of the robots arrives at its synchronization end point earlier and must wait for the other robot to arrive at its synchronization end point. In other words, in general, although the transportation cycle becomes minimum when the numbers of the processing parts assigned to the transport mechanisms during each synchronization period are equal or close to each other, since the contents of treatments performed on wafers (and hence, the number of the involved processing parts) are determined in advance, such a wait cycle cannot be completely avoided. Such a wait cycle is controlled by the computer 51 of FIG. 8. FIG. 17 shows a specific example of a controlled wait cycle.

In the left half portion of FIG. 17 is related to the high temperature robot TH. From the left half portion of FIG. 17, it is known whether a wafer already on one of the cool plates CP is removed from the cool plate by the low temperature robot TC when the high temperature robot TH arrives at the cool plate CP. When a wafer is retrieved from the cool plate CP, a pin attached to the cool plate CP moves upward to push up the wafer. Receiving an instruction to retrieve the wafer, the low temperature robot TC retrieves the wafer from the cool plate CP. Completing the retrieval of the wafer, the low temperature robot TC sends a retrieval complete signal to the computer 51. The computer 51 detects the retrieval of the wafer by means of the retrieval complete signal. If the retrieval of the wafer is not complete yet, the low temperature robot TC has not arrived at the cool plate CP yet. Hence, the high temperature robot TH waits for arrival of the low temperature robot TC.

When the low temperature robot TC arrives at the cool plate CP and retrieves the wafer, the high temperature robot TH is released from a locked state so as to place the wafer it holds onto the cool plate CP. After retrieving the wafer, the low temperature robot TC proceeds to the next processing (i.e., moves to the next position) without waiting the high temperature robot TH to complete placing the wafer on the cool plate CP.

On the other hand, at the interface IF (IF1 to IF3), placing of a wafer by the low temperature robot TC is performed before the high temperature robot TH performs an intended function. Hence, if the high temperature robot TH arrives at the interface IF earlier, the high temperature robot TH waits for the low temperature robot TC to arrive at the interface IF and place a wafer on the interface IF. When the low temperature robot TC finishes placing a wafer, the high temperature robot TH retrieves the wafer from the interface IF.

By performing such synchronized control or wait control, the high temperature robot TH and the low temperature robot TC efficiently transfer a semiconductor wafer between the same.

3. Relationship with Other Embodiments

Before describing the other preferred embodiments of the present invention, major differences between the first preferred embodiment and the other preferred embodiments will be summarized. FIG. 18 is a table comparing differences regarding the mechanisms between the preferred embodiments. In FIG. 18, "the number of high temperature robots" expresses the number of transport robots disposed which correspond to the high temperature robot TH of the first preferred embodiment. The third row "rotation of high temperature robots" expresses whether the high temperature robots TH have a rotation freedom. The low temperature robots may be disposed to be able to translate in the direction X as in the first preferred embodiment, or may be disposed as incapable of moving in the direction X. The row "low temperature robot hand" expresses whether the low temperature robots are double-handed as in the first preferred embodiment or single-handed. First, the second preferred embodiment will be described. In the description hereinafter, the components which have common structures throughout the embodiments are referred to with the same reference symbols.

4. Second Preferred Embodiment

Figure 19:
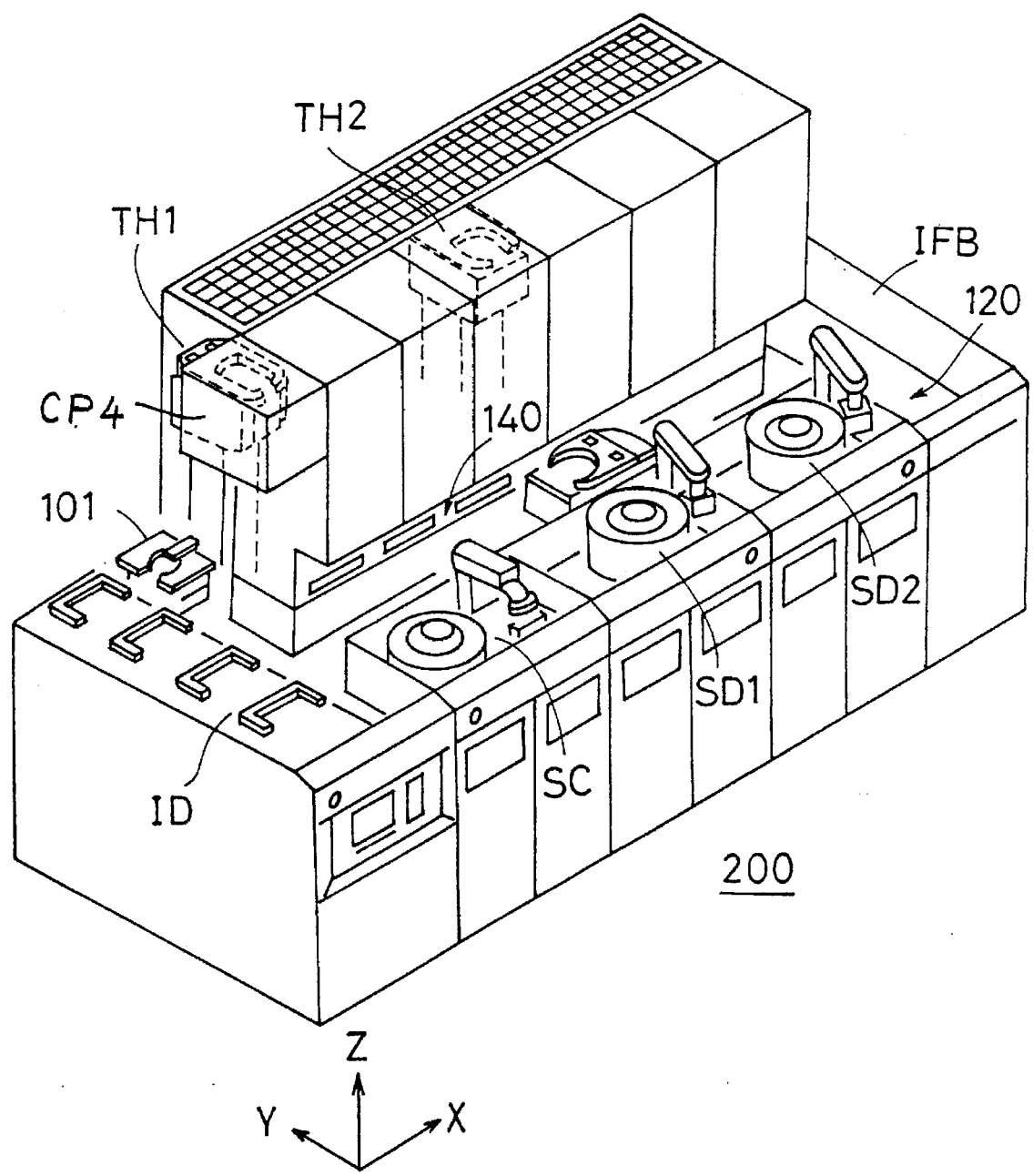
FIG. 19 is a perspective view showing an appearance of a semiconductor wafer processing apparatus according to a second preferred embodiment of the present invention.
Figure 20:
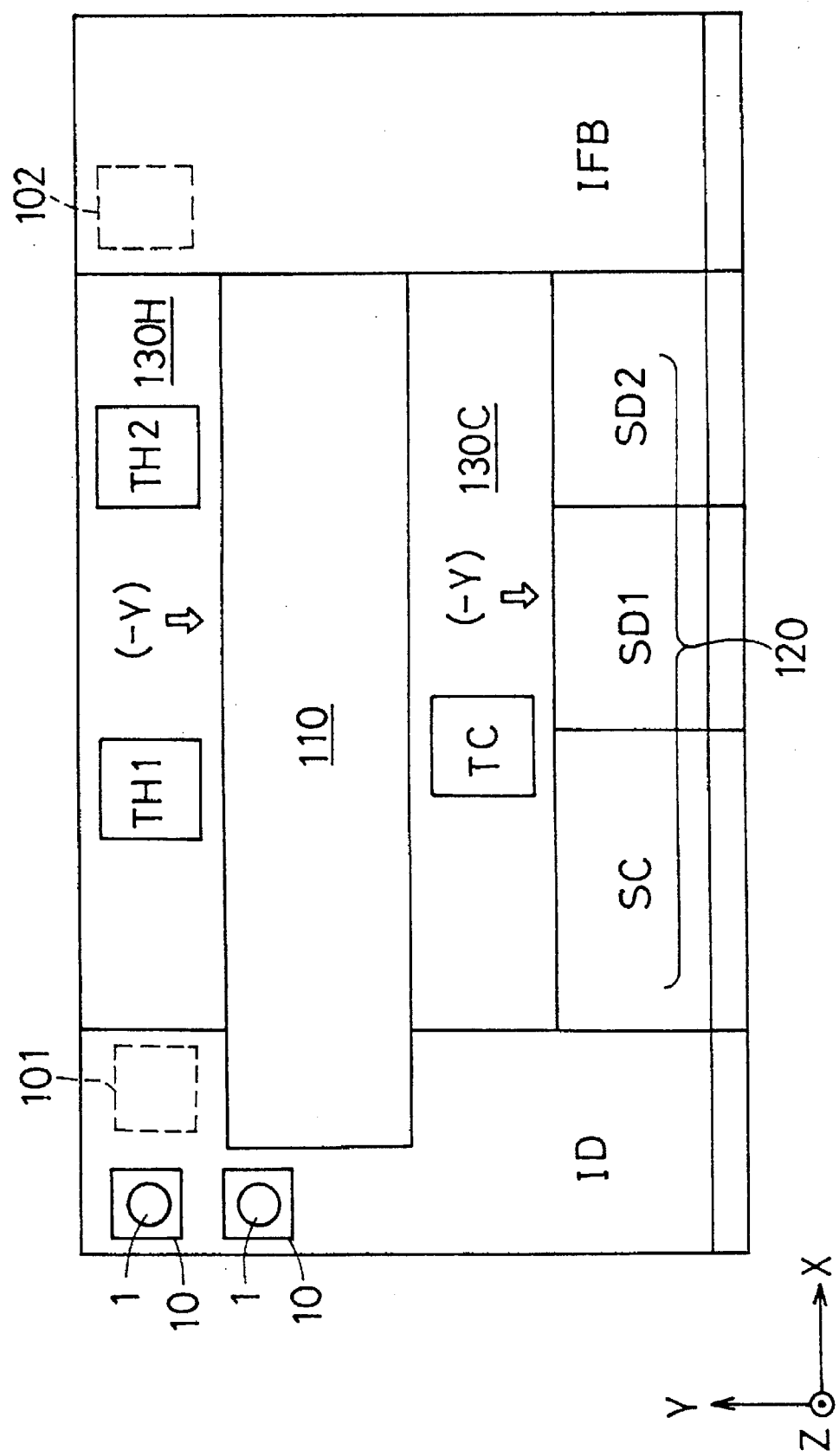
FIG. 20 is a conceptual plan view of the apparatus of the second preferred embodiment.

FIGS. 19 and 20 show a structure of a semiconductor wafer processing apparatus 200 according to the second preferred embodiment of the present invention. The apparatus 200 includes two high temperature robots TH1 and TH2 which are each capable of translating in the direction X and in the opposite direction. The high temperature robots TH1 and TH2 are double-handed like the high temperature robot TH of the first preferred embodiment but do not rotate in the X-Y plane. The apparatus 200 is otherwise the same as the apparatus of the first preferred embodiment.

Figure 21:
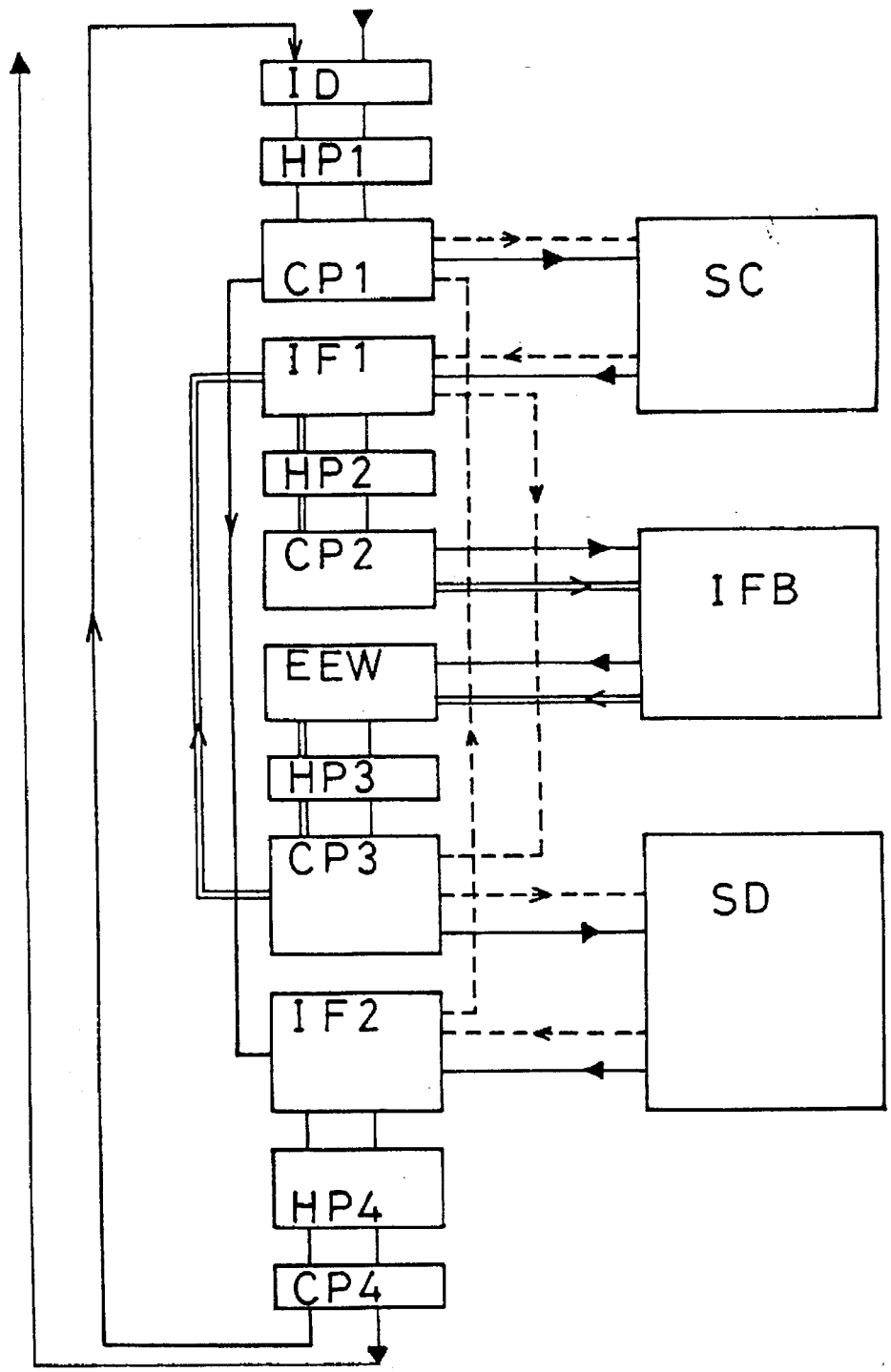
FIG. 21 shows a process flow in the apparatus of the second preferred embodiment.
Figure 22:
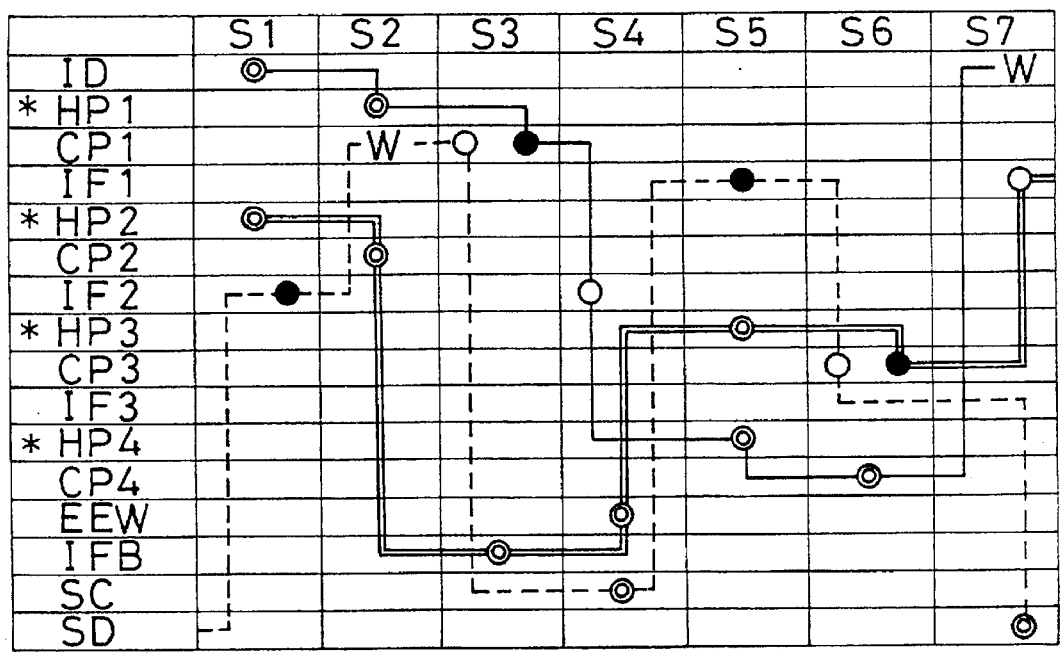
FIG. 22 is a timing view of the apparatus of the second preferred embodiment.

FIGS. 21 and 22 are views of a transportation process in the apparatus 200 of the second preferred embodiment. Since the two high temperature robots TH1 and TH2 are used, one of the robots access some of the hot plates HP1 to HP4 while the other robot access the remaining hot plates. The low temperature robot TC accesses only the non-thermal processing parts as in the first preferred embodiment.

Having such a structure and controlled process, the apparatus 200 of the second preferred embodiment not only promises the advantages of the apparatus 100 of the first preferred embodiment but also shortens the transportation cycle, which is a further advantageous over the apparatus 100. In fact, while the first preferred embodiment (FIG. 10) requires eleven steps as one transportation cycle, the second preferred embodiment (FIG. 22) requires seven steps as one transportation cycle.

5. Third Preferred Embodiment

Figure 23:
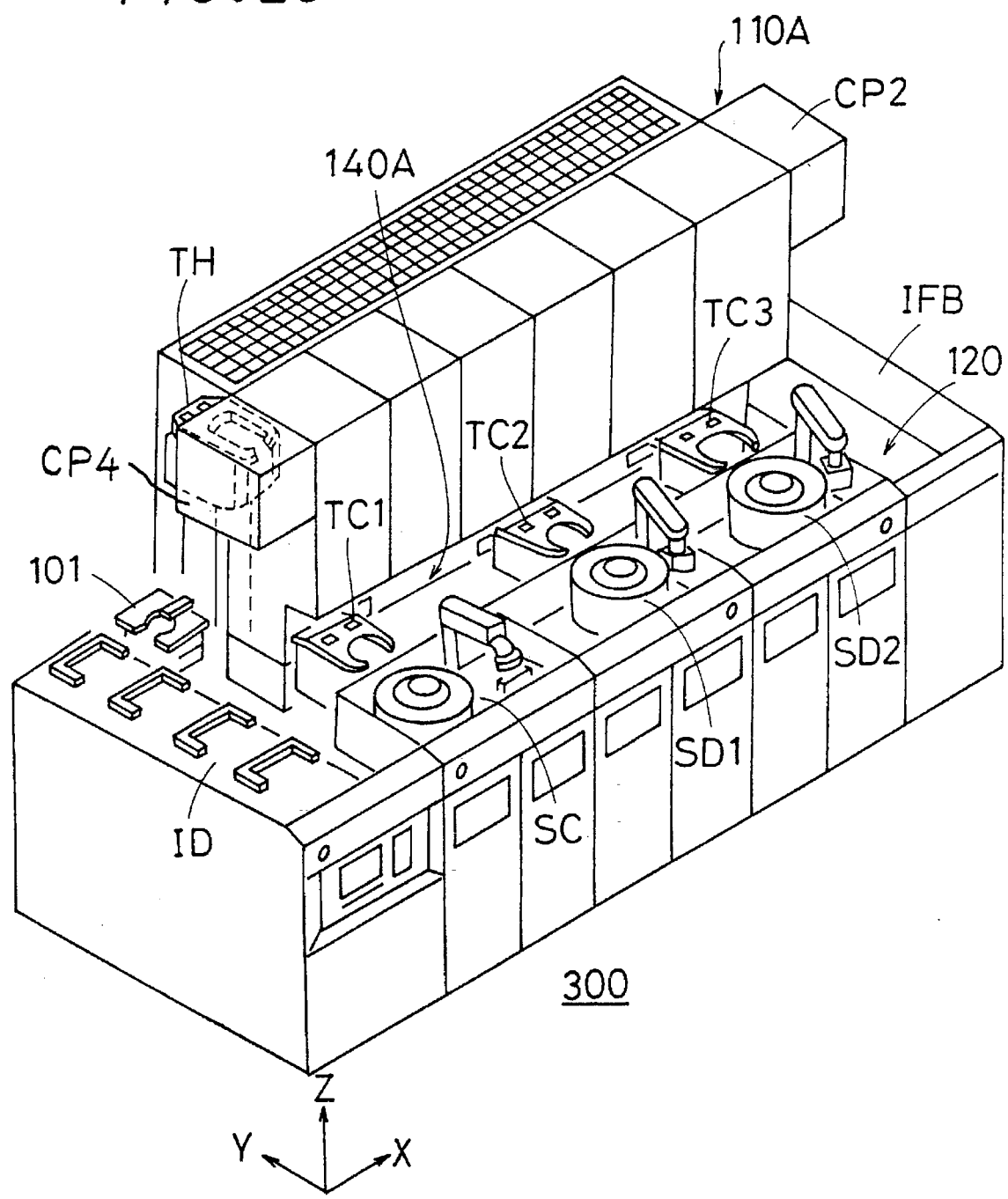
FIG. 23 is a perspective view showing an appearance of a semiconductor wafer processing apparatus according to a third preferred embodiment of the present invention.
Figure 24:
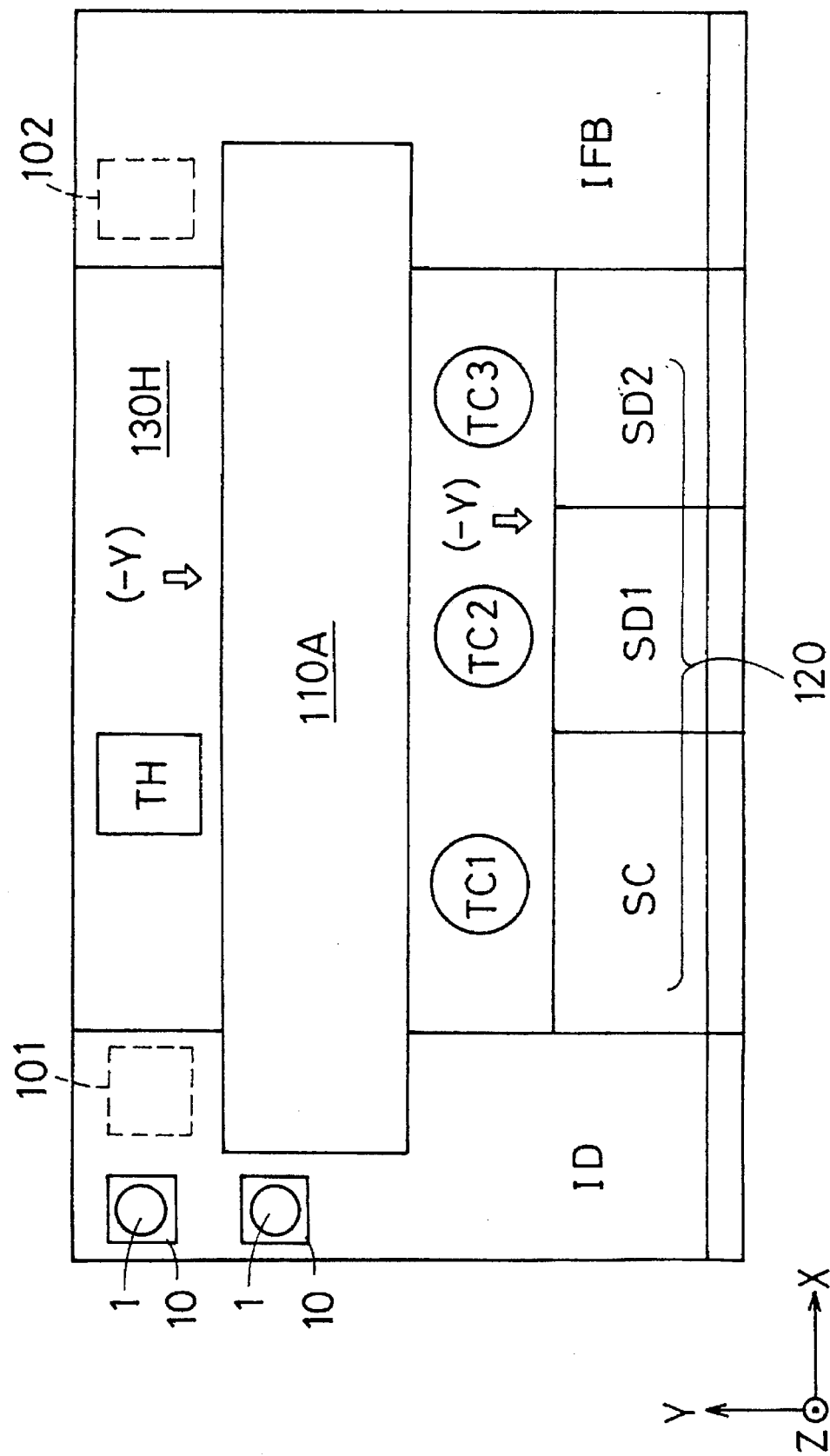
FIG. 24 is a conceptual plan view of the apparatus of the third preferred embodiment.
Figure 25:
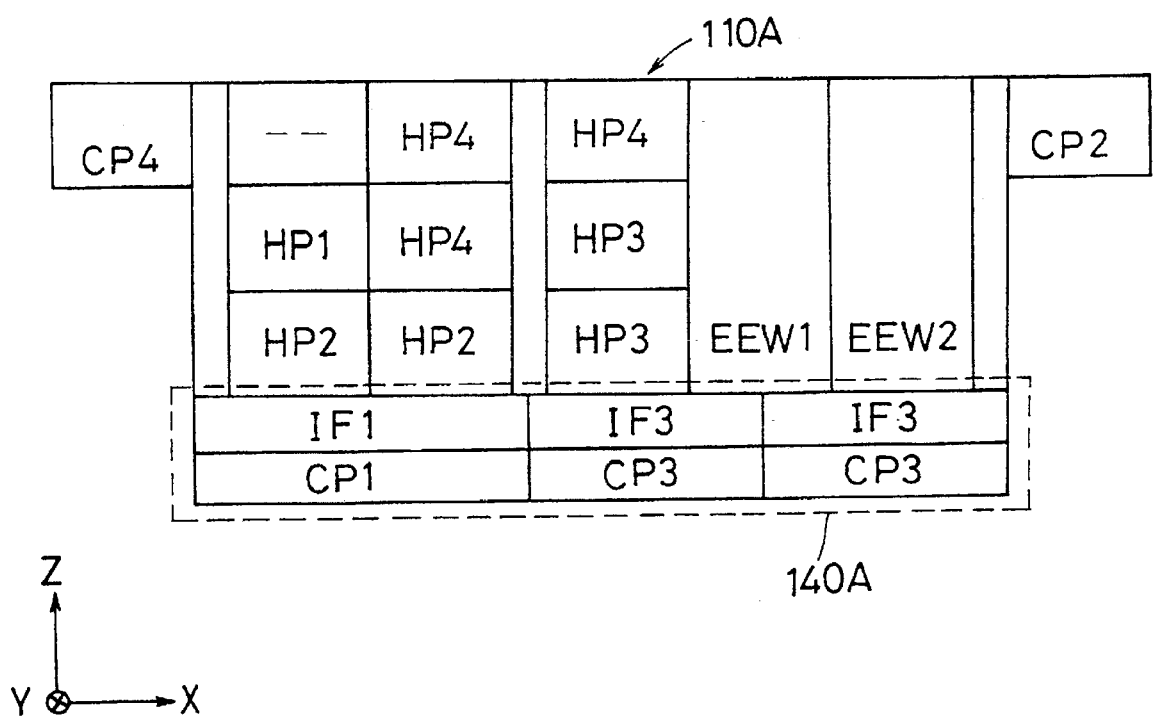
FIG. 25 is a conceptual front view of a first processing part group of the apparatus of the third preferred embodiment.

FIGS. 23 to 25 show a structure of a semiconductor wafer processing apparatus 300 according to the third preferred embodiment of the present invention and an arrangement of the processing parts. In FIG. 23, the apparatus 300 uses only one high temperature robot TH as in the first preferred embodiment but requires three low temperature robots TC1, TC2 and TC3 to be fixed in order to face the second processing part group 120.

The low temperature robots TC1, TC2 and TC3 do not have a freedom to translate in the direction X and in the opposite direction. Instead, the robots TC1 to TC3 are capable of rotating and retracting their hands and moving in a vertical direction. Hence, these robots are fixed in a horizontal direction. The low temperature robots TC1 to TC3 are double-handed.

Now, referring to FIG. 24, the low temperature robots TC1 to TC3 are arranged in a line to face the second processing part group 120 at positions which correspond to the spin coater SC, the spin developers SD1 and SD2, respectively. Below a first processing part group 110A, the cool plates CP1 and CP3 are disposed to serve as a portion of a transfer part 140A and the interfaces IF1 and IF3 are stacked on the cool plates CP1 and CP3, respectively, as shown in FIG. 25. The hot plates HP1 to HP4 are stacked on the transfer part 140A. In an example of transportation process, a semiconductor wafer is circulated without using the interfaces IF1 and IF3. However, the interfaces IF1 and IF3 are preferably disposed to improve the flexibility of the apparatus. The apparatus 300 is otherwise the same as the apparatus of the first preferred embodiment.

Figure 26:
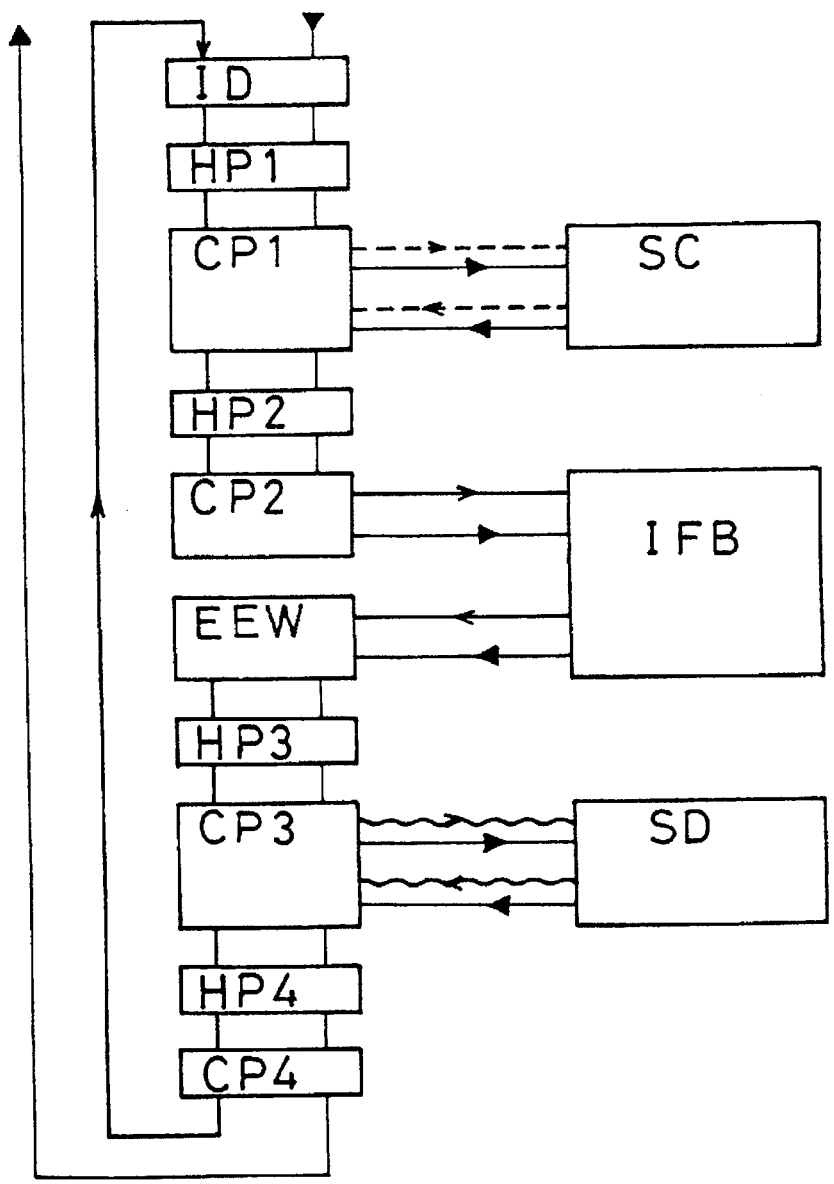
FIG. 26 shows a process flow in the apparatus of the third preferred embodiment.
Figure 27:
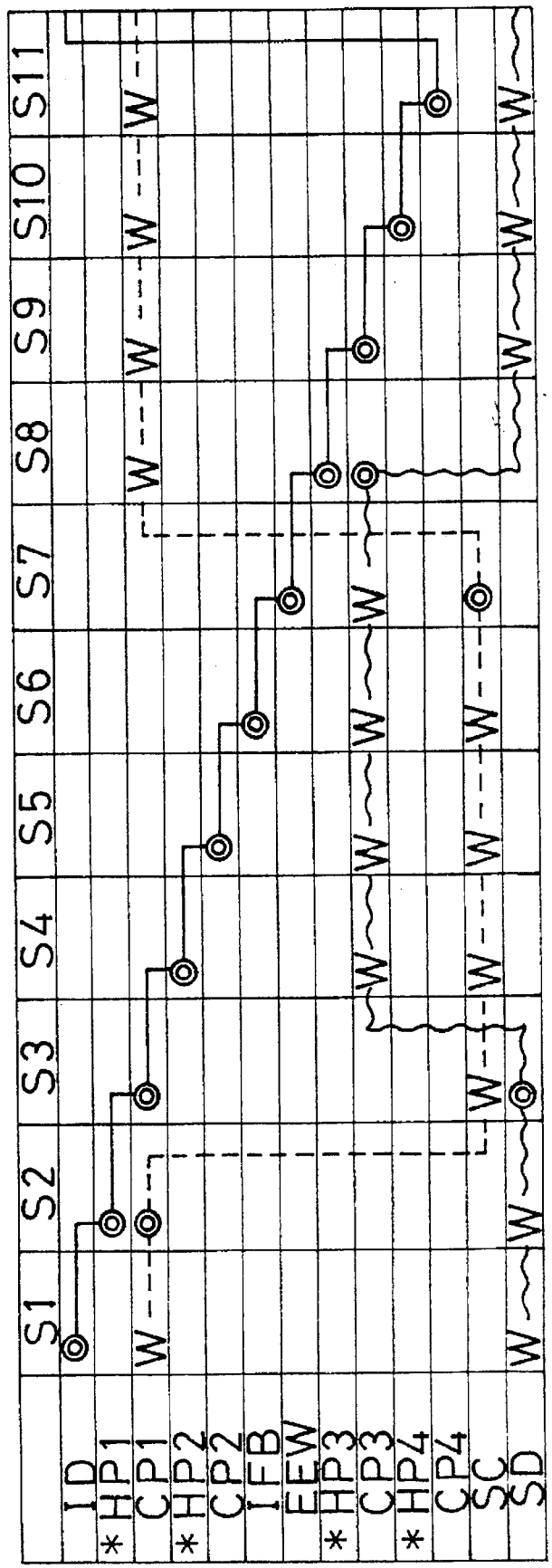
FIG. 27 is a timing view of the apparatus of the third preferred embodiment.

FIGS. 26 and 27 are views showing a transportation process in the apparatus 300 of the third preferred embodiment. Of the three low temperature robots TC1 to TC3, the robots TC2 and TC3 access the spin developers SD1 and SD2, respectively. Since the spin developers SD1 and SD2 are selectively and alternately used as described earlier, the low temperature robots TC2 and TC3 alternately perform a common transportation process in accordance with alternate use of the spin developers SD1 and SD2. For this reason, FIGS. 26 and 27 show the transportation process and timing common to both the low temperature robots TC2 and TC3.

As FIGS. 26 and 27 show, in the apparatus the third preferred embodiment, it is possible to transfer semiconductor wafers between the high temperature robot TH and the low temperature robots TC1 to TC3 without using the interfaces IF1 and IF3 but by using only the cool plates CP1 and CP3. The external interface IFB is used for transfer when the high temperature robot TH temporarily places a wafer and retrieves the wafer later.

Since each one of the low temperature robots TC1 to TC3 is in charge of each one of the spin coater SC, the spin developers SD1 and SD2 of the second processing part group 120, except for vertical movement, each low temperature robot only needs to reversely rotate its hands holding a wafer to transfer the wafer between the transfer part 140A and the processing part. This prevents creation of particles and the like due to translation of the robots.

The apparatus is manufactured easily and the second processing part group 120 aligns a semiconductor wafer at an improved alignment accuracy because the low temperature robots TC1 to TC3 are fixed. The low temperature robots TC1 to TC3 and the second processing part group 120 may be formed as one unit. The other advantages of the apparatus 300 are otherwise the same as those of the first preferred embodiment.

6. Fourth Preferred Embodiment

Figure 28:
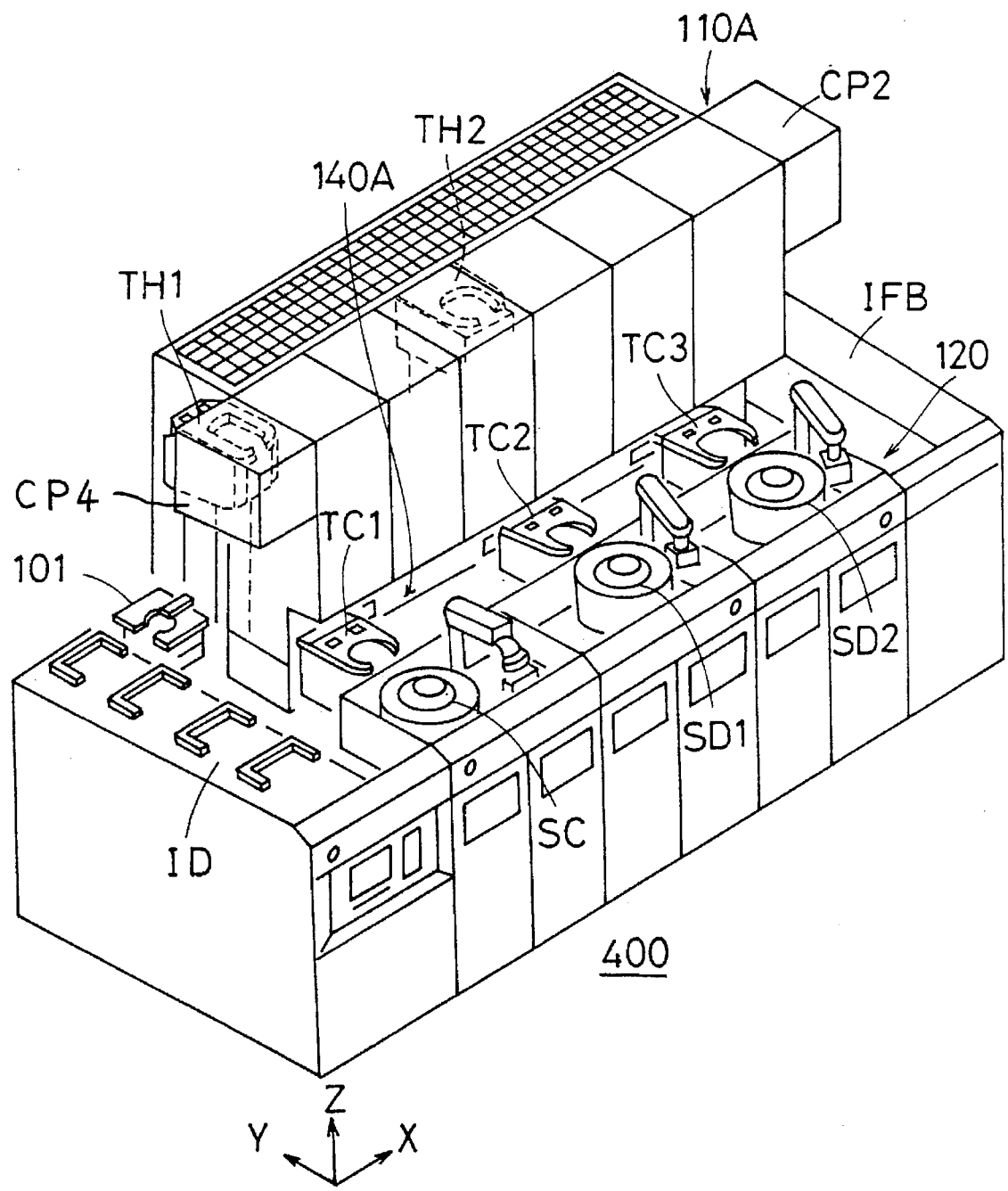
FIG. 28 is a perspective view showing an appearance of a semiconductor wafer processing apparatus according to a fourth preferred embodiment of the present invention.
Figure 29:
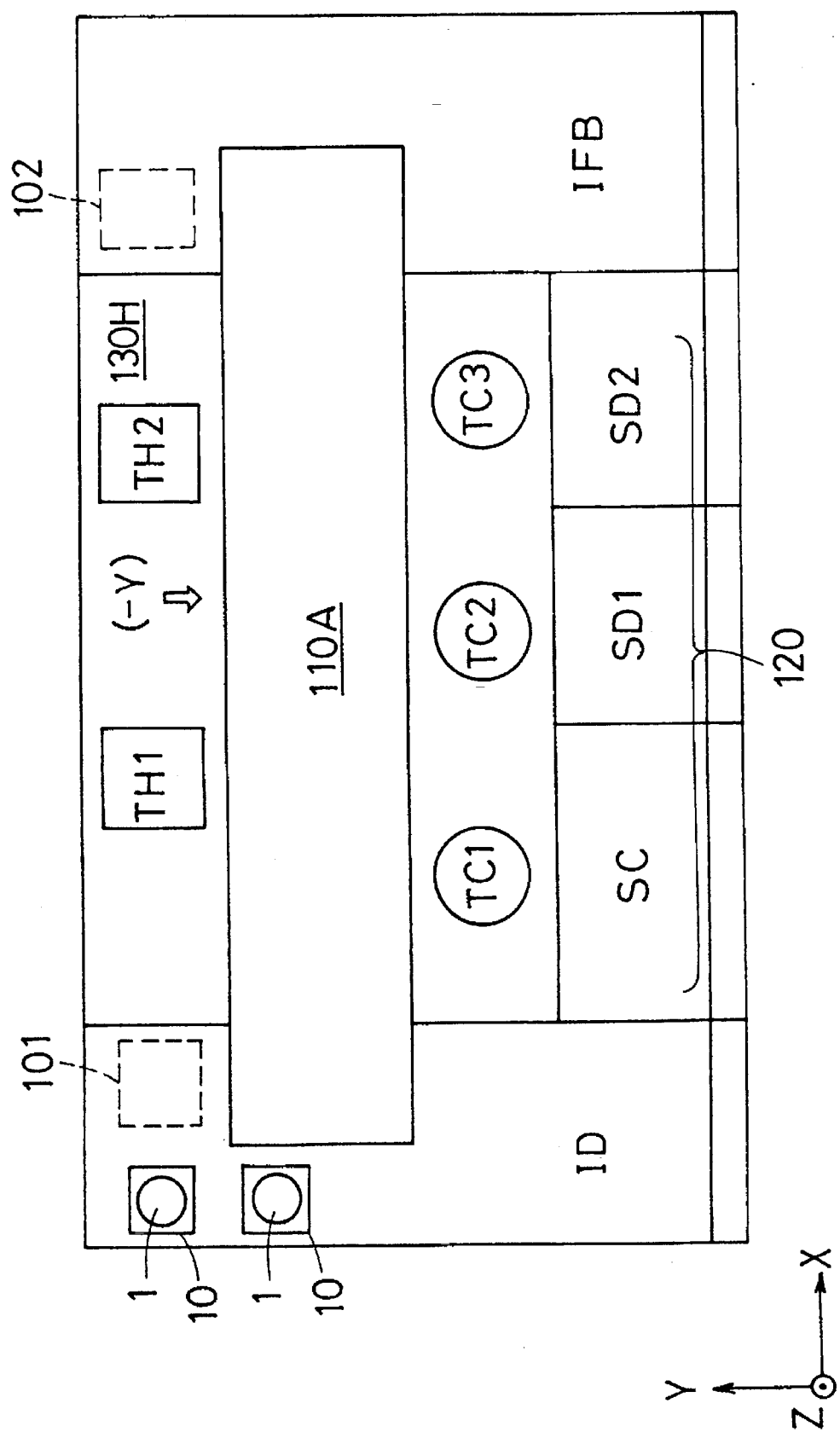
FIG. 29 is a conceptual plan view of the apparatus of the fourth preferred embodiment.

FIGS. 28 and 29 show a structure of a semiconductor wafer processing apparatus 400 according to the fourth preferred embodiment of the present invention. In FIG. 28, the apparatus 400 uses three rotation type low temperature robots TC1 to TC3 as in the third preferred embodiment and two high temperature robots TH1 and TH2 as in the second preferred embodiment. The arrangement within the first processing part group 110A is the same as in the third preferred embodiment. Hence, the fourth preferred embodiment is combination of the second and the third preferred embodiments. A detailed structure of the fourth preferred embodiment is similar to that of the second and the third preferred embodiments.

Figure 30:
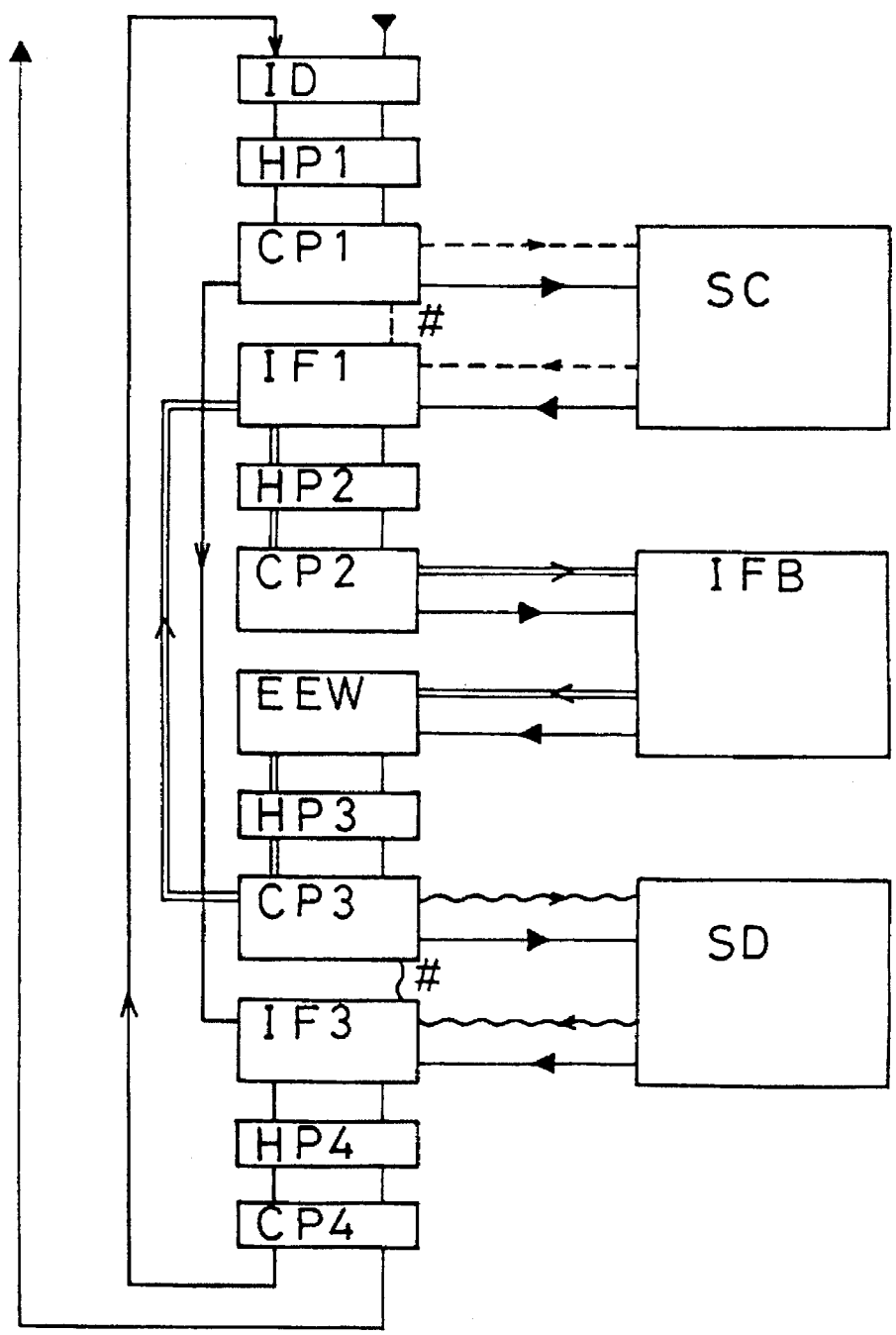
FIG. 30 shows a process flow in the apparatus of the fourth preferred embodiment.
Figure 31:
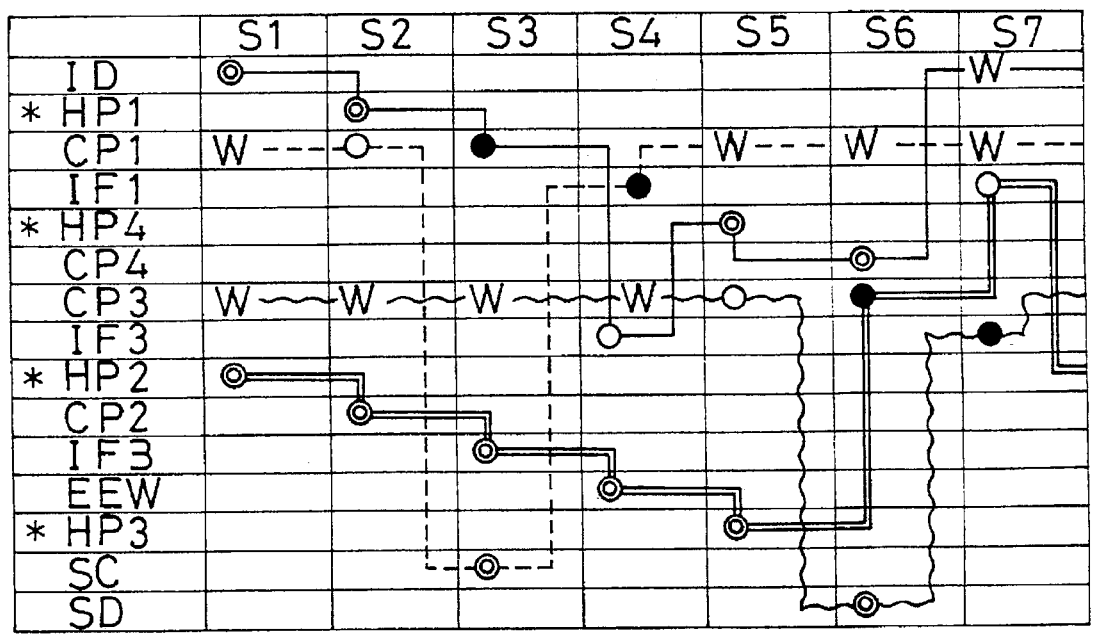
FIG. 31 is a timing view of the apparatus of the fourth preferred embodiment.

FIGS. 30 and 31 are views of a transportation process in the apparatus 400 of the fourth preferred embodiment. In addition to the cool plates CP1 and CP3, the interfaces IF1 and IF3 of FIG. 25 are also used to transfer a wafer.

Since the fourth preferred embodiment uses an increased number of the high temperature robots than in the third preferred embodiment, the transportation cycle consists of only seven steps, much fewer than the eleven steps of the third preferred embodiment (FIG. 27). Hence, the transportation through put is even higher than in the third preferred embodiment. The other advantages of the apparatus 400 are otherwise the same as those of the third preferred embodiment.

7. Fifth Preferred Embodiment

Figure 32:
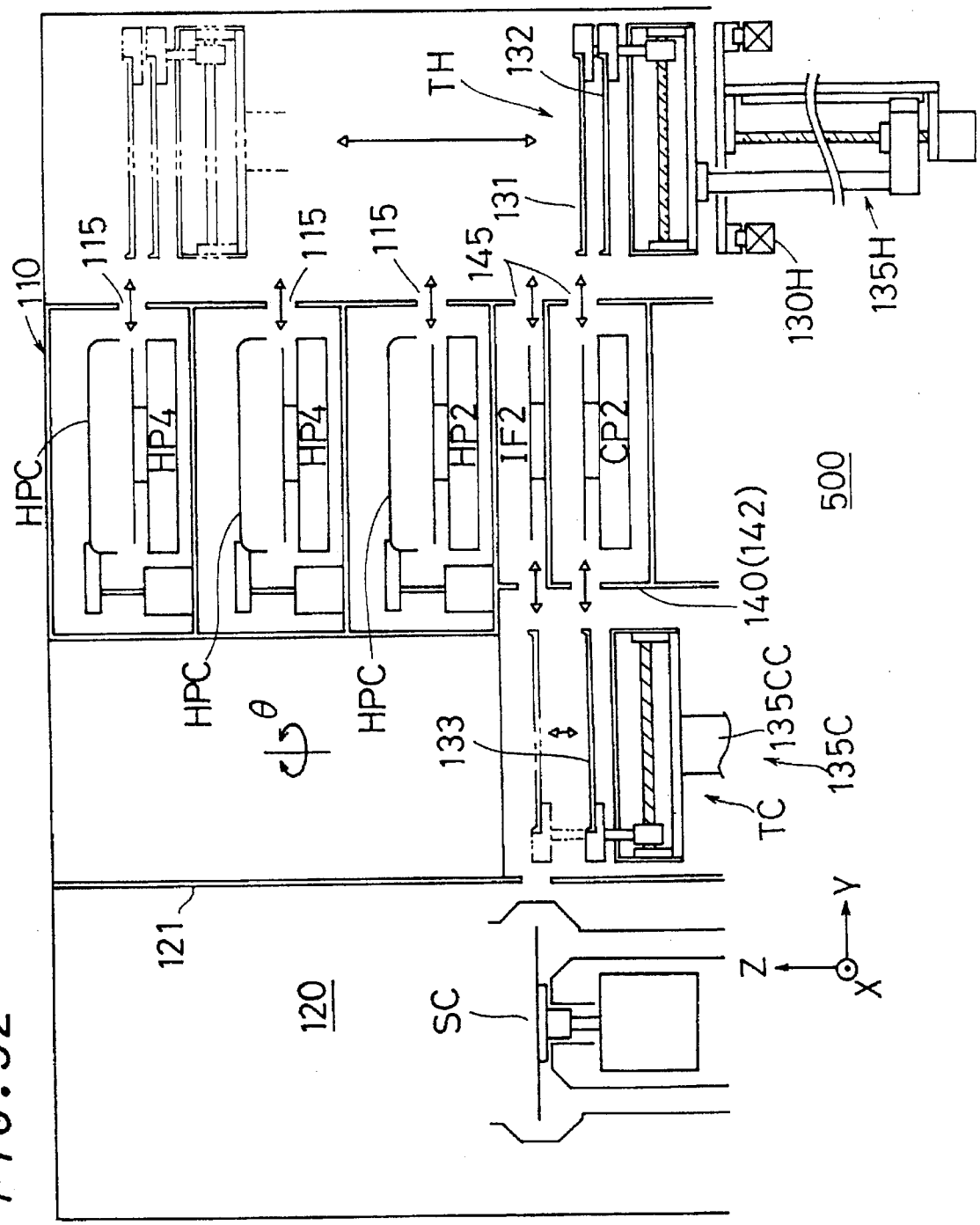
FIG. 32 is a cross sectional view of an upper part of an apparatus of a fifth preferred embodiment

FIG. 32 is a cross sectional view of an upper portion of a semiconductor wafer processing apparatus 500 according to the fifth preferred embodiment of the present invention. FIG. 32 corresponds to FIG. 5. The low temperature robot TC of the apparatus 500 has only one hand 133 (single-handed). The apparatus 500 is otherwise the same as the apparatus of the first preferred embodiment.

Figure 33:
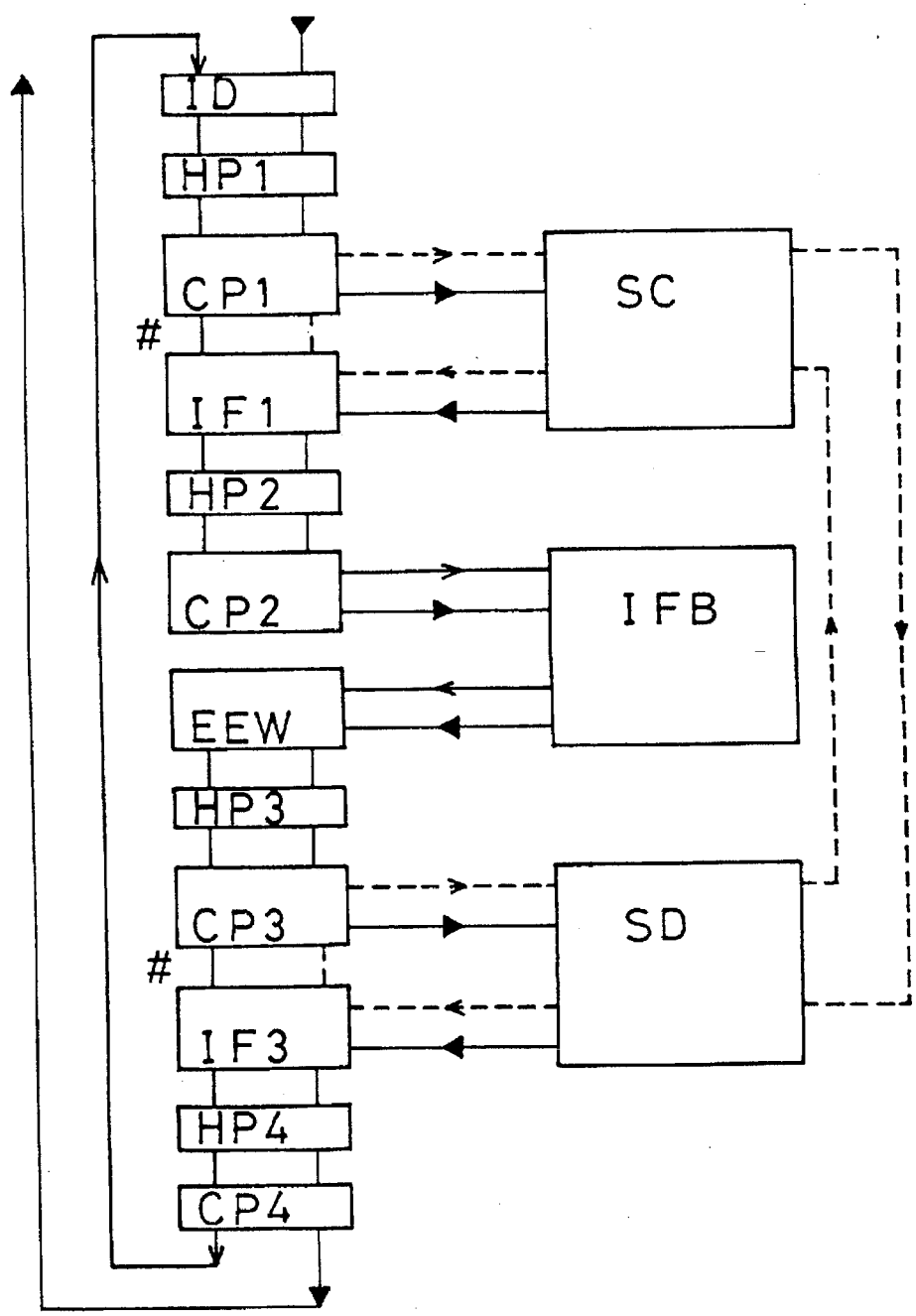
FIG. 33 shows a process flow in the apparatus of the fifth preferred embodiment.
Figure 34:
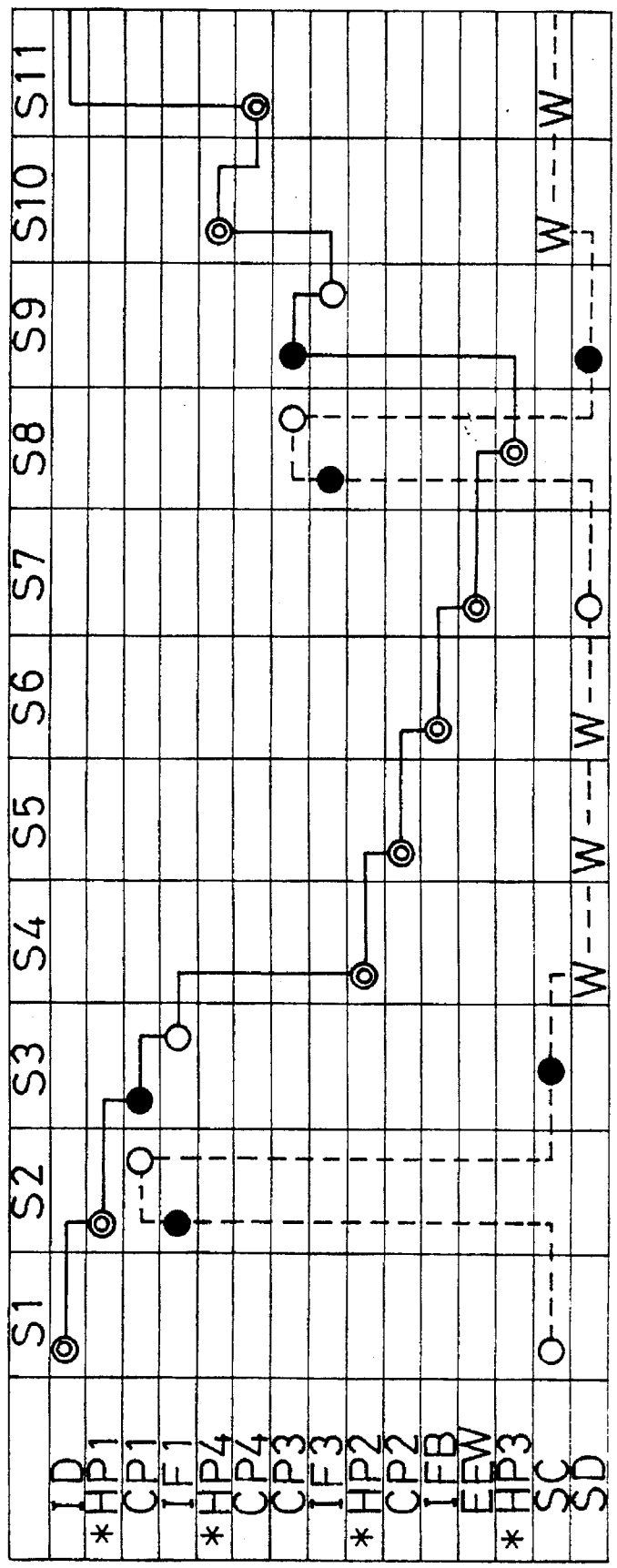
FIG. 34 is a timing view of the apparatus of the fifth preferred embodiment.

FIGS. 33 and 34 are views of a transportation process in the apparatus 500 of the fifth preferred embodiment. Since the low temperature robot TC is single-handed, at the processing part or transfer part (first position) where wafers are to be exchanged, after retrieving a first wafer from the first position and moving the wafer to the second position, a second wafer is retrieved from a third position and moved to the first position. For instance, at a wafer exchange step S1 (FIG. 34) corresponding to the spin coater SC, the low temperature robot TC retrieves a first wafer from the spin coater SC. At a second step S2, the low temperature robot TC places the first wafer onto the interface IF1 and receives a second wafer from the cool plate CP1. At a third step S3, the low temperature robot TC moves the second wafer onto the spin coater SC.

In the apparatus 500 of the fifth preferred embodiment, the cool plate CP1 and the interface IF1 are used in a concerted manner. This is also true with the cool plate CP3 and the interface IF3. That is, at the steps S2 and S8 in FIG. 34, the low temperature robot TC retrieves the second wafer from the cool plate CP1 (CP3) immediately after placing the first wafer onto the interface IF1 (IF3). Thus, the fifth preferred embodiment particularly effectively makes use of the structure that the cool plate CP1 (CP3) and the interface IF1 (IF2) are closely stacked.

The fifth preferred embodiment is not only advantageous due to the effective utilization of the stacked structure of the transfer part 140 but also due to the simple structure of the low temperature robot TC and a reduced cost. The other advantages of the apparatus 500 are otherwise the same as those of the first preferred embodiment.

8. Sixth Preferred Embodiment

Figure 35:
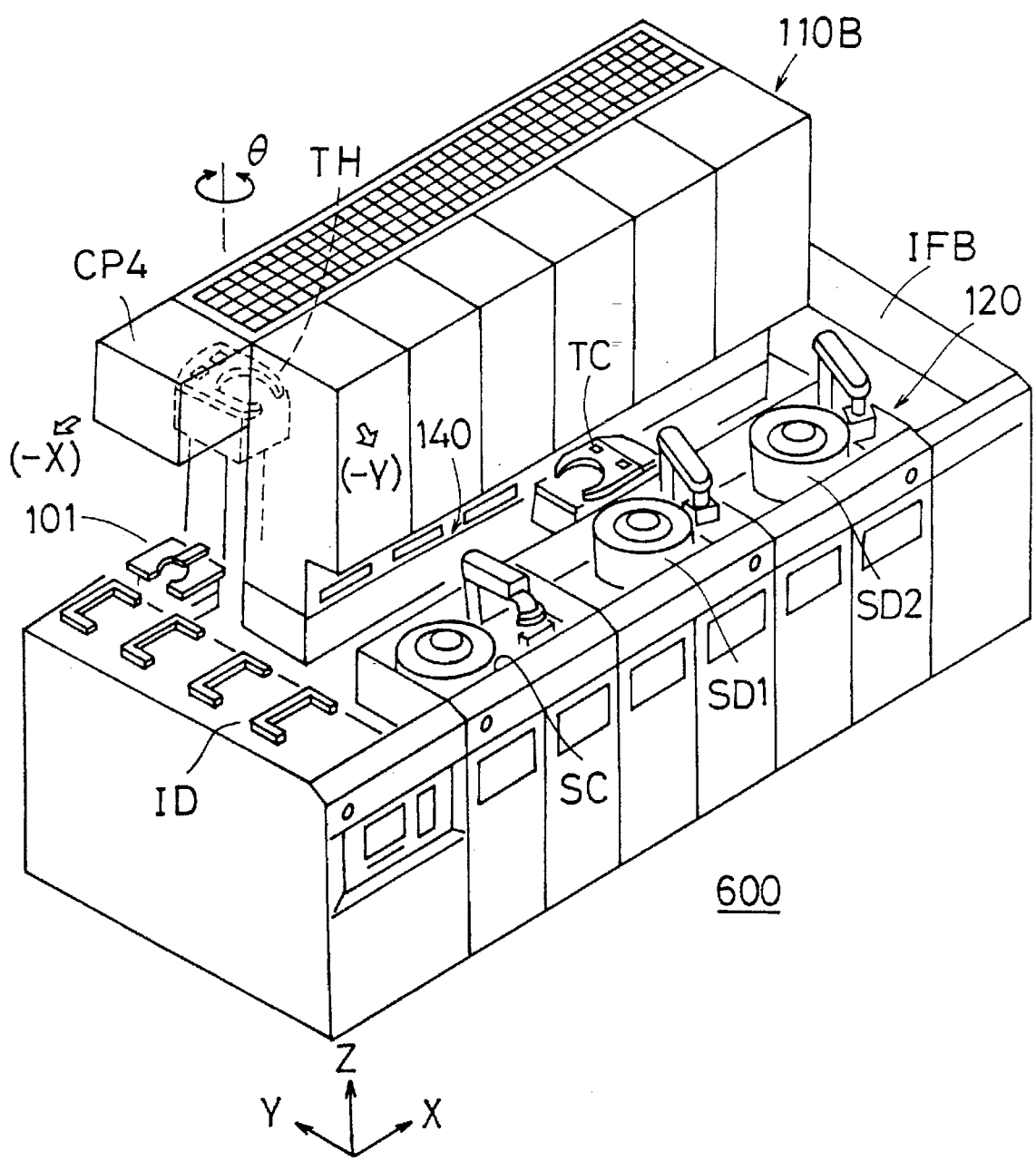
FIG. 35 is a perspective view showing an appearance of a semiconductor wafer processing apparatus according to a sixth preferred embodiment of the present invention.
Figure 36:
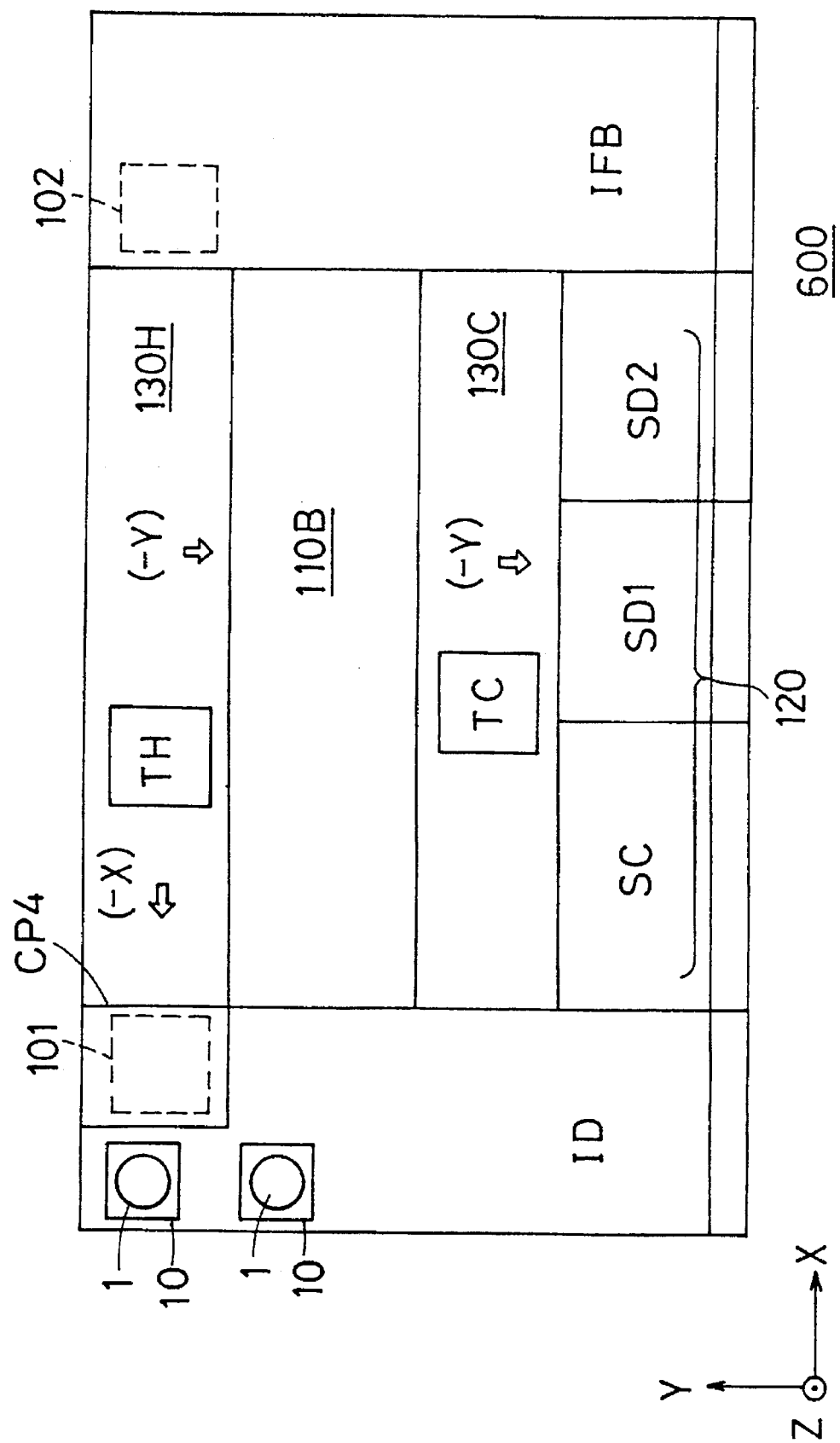
FIG. 36 is a conceptual plan view of the apparatus of the sixth preferred embodiment.

FIGS. 35 and 36 show a structure of a semiconductor wafer processing apparatus 600 according to the sixth preferred embodiment of the present invention and an arrangement of the processing parts. Although the apparatus 600 is almost the same as the apparatus 100 of the first preferred embodiment, the apparatus 600 is unique in that the high temperature robot TH has a θ-rotation freedom about a vertical axis (axis Z). Due to this unique structure, of the first processing part group 110 of the first preferred embodiment, the cool plate CP4 alone is separated from the other parts (first processing part main group 110B) and disposed above an end of the transportation path 130H of the high temperature robot TH.

That is, since the high temperature robot TH does not have a rotation freedom in the first preferred embodiment, the high temperature robot TH must move in the direction (-Y) to access the processing parts of the first processing part group 110 and the transfer part 140. However, in the sixth preferred embodiment, since the high temperature robot TH has a rotation freedom, the high temperature robot TH can access by extending its hand in the direction (-X) in FIG. 36. Utilizing this function, the high temperature robot TH extends its hand in the direction (-X) to access the cool plate CP4 which is disposed above the indexer ID. When the first processing part group 110A of the third preferred embodiment (FIG. 25) is adopted rather than the first processing part group 110 of the first preferred embodiment, the cool plate CP2 of the first processing part group 110A may be disposed above the interface IFB of FIG. 36 (i.e., above a robot 102) in the same manner in which the cool plate CP4 is disposed.

Control of transportation in the apparatus 600 of the sixth preferred embodiment is similar to the control performed in the apparatus 100 except for that the high temperature robot TH rotates to access the cool plate CP2.

Since the high temperature robot TH has a rotation freedom, the sixth preferred embodiment realizes a better freedom of arranging the processing parts in the first processing part group and transfer part. The other advantages of the apparatus 600 are otherwise the same as those of the first preferred embodiment.

9. Seventh Preferred Embodiment

Figure 37:
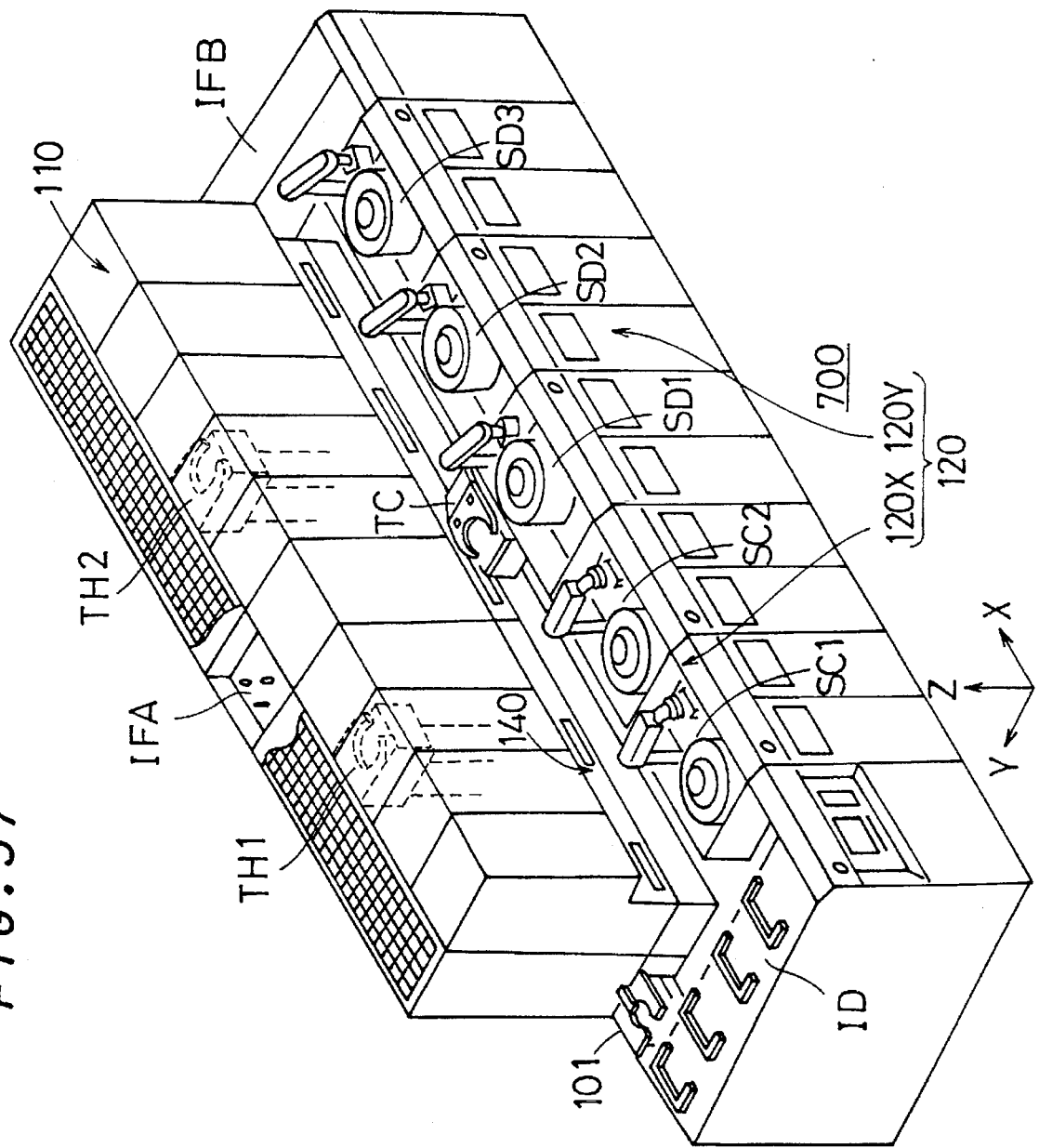
FIG. 37 is a partially cutaway perspective view showing an appearance of a semiconductor wafer processing apparatus according to a seventh preferred embodiment of the present invention.
Figure 38:
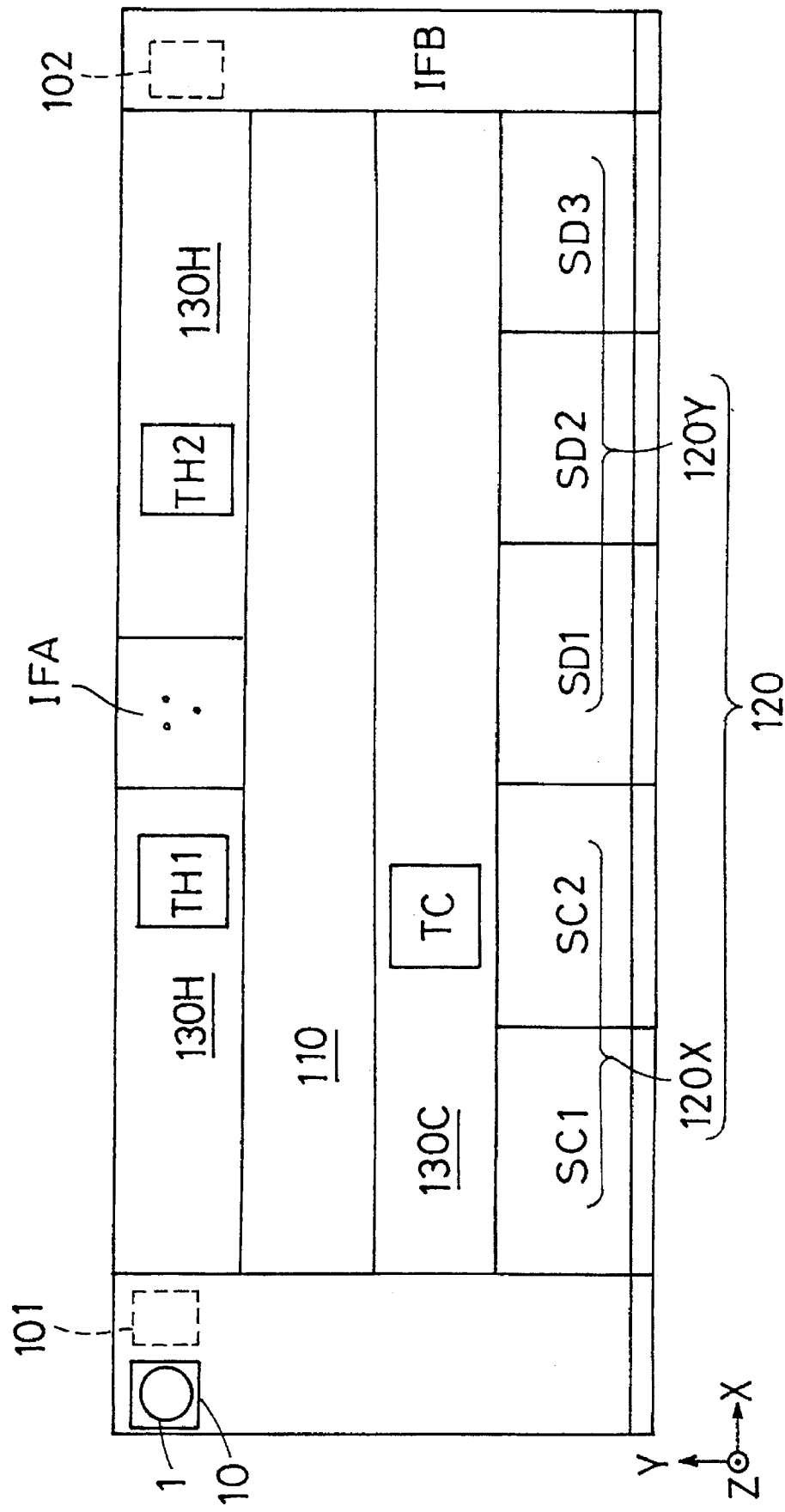
FIG. 38 is a conceptual plan view of the apparatus of the seventh preferred embodiment.
Figure 39:
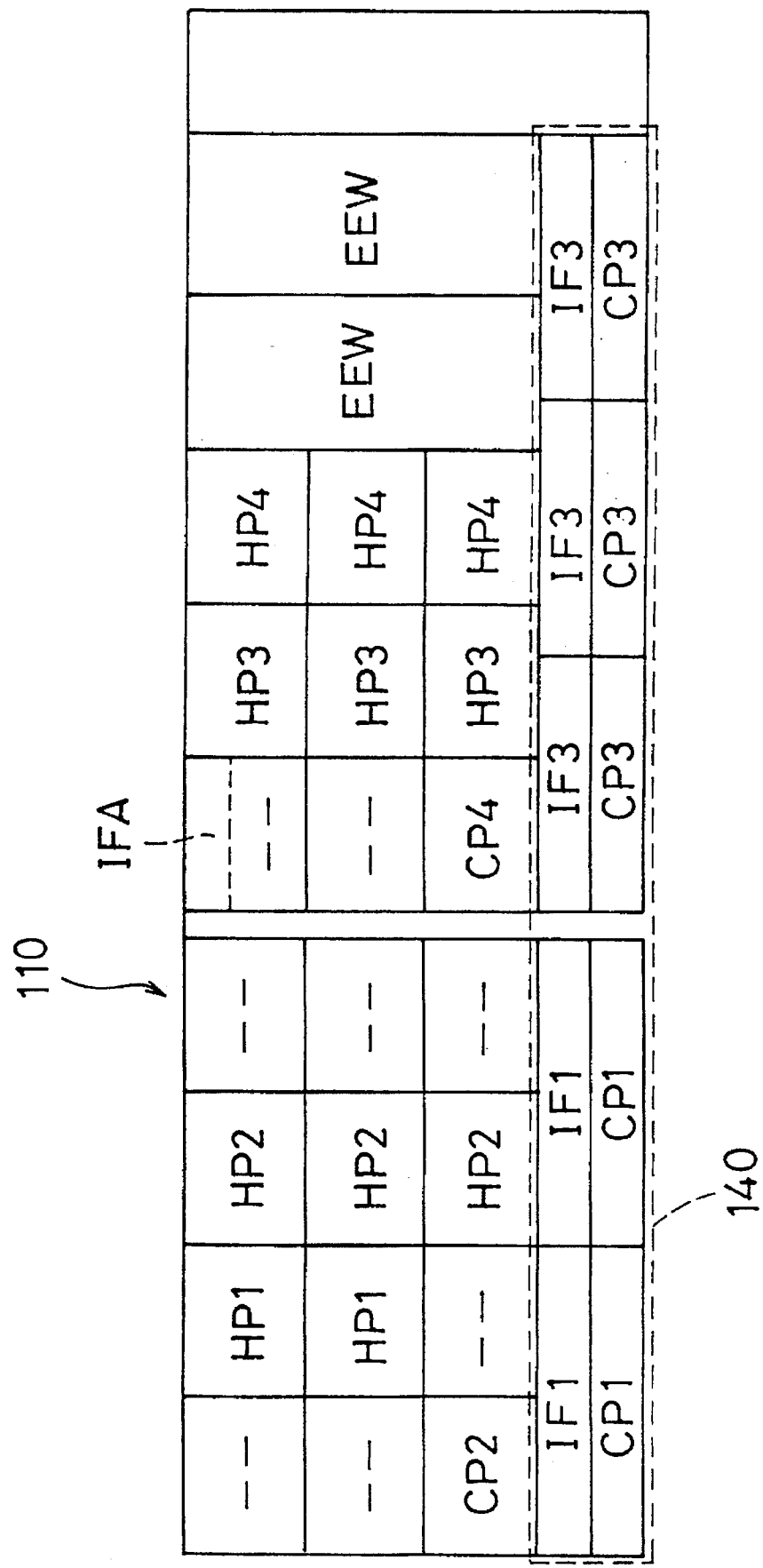
FIG. 39 is a conceptual front view of a first processing part group of the apparatus of the seventh preferred embodiment.

FIGS. 37 to 39 show a structure of a semiconductor wafer processing apparatus 700 according to the seventh preferred embodiment of the present invention. In the apparatus 700, the second processing part group 120 includes a coater group 120X formed by spin coaters SC1 and SC2 and a developer group 120Y formed by the spin developers SD1, SD2 and SD3.

The low temperature robot TC is able to translate in the direction X and in the opposite direction. Further, the low temperature robot TC is double-handed and has a rotation freedom about a vertical axis (axis Z). The low temperature robot TC can access the transfer part 140, the coater group 120X and the developer group 120Y. The apparatus 700 uses two high temperature robots TH1 and TH2 each able to translate in the direction X and in the opposite direction. The robots TH1 and TH2 are each double-handed and have a rotation freedom about a vertical axis (axis Z).

In the first processing part group 110 at a position which approximately corresponds to the spin developer SD1, the cool plate CP3 and the interface IF3 are stacked close to each other in the bottom row of the first processing part group 110. The cool plate CP4 is disposed on the cool plate CP3 and the interface IF3. Over the cool plate CP4 is an empty space with no processing part disposed. The transportation path 130 H for the high temperature robots TH1 and TH2 is formed on the innermost side of the first processing part group 110 as viewed from the spin developer SD1. An internal interface IFA which serves as a transfer part is disposed in a space in the top empty row on the innermost side. The internal interface IFA includes three pins in a space which is open to the directions X and -X. In combination with the rotation freedom of the high temperature robots TH1 and TH2, the internal interface IFA makes it possible to transfer a wafer between the high temperature robots TH1 and TH2.

Figure 40:
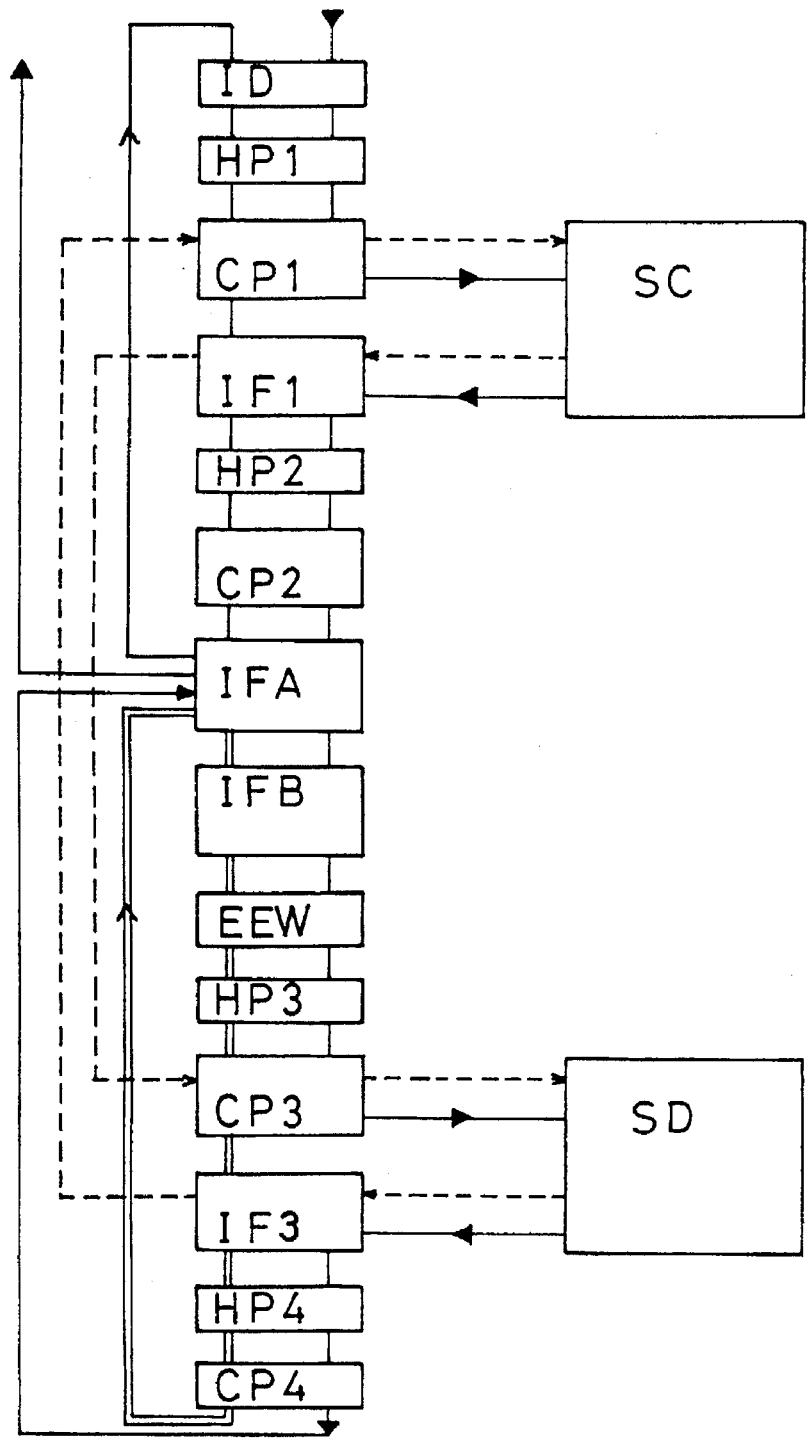
FIG. 40 shows a process flow in the apparatus of the seventh preferred embodiment.
Figure 41:
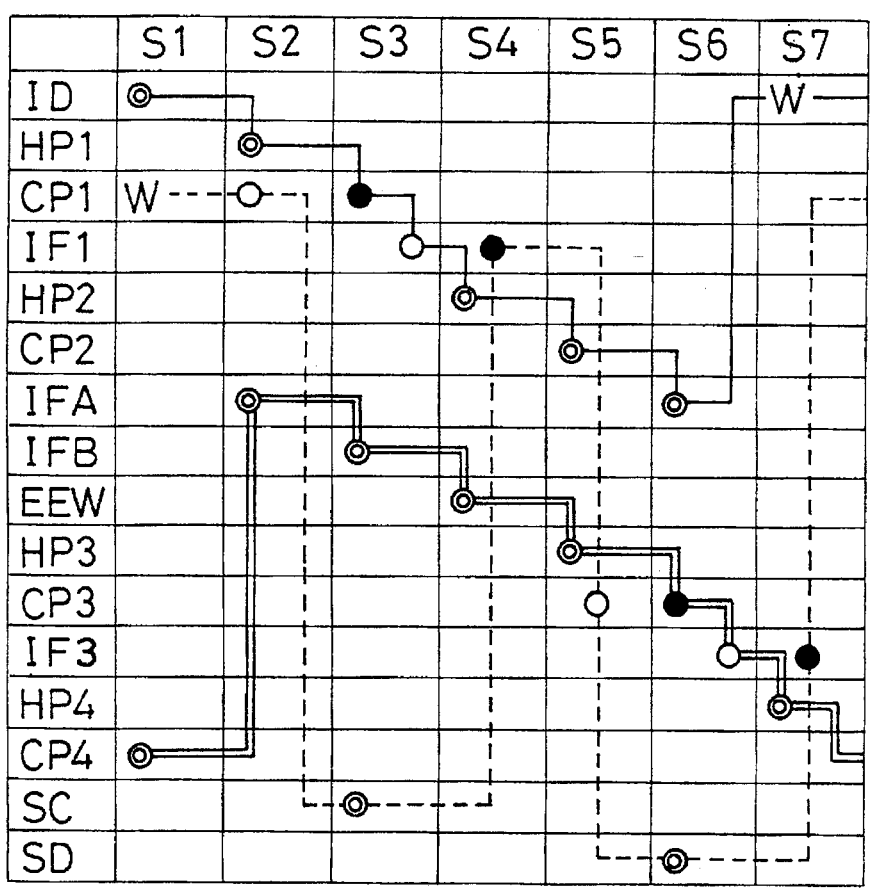
FIG. 41 is a timing view of the apparatus of the seventh preferred embodiment.

FIGS. 40 and 41 are views of a transportation process in the apparatus 700 of the seventh preferred embodiment. Since the two high temperature robots TH1 and TH2 are used, one of the robots access some of the hot plates HP1 to HP4 while the other robot access the remaining hot plates. The low temperature robot TC accesses only the non-thermal processing parts. In the seventh preferred embodiment, the internal interface IFA is disposed in the transportation path 130H along which the high temperature robots TH1 and TH2 travel. As shown in FIG. 39, of the first processing part group 110, those to be accessed by the high temperature robot TH1 are located on the left side of the internal interface IFA and those to be accessed by the high temperature robot TH2 are located below and on the right side of the internal interface IFA. Hence, in the seventh preferred embodiment, there is no possibility that the robots TH1 and TH2 will collide each other along the same transportation path 130H as far as the robots TH1 and TH2 travel in accordance with the transportation process even though the apparatus does not perform any special control to prevent such collision. The transportation cycle is safely reduced in this manner. Further, since the internal interface IFA is disposed in the transportation path 130H at a position which does not interfere accessing of the high temperature robots TH1 and TH2, no mechanism for transfer is needed, which prevents an increase in the size and the floor area of the apparatus. The seventh preferred embodiment uses two spin coaters and three spin developers. The spin coaters and the spin developers can be reduced or increased in number in accordance with the required process treatments without deteriorating the effect by disposing the internal interface IFA.

10. Eighth Preferred Embodiment

Figure 42:
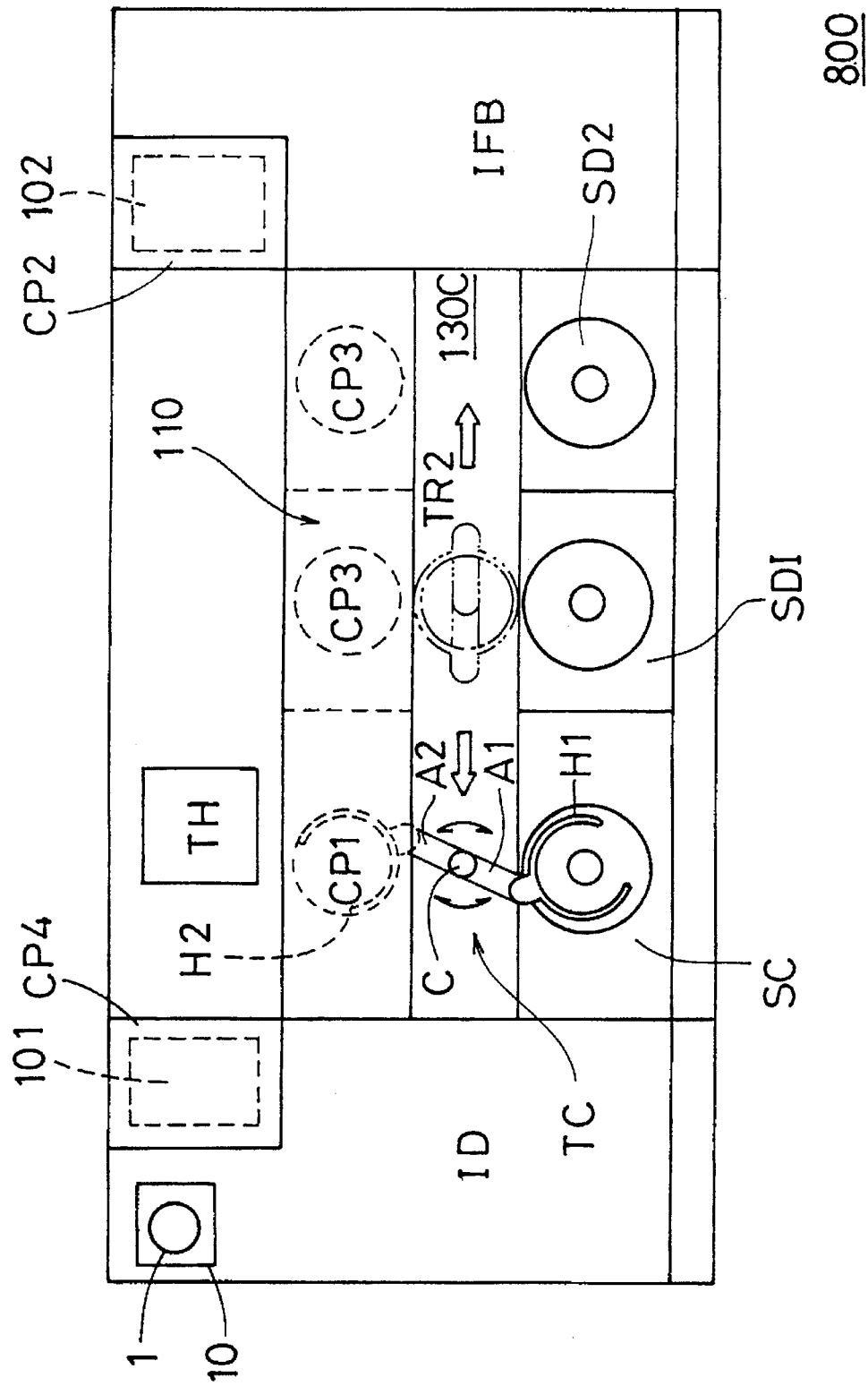
FIG. 42 is a conceptual front view of a semiconductor wafer processing apparatus according to an eighth preferred embodiment of the present invention.

FIG. 42 shows a structure of a semiconductor wafer processing apparatus 800 according to the eighth preferred embodiment of the present invention. In the apparatus 800, the low temperature robot TC is able to translate in the direction X and in the opposite direction, and has concurrently exchangeable hands. The concurrently exchangeable hands are formed by attaching two extensible multi-joint arms (hereinafter simply "arms") A1 and A2 at slightly different heights to the center C of the low temperature robot TC and by attaching a first holder part H1 and a second holder part H2 at ends of the respective arms A1 and A2. On a horizontal plane, the arms A1 and A2 extend and retract together at the same time when driven by a common driving force supply motor (not shown) which is disposed within the low temperature robot TC. When the arms A1 and A2 move in a vertical direction, a wafer is transferred between mutually facing processing parts. The first holder part H1 and the second holder part H2 are each shaped as an arc which is partially cut to hold a semiconductor wafer at an end.

The low temperature robot TC moves to the front side of the spin coater SC and the spin developers SD1 and SD2. When moved to the spin coater SC, the low temperature robot TC transfers a wafer from the cool plate CP to the spin coater SC and transfers a wafer which used to be on the spin coater SC to the interface IF1. More precisely, when the low temperature robot TC moves, the arms A1 and A2 are retracted along the transportation path 130C as shown by the double-dot line in FIG. 42 while the first and the second holder parts H1 and H2 are on the side of the center C. Stopping in front of the spin coater SC, the low temperature robot TC extends the arms A1 and A2 and moves the first and the second holder parts H1 and H2 forward.

Following this, the low temperature robot TC:
(1) holds a wafer which is placed on the cool plate CP1 with the second holder portion H2 and holds a wafer which used be on the spin coater SC with the first holder portion H1;
(2) retracts the arms A1 and A2, moves the arms A1 and A2 a little at the center C upwardly and extends the arms A1 and A2 in the opposite direction; and
(3) places the wafer held by the second holder portion H2 onto the spin coater SC and the wafer held by the first holder portion H1 onto the interface IF. Although the first processing part group 110 is as the same as that of the third preferred embodiment (FIG. 25), the high temperature robot TH has a rotation freedom about a vertical axis (axis Z) as in the sixth preferred embodiment. Since the high temperature robot TH has a rotation freedom, the cool plates CP2 and CP4 are disposed above the robots 102 and 101, respectively.

Figure 43:
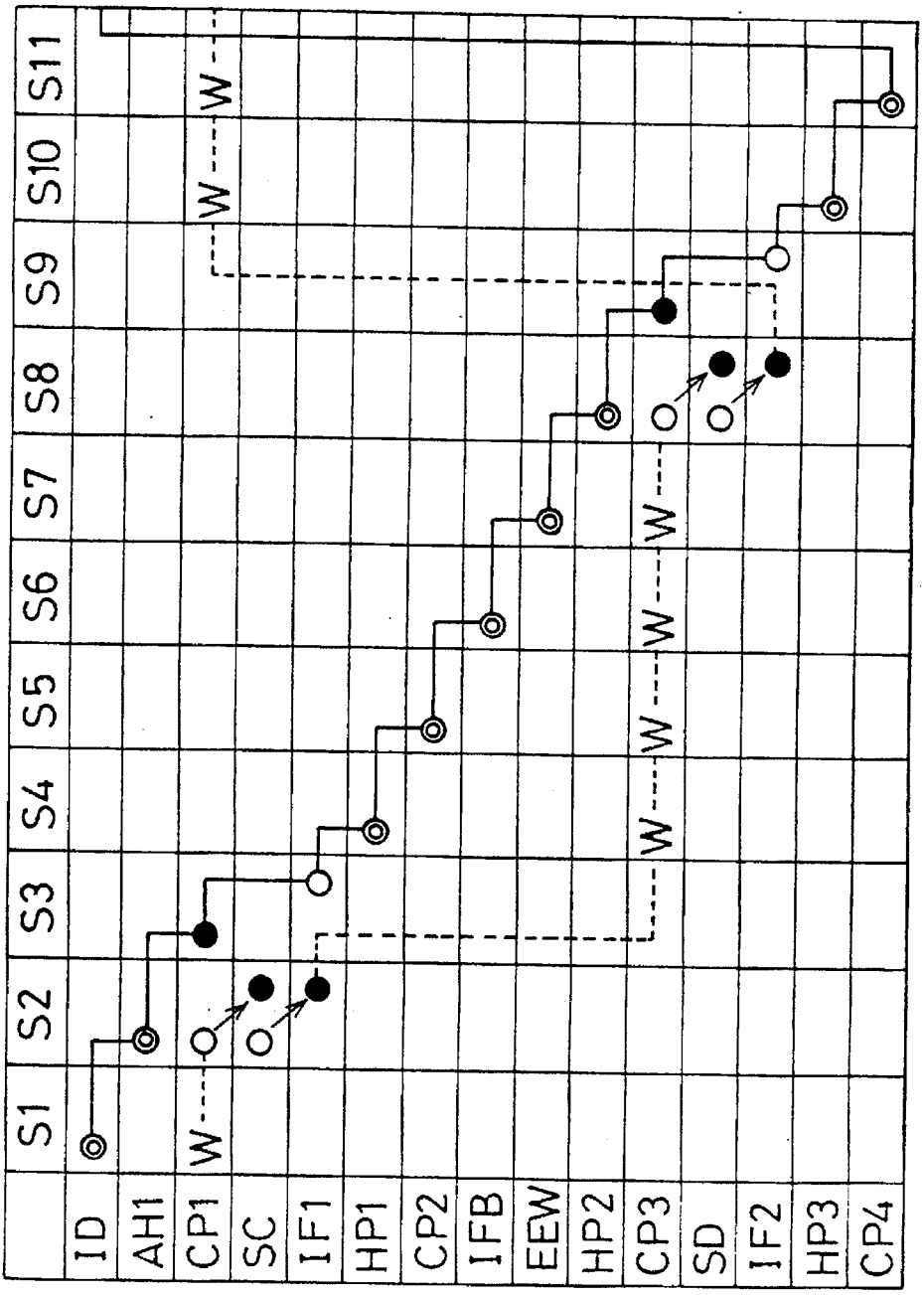
FIG. 43 shows a process flow in the apparatus of the eighth preferred embodiment.

FIG. 43 is a view of a transportation process in the apparatus 800 of the eighth preferred embodiment. The high temperature robot TH accesses the hot plates HP1 to HP4 while the low temperature robot TC accesses only the non-thermal processing parts. The low temperature robot TC transports a wafer used be on the spin coater SC to the interface IF1 and transports a wafer used be on the cool plate CP1 to the spin coater SC at the same step (S2). At the same step (S8), the low temperature robot TC transports a wafer used be on the spin coater SC to the interface IF2 and transports a wafer used be on the cool plate CP3 to the spin coater SC.

Although the eighth preferred embodiment requires the low temperature robot TC to move along the transportation path 130C, three low temperature robots each having concurrently exchangeable arms may be fixed as in the third preferred embodiment. A structure and transportation process are easily modified from those described above, and therefore, a detailed description will not be given. The concurrently exchangeable arms are not limited to the extensible multi-joint arms as above. For instance, the concurrently exchangeable arms may be two simple arms which extend from the center C in two opposite directions and which rotate in a horizontal plane. In this case, however, a space needed for the arms to rotate.

Figure 44:
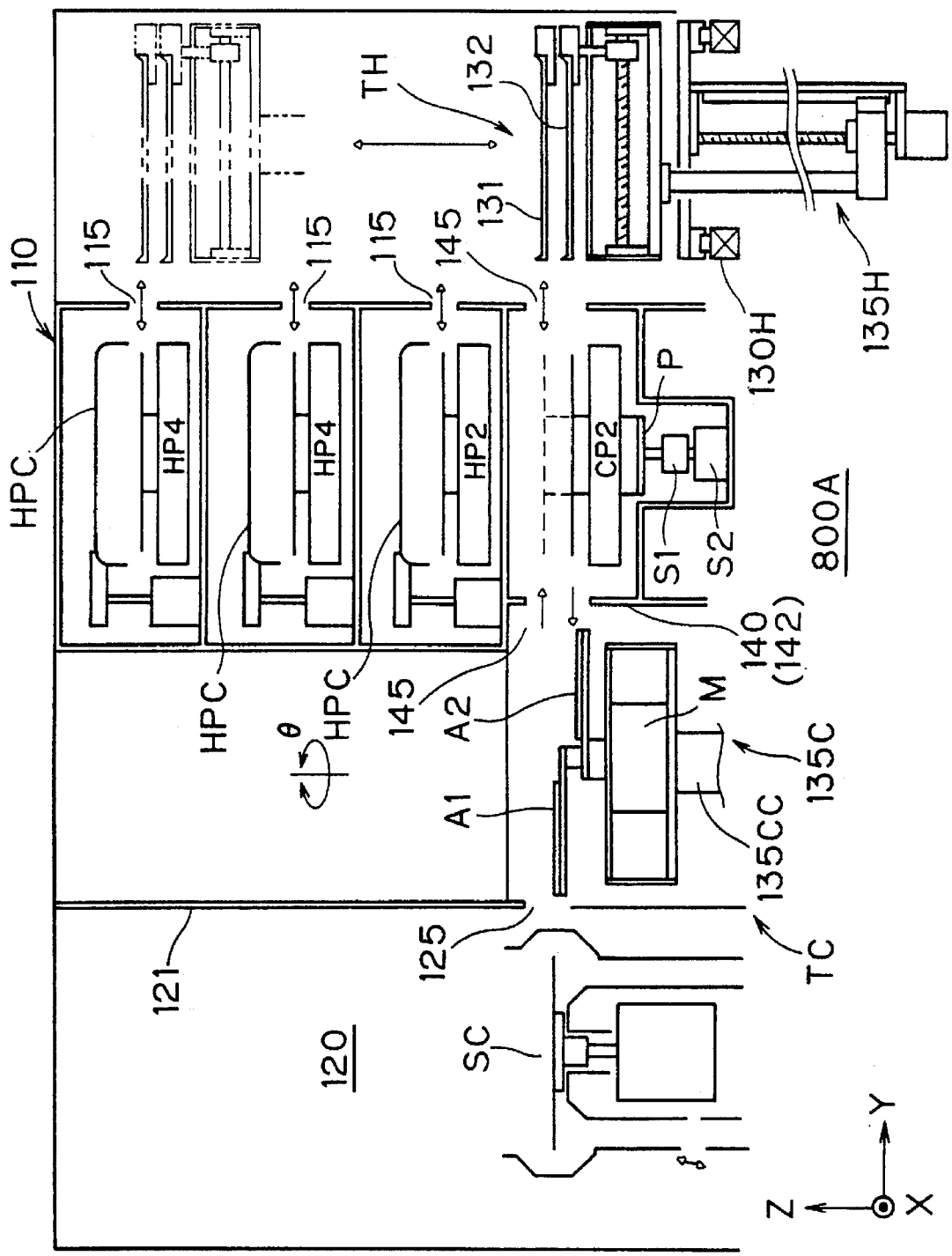
FIG. 44 is a cross sectional view of the apparatus of the eighth preferred embodiment as it is modified.

FIG. 44 shows a modified structure of the semiconductor wafer processing apparatus 800. In the illustrated semiconductor wafer processing apparatus 800A, the pin of the cool plate CP2 is disposed in a support plate P to extend in a vertical direction (direction Z). The position of the cool plate CP2 in the vertical direction is determined by two air cylinders S1 and S2 which are linked in series to the support plate P. That is, by combining extension and retraction of the air cylinders S1 and S2, the tip portion of the pin is adjusted at (i) the bottom most position, (ii) an intermediate position and (iii) the top most position.

(i) the bottom most position: Cylinder S1 (retract) & Cylinder S2 (retract)

(ii) an intermediate position: Cylinder S1 (extend) & Cylinder S2 (retract)

(iii) the top most position: Cylinder S1 (extend) & Cylinder S2 (extend) The "bottom most position" is below than the top plate surface of the cool plate CP2. During cooling of a substrate, the tip portion of the pin is maintained at this position. The "intermediate position" is above the top plate surface of the cool plate CP2 as shown by the solid line in FIG. 44. At this position, a semiconductor wafer already cooled by the cool plate CP2 is transferred to the low temperature robot TC. As shown by the dotted line in FIG. 44, the "top most position" is above the "intermediate position." A semiconductor wafer already coated with a resist by the spin coater SC is retrieved from the low temperature robot TC and transferred to the high temperature robot TH at the "top most position." In other words, the cool plate CP2 also functions as the interface part IF2 by adjusting the tip portion of the pin at the top most position. Hence, the illustrated apparatus does not need an exclusive structure for the interface part IF2, and therefore, is small.

Since the apparatus is otherwise the same as that of the eighth preferred embodiment, a redundant description is simply omitted.

Figure 45:
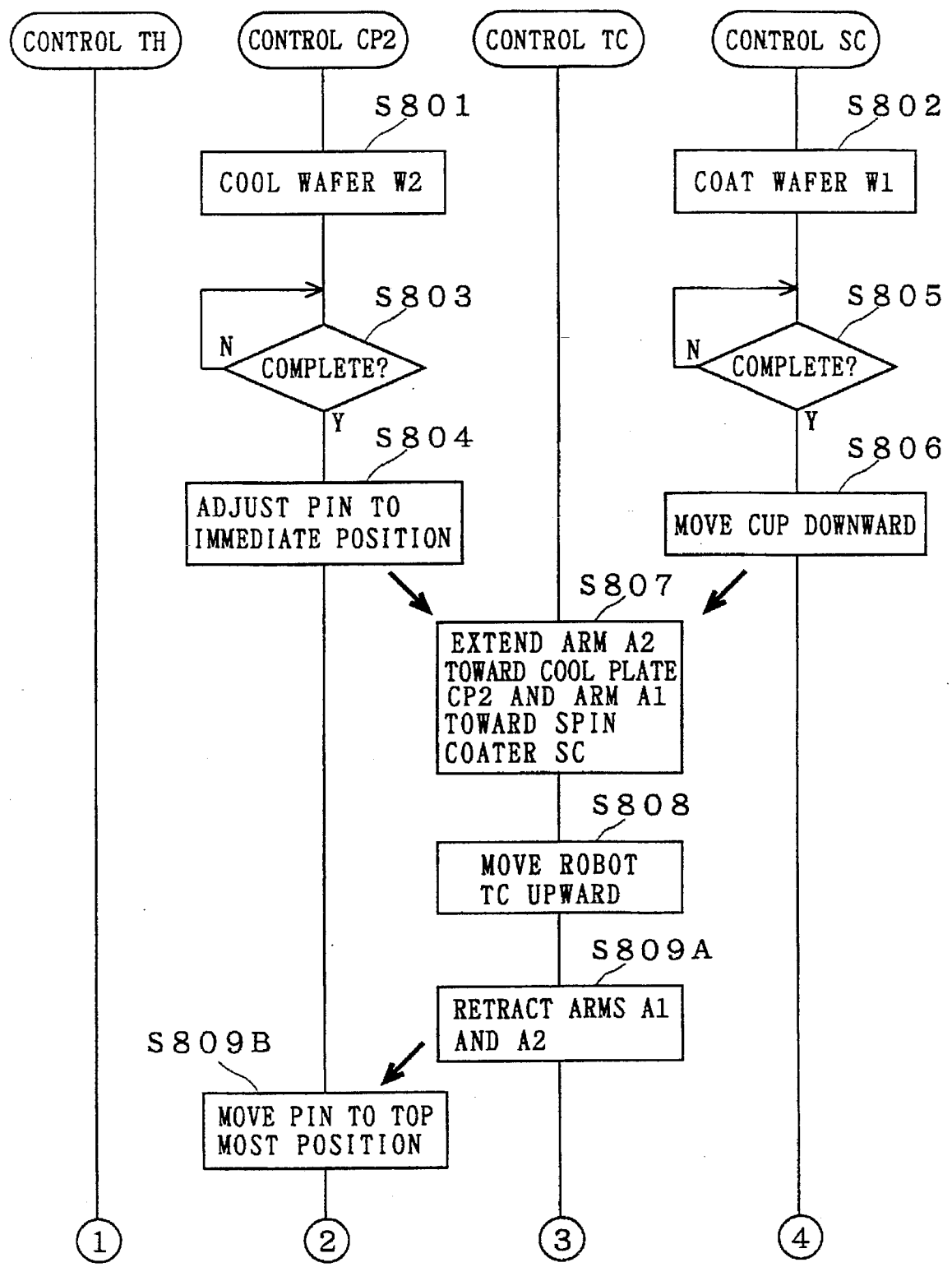
FIGS. 45 and 46 are flow charts showing a transportation order for transporting a semiconductor wafer to a spin coater and an associated cool plate in the apparatus of FIG. 44.
Figure 46:
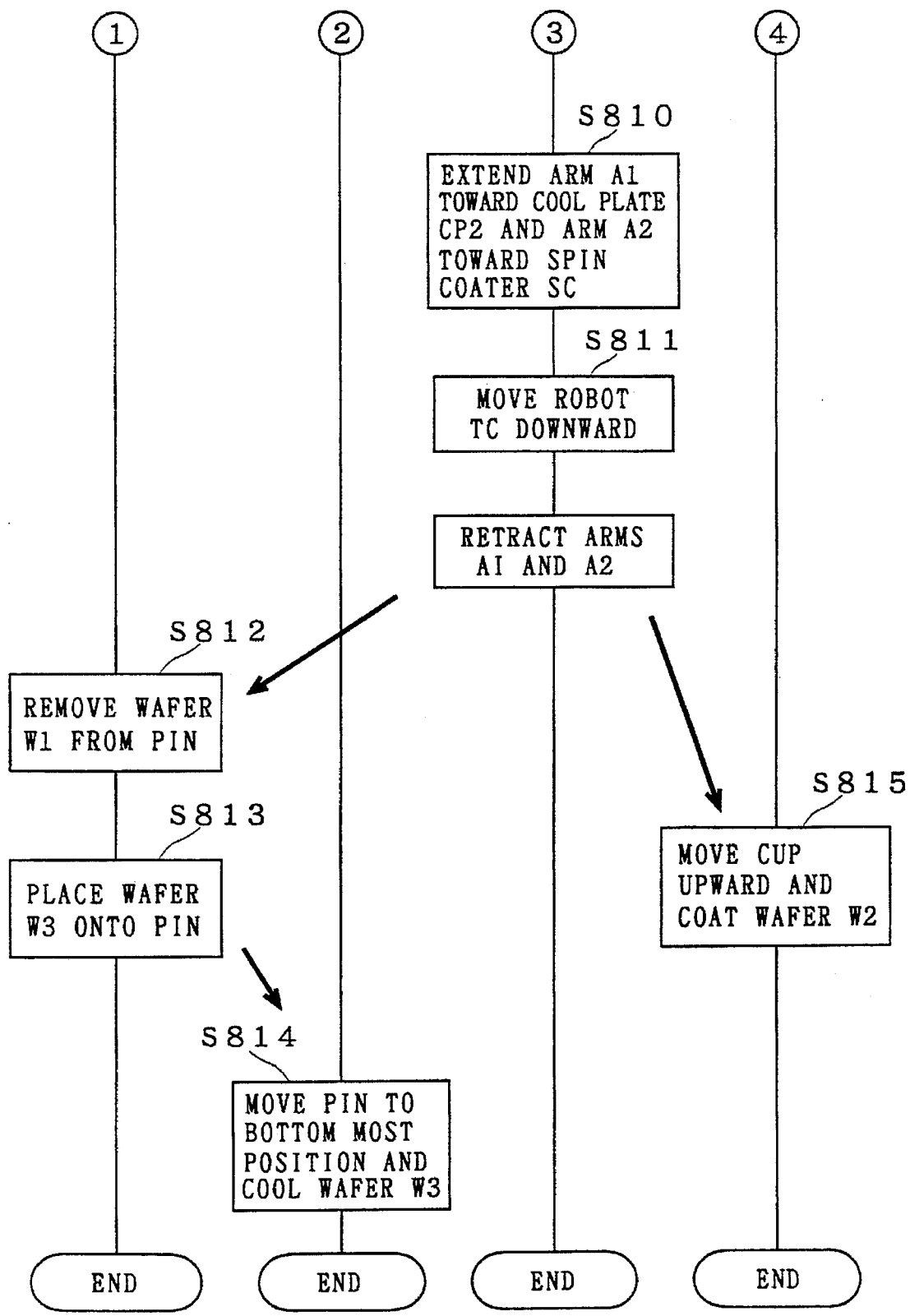

Now, a description will be given on a transportation sequence of a semiconductor wafer at the spin coater SC and the cool plate CP2 which is structured as above. FIGS. 45 and 46 are to be referred to.

It is assumed that cooling of a semiconductor wafer W2 at the cool plate CP2 (step S801) is performed parallel to coating of a semiconductor wafer W1 with a resist liquid at the spin coater SC (step S802).

If it is judged at a step S803 that the cooling is complete, the pin of the cool plate CP2 is moved upward and the tip portion of the pin is adjusted to the immediate position (step S804). If it is judged at a step S805 that the coating is complete, a cup of the spin coater SC is moved downward (step S806).

At a step S807, the arms A1 and A2 of the low temperature robot TC extend toward the spin coater SC and the cool plate CP2, respectively, below the semiconductor wafers W2 and W1. Following this, at a step S808, the low temperature robot TC moves upward to receive the semiconductor wafers W2 and W1 with its arms A1 and A2, respectively. The arms A1 and A2 retract at a step S809A, and then the pin of the cool plate CP2 is moved upward to the top most position.

Next, the arms A1 and A2 extend toward the cool plate CP2 and the spin coater SC, respectively (step S810). In the illustrated modification, the pin and the spin coater SC are arranged so that the arm A1 is above the tip portion of the pin which is adjusted to top most position and the arm A2 is above a chuck of the spin coater SC as shown in FIG. 44. In such an arrangement, it is possible to minimize the number and the distance of moving upward and downward of the low temperature robot TC for transporting the semiconductor wafers W1 and W2 to the cool plate CP2 and the spin coater SC. At a step S811, the low temperature robot TC moves downward to place the semiconductor wafers W1 and W2 onto the pin of the cool plate CP2 which is located on the top most position and the chuck of the spin coater SC.

The pin of the cool plate CP2 is adjusted to top most position as described above, and the semiconductor wafer W2 already coated is placed on the tip portion of the pin. Steps S812 and S813 are performed here so that the high temperature robot TH exchanges semiconductor wafers. That is, after the high temperature robot TH removes the semiconductor wafer W1 from the pin (step S812), the high temperature robot TH places a semiconductor wafer W3 onto the pin (step S813). Thus, in this modification, the cool plate CP2 also functions as an interface part when the tip portion of the pin is adjusted at the top most position. Upon placing the semiconductor wafer W3, the pin moves down to the bottom most position so that the semiconductor wafer W3 is placed onto the plate and cooled (step S814). On the other hand, at the spin coater SC, the semiconductor wafer W2 placed on the chuck is coated (step S815).

In this modification, the treatments as above are successively performed to serially process a plurality of semiconductor wafers.

The arrangement of the pin of the cool plate CP2 and spin coater SC is not limited to as described above. By disposing the pin and the spin coater SC in a suitable arrangement, the low temperature robot TC can move upward a little during the performing of the steps S809A and S810. This allows a reduction in size of the apparatus.

Although the spin coater SC and the cool plate CP2 are where the structure is modified in the modification above, the spin developer and the associated cool plate CP may be modified in a similar manner.

11. Ninth Preferred Embodiment

Figure 47:
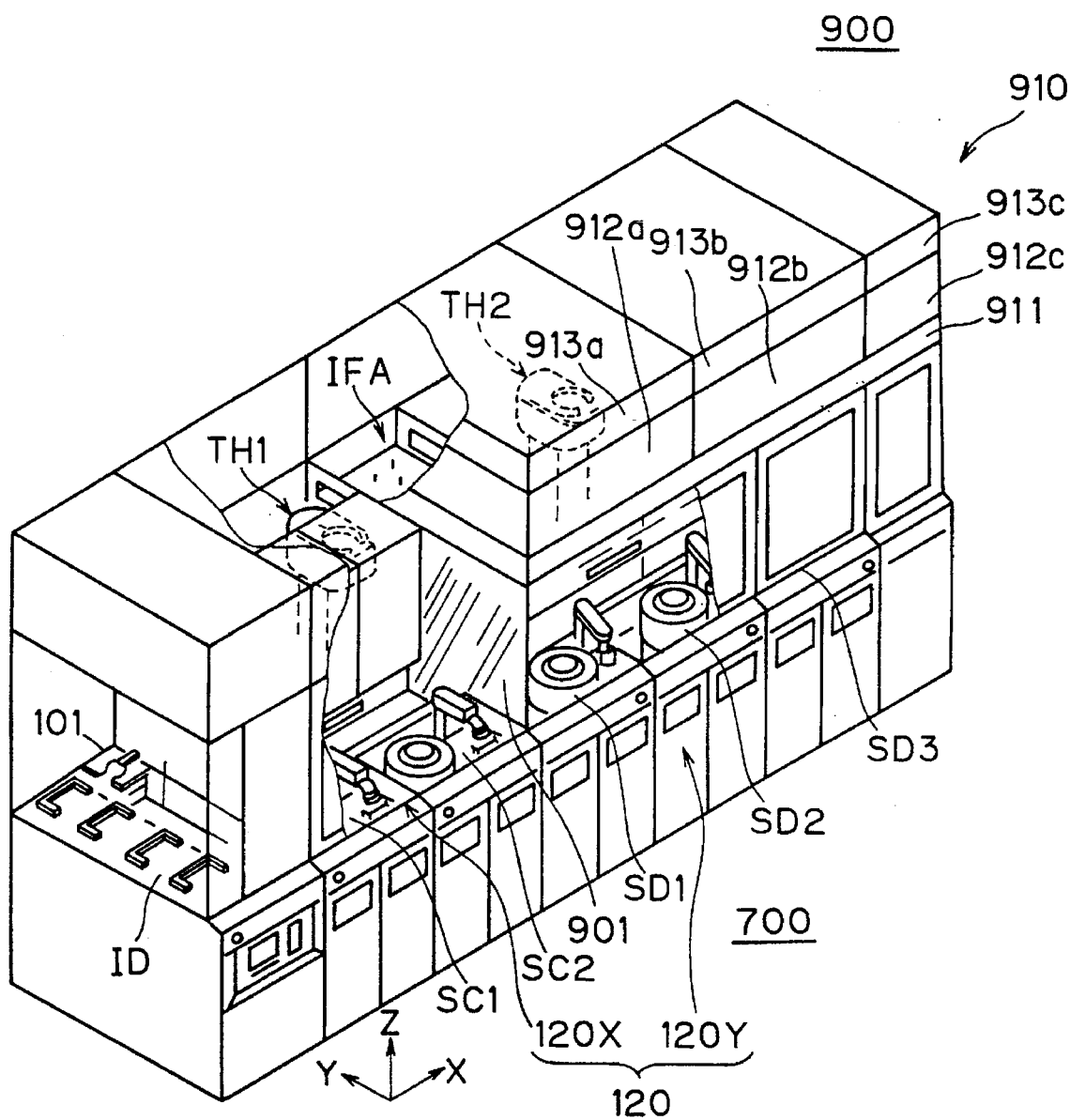
FIG. 47 is a perspective view showing an appearance of a semiconductor wafer processing apparatus according to a ninth preferred embodiment of the present invention.
Figure 48:
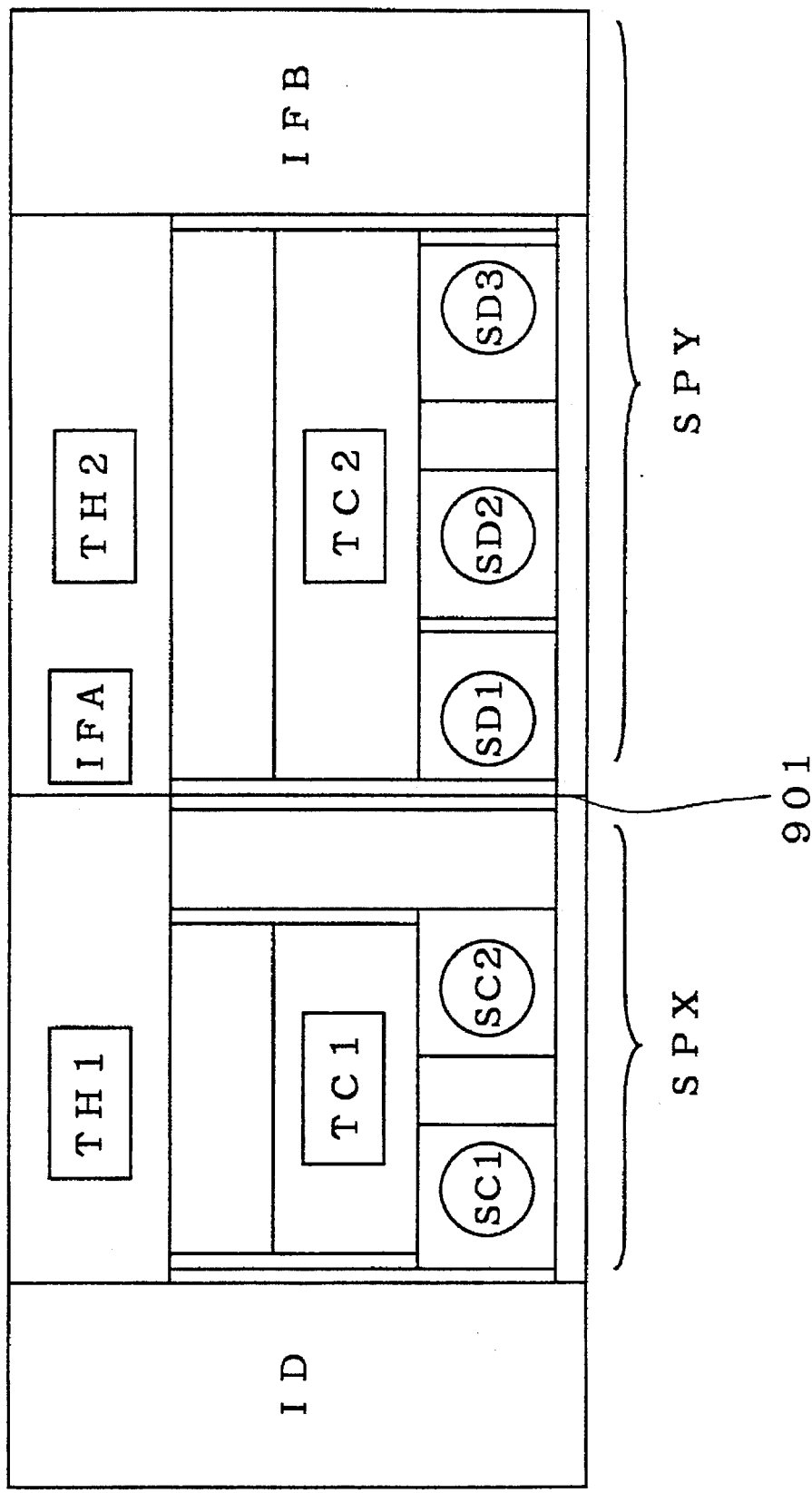
FIG. 48 is a conceptual plan view of the apparatus of the ninth preferred embodiment.

FIG. 47 is a perspective view showing an appearance of a semiconductor wafer processing apparatus 900 according to the ninth preferred embodiment of the present invention. FIG. 48 is a conceptual plan view showing an arrangement of the apparatus 900. The apparatus 900 is the same as the apparatus 800 of the eighth preferred embodiment except for the following points.

(1) In the ninth preferred embodiment, a partition wall 901 is disposed between the spin coater SC2 and the spin developer SD1 to separate the coater group 120X and the developer group 120Y in space. As shown in FIG. 49, the processing parts which correspond to the spin coaters SC1 and SC2, i.e., the cool plates CP1 and CP2, the interface IF1 and the hot plates HP1 and HP2, are disposed in a space SPX on the coater group side (left-hand side in FIG. 49). On the other hand, the processing parts which correspond to the spin developers SD1, SD2 and SD3, i.e., the cool plates CP3 and CP3, the interface IF3, the hot plates HP3 and HP4 and the edge exposure parts EEW1 and EEW2, are disposed in a space SPY on the developer group side (right-hand side in FIG. 49).

(2) The coater group 120X and the developer group 120Y include the low temperature robots TC1 and TC2, respectively, as in the eighth preferred embodiment. Hence, the low temperature robot TC1 and the high temperature robot TH1 cooperate each other to transport a semiconductor wafer in the space SPX on the coater group side, while the low temperature robot TC2 and the high temperature robot TH2 cooperate each other to transport a semiconductor wafer in the space SPY on the developer group side.

(3) Shutters (not shown) are disposed on the coater group side and the developer group side of the internal interface IFA. Only where the high temperature robots TH1 and TH2 access the internal interface IFA, the associated shutters open. The shutters are both closed at other occasions. Hence, the two shutters never open at the same time. This completely separates the two spaces on the both sides of the partition wall 901, thereby preventing an air from flowing from the coater group side into the developer group side.

Figure 50:
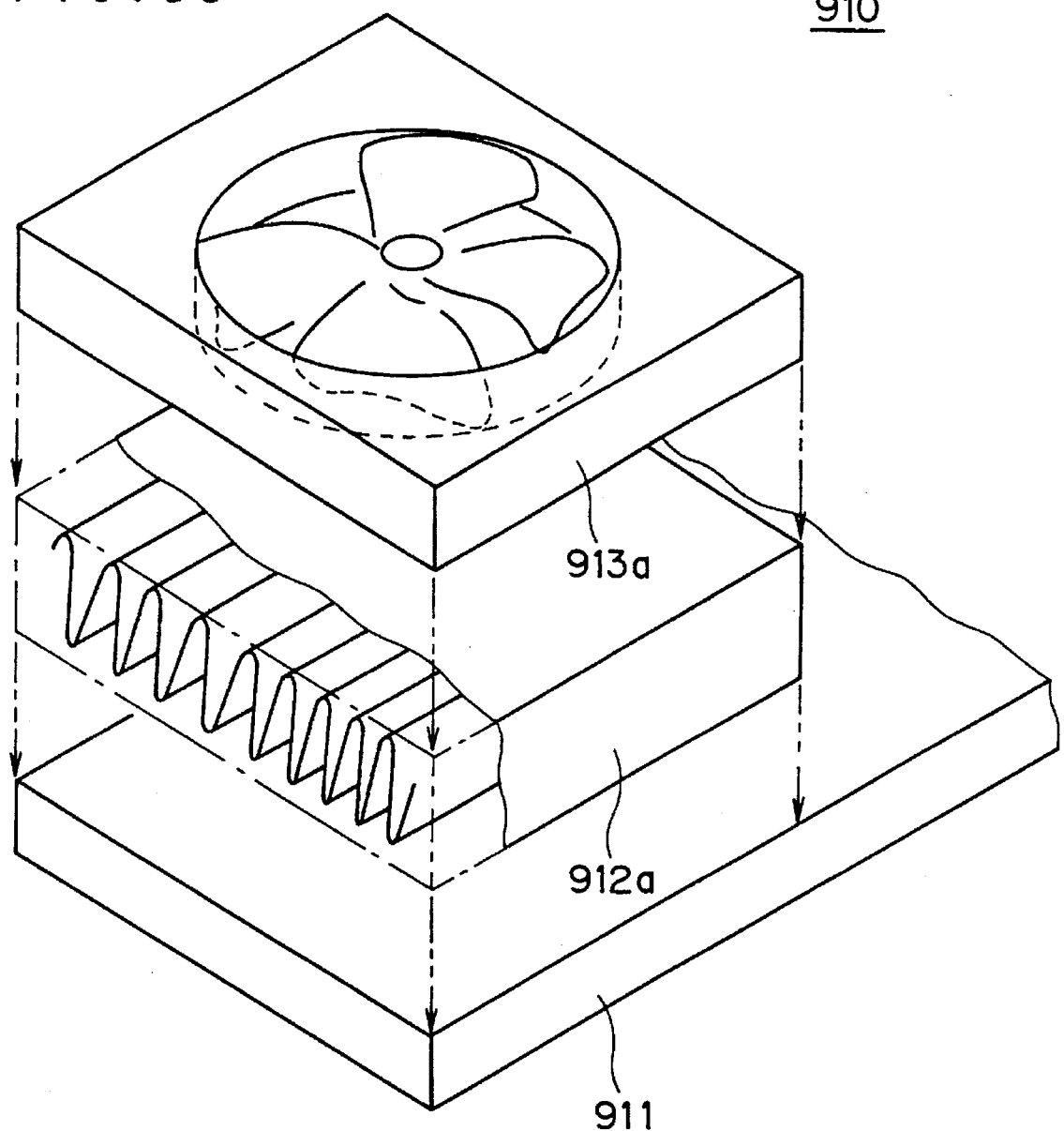
FIG. 50 is a partial perspective view of a filter system of the apparatus of the ninth preferred embodiment.

(4) In the ninth preferred embodiment, a filter system 910 is disposed above the developer group side as shown in FIG. 47. The filter system 910 includes a filter 911 for removing particles, chemical filters 912a, 912b and 912c for removing a solution and alkaline acid and fans 913a, 913b and 913c. In FIG. 50, the chemical filter 912a and the fan 913a are stacked over the filter 911. The fan 913a sends air toward the chemical filter 912a. Through the filters 912a and 911, an alkaline substance and the like are removed from air, and the filtered air is sent as a down flow into the space SPY on the developer group side. Adjacent to the chemical filter 912a and the fan 913a, the remaining chemical filters 912b and 912c and the remaining fans 913b and 913c are disposed on the filter 911 to send the down flow into the space SPY on the developer group side. Hence, the space SPY on the developer group side includes only alkaline-free air. Further, since this space SPY is completely separated from the space SPX on the coater group side to prevent an alkaline substance existing on the coater group side from flowing into the space SPY, in space SPY, it is always possible to develop a wafer in an alkaline-free environment. For this reason, a chemical amplified type resist sensitive to alkaline substance which exist in the air is processed excellently.

Figure 51:
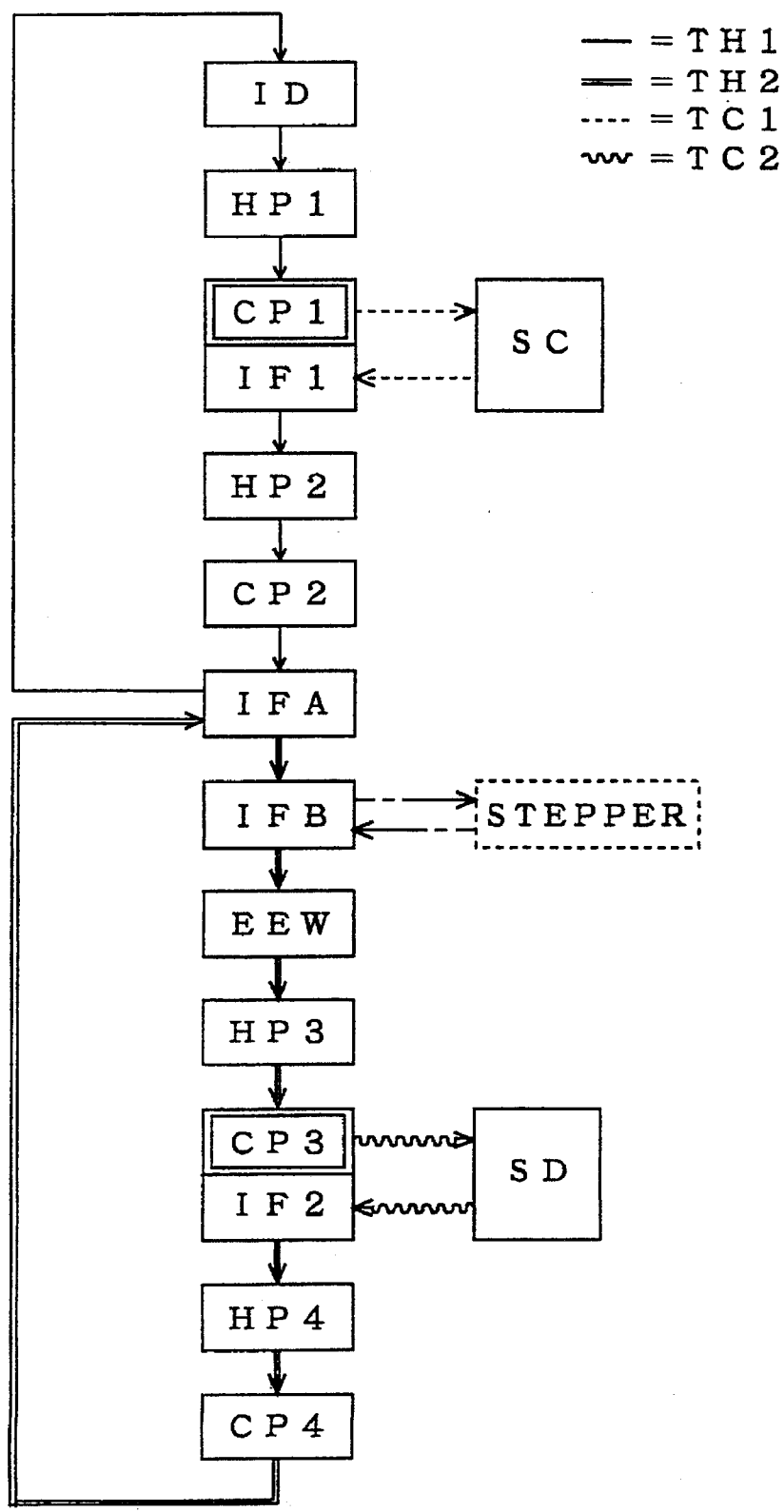
FIG. 51 shows a process flow in the apparatus of the ninth preferred embodiment.
Figure 52:
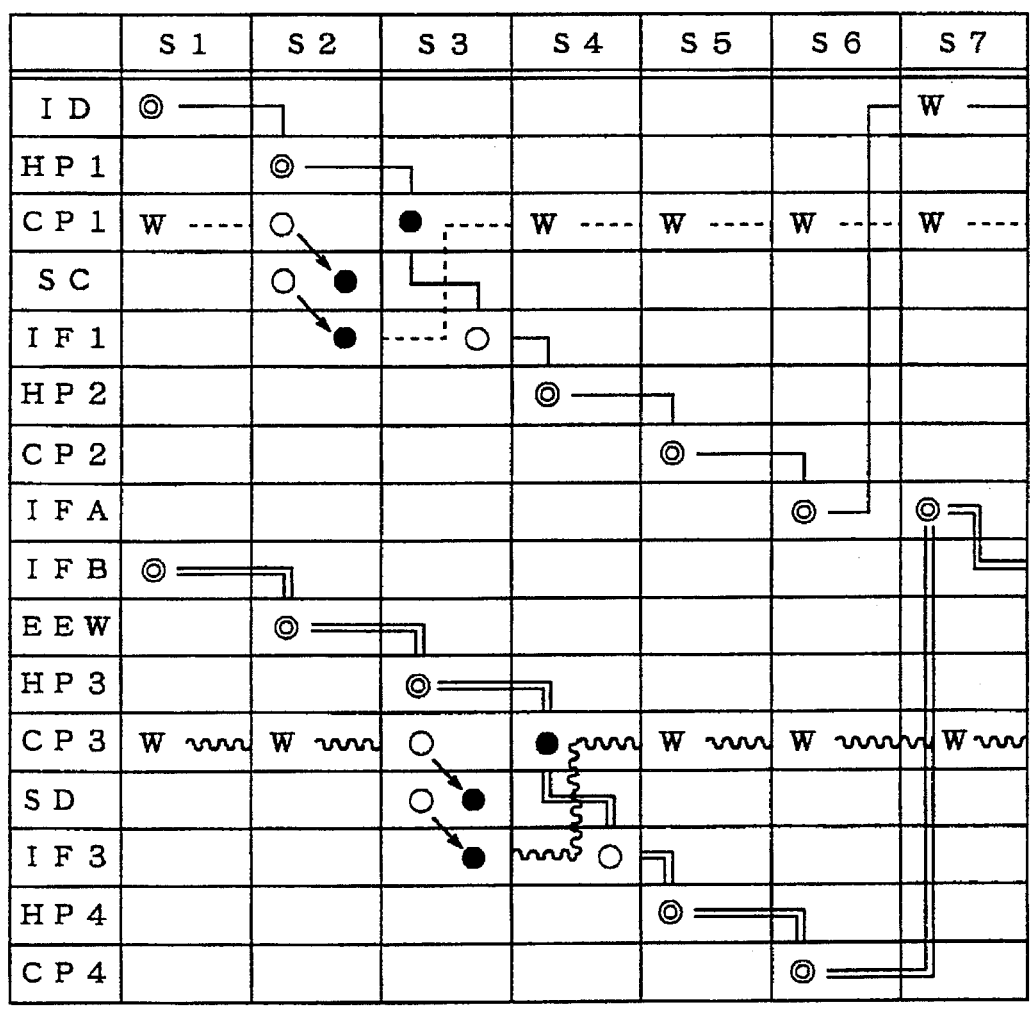
FIG. 52 is a timing view of the apparatus of the ninth preferred embodiment.

FIGS. 51 and 52 are views of a transportation process in the apparatus 900 of the ninth preferred embodiment. Since the two high temperature robots TH1 and TH2 are disposed on the coater group side and the developer group side, the high temperature robot TH1 accesses the processing parts on the coater group side such as the hot plates HP1 and HP2 while the high temperature robot TH2 accesses the processing parts on the developer group side such as the hot plates HP3 and HP4 and the edge exposure parts EEW1 and EEW2. This is also true with the low temperature robots TC1 and TC2. That is, the low temperature robot TC1 accesses the processing parts on the coater group side such as the cool plates CP1 and CP2 while the low temperature robot TC2 group side s processing parts on the developer group side such as the cool plates CP3 and CP4. The internal interface IFA is used to transfer a wafer between the coater group side and the developer group side as in the seventh preferred embodiment. To be more precise, the shutter of the coater group side is opened with the shutter of the developer group side closed. The high temperature robot TH1 retrieves a wafer from the internal interface IFA and places a wafer which used to be on the coater group side onto the pin of the internal interface IFA. Completing transfer of the wafers, the shutter of the coater group side is closed. Following this, with the shutter of the coater group side closed, the shutter of the developer group side is opened. The high temperature robot TH2 then retrieves a wafer from the internal interface IFA and places a wafer which used to be on the developer group side onto the pin of the internal interface IFA.

12. Modifications

The various preferred embodiments of the present invention are described above. The present invention may be modified as described below.

(1) Semiconductor wafers are pre-treated by HMDS treatment (adhesive agent coating) in many cases. Such a treatment like HMDS treatment may be included in the first processing part group. In this case, the low temperature robot TC, rather than the high temperature robot TH which accesses an HMDS processing part, performs a chemical treatment on a wafer in relation to coating and developing of a resist. Hence, there is no possibility that a wafer will be held by the hands of the high temperature robot TH which are contaminated due to HMDS before and after the chemical treatment.

If the wafer insertion slots are formed in the processing parts which belong to the first processing part group 110 to open in a different direction from the transfer part 140 and the second processing part group 120, it is possible to prevent gas produced at the HMDS processing part or the like from flowing directly into the spin coater SC and the spin developer SD.

This advantageously improves the process ability such as a resist profile since there is no over reaction factor such as a resist of chemical thickening type on a wafer after exposure.

(2) The structure of the transport mechanisms and the hands is not limited to as described above. The hands of the double-handed transport mechanisms may each have a fork-like tip.

The first and the second preferred embodiments and the like use the low temperature robot TC as it is formed rotatable while the third preferred embodiment uses the low temperature robot TC as it is formed to have rotatable hands. This is because the low temperature robot TC disposed between the interface IF and the second processing part group formed by the cool plates CP needs to access the both. Depending on the structure of the low temperature robot TC, the low temperature robot TC may not be able to rotate itself nor have a rotation freedom. An example of the eighth preferred embodiment which uses the low temperature robot TC as it is formed to have extensible multi-joint arms. When the low temperature robot TC has extensible multi-joint arms, the low temperature robot TC may not have a rotation freedom.

(3) As in the preferred embodiments heretofore described, the "non-thermal processing parts allowing a temperature change" such as the cool plates preferably function as both non-thermal processing parts and transfer parts. However, these non-thermal processing parts may be formed only as transfer parts. When these non-thermal processing parts have the two functions, whether to additionally dispose an interface which is to serve as a transfer only part is optional depending on treatments and a transport process.

(4) A semiconductor wafer may be transferred between the high temperature robot and the low temperature robot directly hands from hands without utilizing the transfer part. In this case, the two robots must not directly touch hands of the other. Semiconductor wafers which may be transferred between the robots in this manner is limited to those already cooled by other processing parts such as the cool plates.

(5) The transfer part may be stacked over some or all of the processing parts of the first processing part group.

(6) Substrates to be processed are not limited to semiconductor wafers but rather may be various other types of substrates for precision electronic apparatuses such as a liquid crystal displace device. The structure of the processing parts may be changed appropriately depending on the contents of treatments for processing substrates to be processed.

While the invention has been described in detail, the foregoing description is in all aspects illustrative and not restrictive. It is understood that numerous other modifications and variations can be devised without departing from the scope of the invention.

We claim:

1. A substrate processing apparatus, comprising:

an indexer for storing a plurality of substrates;

a plurality of processing parts including thermal processing parts and non-thermal processing parts;

a transport mechanism for serially transporting a substrate to be processed among said plurality of processing parts, said transport mechanism including a first transport mechanism and a second transport mechanism with only said first transport mechanism accessing said indexer, said first transport mechanism accessing a first processing part group which includes all of said thermal processing parts of said plurality of processing parts, and said second transport mechanism accessing a second processing part group which is exclusive of said thermal processing parts of said plurality of processing parts;

said second processing part group including a chemical liquid involved processing part in which said substrate is to be processed using a chemical liquid;

said first transport mechanism traveling along an arrangement of processing parts of said first processing part group, and said second transport mechanism traveling along an arrangement of processing parts of said second processing part group;

a transfer part which is insulated against heat for transferring said substrate to be processed between said first transport mechanism and said second transport mechanism.

2. The substrate processing apparatus of claim 1, wherein said plurality of processing parts include a common non-thermal processing part which is accessed by both said first and said second transport mechanisms and which allow a temperature change, and said transfer part is formed to include said common non-thermal processing part.

3. The substrate processing apparatus of claim 2, wherein said transfer part includes:

said common non-thermal processing part; and a transfer only part which is insulated against heat, and wherein said common non-thermal processing part and said transfer only part are stacked one atop the other.

4. The substrate processing apparatus of claim 1, wherein said transfer part is formed by a plate which forms said common non-thermal processing part which is accessed by both said first and said second transport mechanisms and which allow a temperature change, a pin for supporting said substrate to be processed and separating said substrate to be processed from said plate, and means for moving said pin in a vertical direction.

5. The substrate processing apparatus of claim 1, wherein said transfer part is stacked with at least some of said processing parts of said first processing part group.

6. The substrate processing apparatus of claim 1, wherein said thermal processing parts have substrate insertion slots which are open in a direction different from a direction of said second processing part group and a direction of said common non-thermal processing part.

7. The substrate processing apparatus of claim 1, wherein said first transport mechanism, a portion including said first processing part group and said transfer part, said second transport mechanism and said second processing part group are arranged in this order in a plane within said substrate processing apparatus.

8. The substrate processing apparatus of claim 1, wherein said transfer part establishes a substrate transfer height at which substrates are disposed while being transferred by said transfer part, and said second processing part group establishes a substrate holding height at which substrates are disposed while being processed by said second processing part group;

said transfer height and said holding height being substantially flush with one another.

9. The substrate processing apparatus of claim 1, wherein a substrate transfer height at said transfer part is substantially flush with a substrate holding height at said second processing part group.

10. The substrate processing apparatus of claim 1, wherein said first transport mechanism includes a plurality of transport means which move independently from each other.

11. The substrate processing apparatus of claim 10, further comprising a substrate exchange part for transferring said substrate to be processed among said plurality of transport means.

12. The substrate processing apparatus of claim 1, wherein said non-thermal processing parts include a first non-thermal processing part which allows a temperature change, and which transport mechanism, of said first and said second transport mechanisms, is utilized to access said first non-thermal processing part is determined so that said substrate to be processed will be transported within a minimum transportation cycle, to receive a given series of treatments.

13. The substrate processing apparatus of claim 12, further comprising a substrate placing counter for temporarily seating said substrate to be processed, said substrate placing counter disposed outside said first and said processing part groups, and both of said first and said transport mechanisms have a freedom of accessing said substrate placing counter.

14. The substrate processing apparatus of claim 1, wherein said second transport mechanism includes transport means which includes a first and a second hands which are driven independently of each other.

15. The substrate processing apparatus of claim 1, wherein said second transport mechanism includes transport means which includes a first and a second hands which exchange two substrates to be processed which face each other in a plane when driven by a single drive source.

16. The substrate processing apparatus of claim 15, wherein said transfer part is formed by a plate which forms a common non-thermal processing part which is accessed by both said first and said second transport mechanisms and which allow a temperature change, a pin for supporting said substrate to be processed and separating said substrate to be processed from said plate and means for moving said pin in a vertical direction.

17. The substrate processing apparatus of claim 16, wherein said means for moving said pin in the vertical direction stops said pin at the following three positions:

a first position at which said substrate to be processed is brought into contact with said plate;

a second position at which said substrate to be processed is away from said plate; and a third position at which said substrate to be processed is even further away from said plate than at said second position.

18. The substrate processing apparatus of claim 17, wherein said second transport mechanism is movable in a vertical direction to a first height and a second height at said first height said second transport mechanism being disposed to receive said substrate to be processed from said second processing part group with a first hand of said second transport mechanism and receive said substrate to be processed which is held by said pin at said second position in said transfer part with a second hand of said second transport mechanism; and at said second height said second transport mechanism being disposed to place said substrate to be processed which is held in said first hand onto said pin which is at said third position in said transfer part and insert said substrate to be processed which is held in said second hand into said second processing part group.

19. The substrate processing apparatus of claim 1, wherein said second processing part group includes a plurality of said non-thermal processing parts, and said transfer part is positioned to face said plurality of said non-thermal processing parts.

20. A substrate processing apparatus comprising: an indexer for storing a plurality of substrates;

a plurality of processing parts including thermal processing parts and non-thermal processing parts;

a transport mechanism for serially transporting a substrate to be processed among said plurality of processing parts, said transport mechanism including a first transport mechanism and a second transport mechanism with only said first transport mechanism accessing said indexer, said first transport mechanism accessing a first processing part group which includes all of said thermal processing parts included in said plurality of processing parts and traveling along an arrangement of processing parts of said first processing part group, said second transport mechanism accessing a second processing part group which is exclusive of said thermal processing parts;

said second processing part group including a chemical liquid involved processing part in which said substrate is to be processed using a chemical liquid; and a transfer part which is insulated against heat for transferring said substrate between said first transport mechanism and said second transport mechanism;

said second transport mechanism including a plurality of transport means which are fixed to face said second processing part group.

21. A substrate processing apparatus comprising:

a coating part including a first processing part including a thermal processing part, a coater, a transfer part, a first transport mechanism for accessing said first processing part, a second transport mechanism for accessing said coater, and a heat-insulated transfer part for transferring a substrate to be processed between said first transport mechanism and said second transport mechanism;

a developing part including a third processing part comprising a thermal processing part, a developer, another transfer part, a third transport mechanism for accessing said third processing part, a fourth transport mechanism for accessing said developer; and another transfer part disposed between said coating part and said developing part, said another transfer part including substrate holding means which is accessed by both said first transport mechanism and said third transport mechanism.

* * * * *